US012628631B2

(12) United States Patent
Fan et al.

(10) Patent No.: US 12,628,631 B2
(45) Date of Patent: May 12, 2026

(54) DEVICE WITH BACKSIDE POWER RAIL AND METHOD

(71) Applicant: Taiwan Semiconductor Manufacturing Co., Ltd., Hsinchu (TW)

(72) Inventors: Yun Ju Fan, Hsinchu (TW); Huan-Chieh Su, Hsinchu (TW); Chun-Yuan Chen, Hsinchu (TW); Cheng-Chi Chuang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 729 days.

(21) Appl. No.: 17/882,339

(22) Filed: Aug. 5, 2022

(65) Prior Publication Data

US 2023/0317566 A1     Oct. 5, 2023

Related U.S. Application Data

(60) Provisional application No. 63/327,257, filed on Apr. 4, 2022.

(51) Int. Cl.
| | |
|---|---|
| *H01L 23/48* | (2006.01) |
| *H10D 30/67* | (2025.01) |
| *H10D 84/01* | (2025.01) |

(52) U.S. Cl.
CPC ....... *H01L 23/481* (2013.01); *H10D 84/0149* (2025.01); *H10D 84/0151* (2025.01); *H10D 30/6735* (2025.01)

(58) Field of Classification Search
CPC ........... H10D 30/6735; H10D 84/0149; H10D 84/0151; H10D 30/797; H10D 30/0198; H01L 23/481; H01L 21/76897
See application file for complete search history.

(56) References Cited

U.S. PATENT DOCUMENTS

| | | | |
|---|---|---|---|
| 9,236,267 | B2 | 1/2016 | De et al. |
| 9,502,265 | B1 | 11/2016 | Jiang et al. |
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,774 | B2 | 10/2017 | Colinge et al. |
| 9,853,101 | B2 | 12/2017 | Peng et al. |
| 9,881,993 | B2 | 1/2018 | Ching et al. |
| 2023/0268389 | A1* | 8/2023 | Jain ..................... H01L 23/5286 257/288 |

FOREIGN PATENT DOCUMENTS

TW            202209568 A        3/2022

* cited by examiner

*Primary Examiner* — Changhyun Yi
(74) *Attorney, Agent, or Firm* — Seed IP Law Group

(57)     ABSTRACT

A device includes a stack of semiconductor nanostructures, a gate structure wrapping around the semiconductor nanostructures, a source/drain region abutting the gate structure and the stack, a contact structure on the source/drain region, a backside dielectric layer under the stack, and a via structure extending from the contact structure to a top surface of the backside dielectric layer.

20 Claims, 54 Drawing Sheets

47

45

36

41

82

32

110

41
40 { 45
47

Z

Y

X

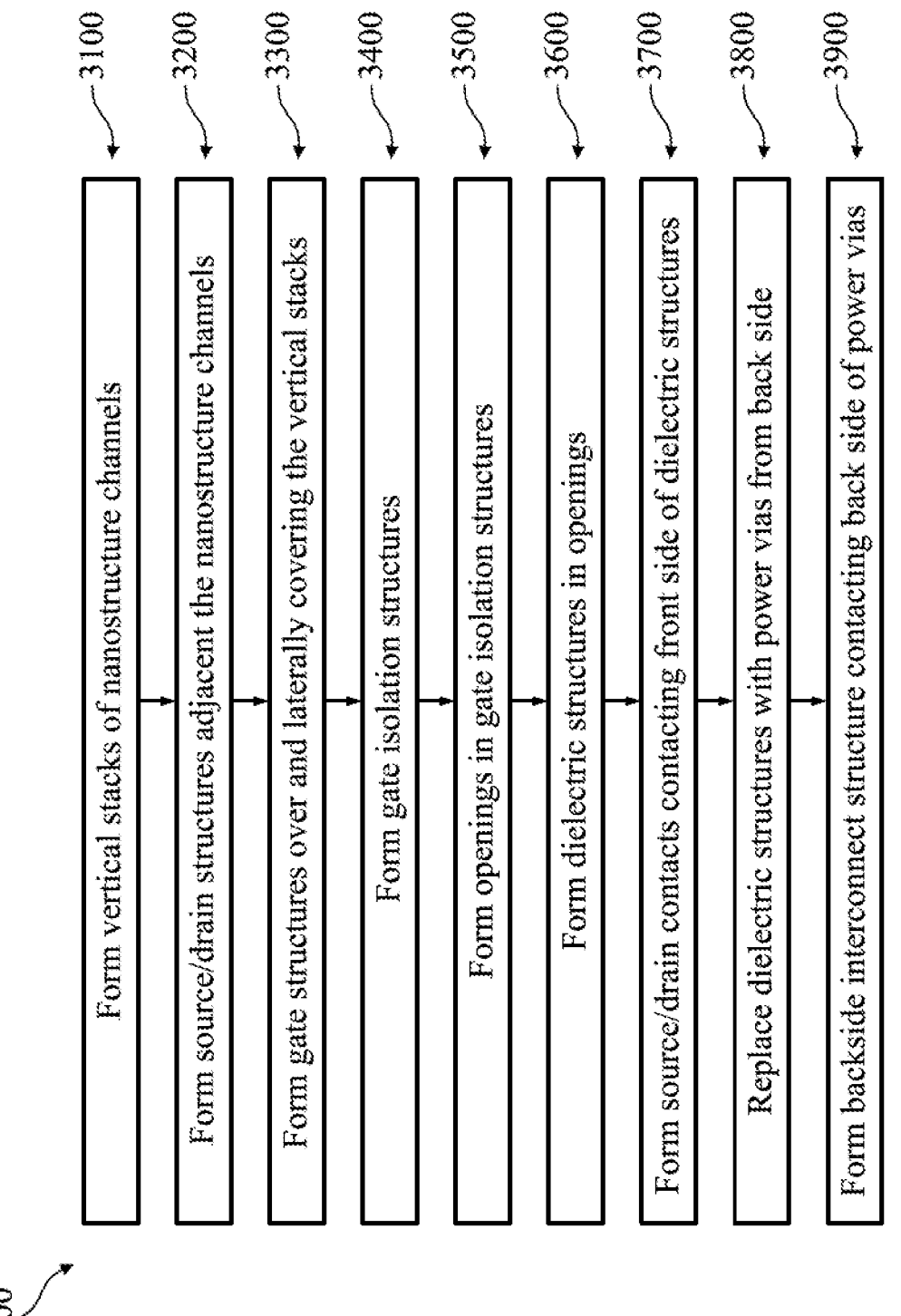

3000

3100 — Form vertical stacks of nanostructure channels

3200 — Form source/drain structures adjacent the nanostructure channels

3300 — Form gate structures over and laterally covering the vertical stacks

3400 — Form gate isolation structures

3500 — Form openings in gate isolation structures

3600 — Form dielectric structures in openings

3700 — Form source/drain contacts contacting front side of dielectric structures 3800 — Replace dielectric structures with power vias from back side 3900 — Form backside interconnect structure contacting back side of power vias

FIG. 16

DEVICE WITH BACKSIDE POWER RAIL AND METHOD

PRIORITY CLAIM AND CROSS-REFERENCE

This application claims the benefit of priority to U.S. Provisional Application Ser. No. 63/327,257, entitled "SEMICONDUCTOR DEVICES AND METHODS HAVING BACKSIDE POWER DELIVERY WITH FRONTSIDE POWER VIA," filed on Apr. 4, 2022, which application is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 14, 15, and 16 are flowcharts illustrating methods of fabricating a semiconductor device according to various aspects of the present disclosure.

DETAILED DESCRIPTION

Figure 1A:
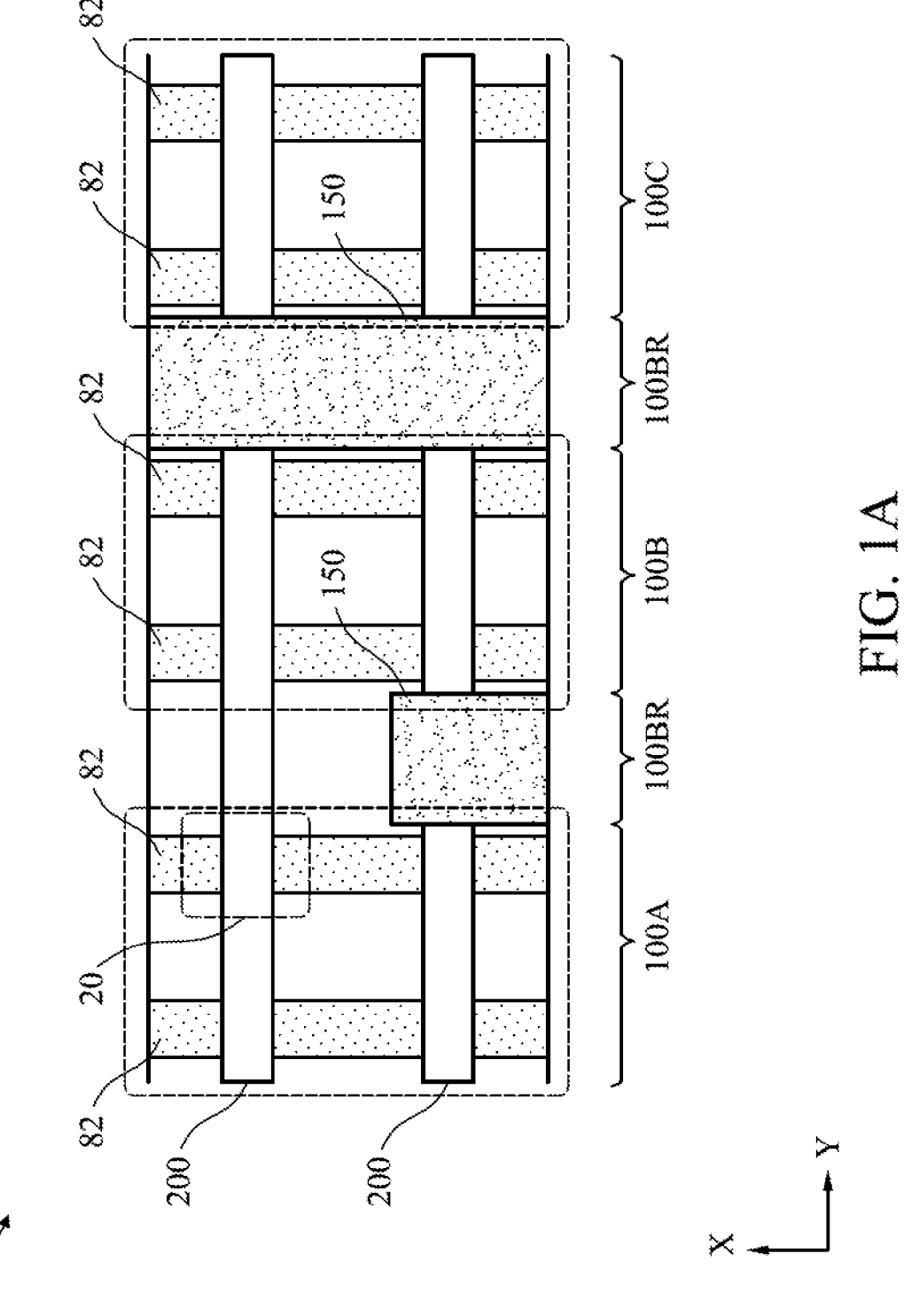
FIGS. 1A, 1B, IC, 1D, 1E, IF, 1G and 1H are diagrammatic plan, perspective and cross-sectional side views of a portion of an IC device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as planar FETs, three-dimensional fin-line FETs (FinFETs), or nanostructure devices. Examples of nanostructure devices include gate-all-around (GAA) devices, nanosheet FETs (NSFETs), nanowire FETs (NWFETs), and the like. In advanced technology nodes, with scaling down of integrated circuit (IC) devices, routing both signal wires and power wires (or rails) at the frontside of the substrate is increasingly challenging. When scaling down, space for interconnects decreases, increasing difficulty of power rail design. For example, power rails may be narrow to increase spacing for signal wires, which increases resistance and reduces power efficiency.

Embodiments disclosed herein provide power from the backside of the IC device, which improves frontside signal routing flexibility and allows wired power rail formation, which reduces resistance and increases power efficiency. Embodiments include a frontside power via that enables backside power delivery and improves frontside signal routing spacing. In some embodiments, the power via (PV) is located at a cell boundary (e.g., between memory cells, logic cells, or the like), and is designed to electrically connect source/drain contacts (or "MD") to a backside metal layer, such as a lowest backside metal layer (or "BM0"). Other backside interconnect features, such as conductive traces and vias, may be stacked on higher backside metal layers (e.g., BM1, BM2, BM3, BM4) to provide routing of power wires, signal wires, or both on the backside of the IC device.

Embodiments disclosed herein provide methods of fabrication of the power via. In some embodiments, the power via is formed from the frontside by depositing conductive material of the power via in an opening formed prior to forming the source/drain contacts. In some embodiments, the opening is formed from the backside, then the power via is formed from the backside by depositing the conductive material. In some embodiments, a first opening is formed from the frontside, a dielectric plug is formed in the first opening, a second opening is formed from the backside by removing the dielectric plug, and the power via is formed by depositing the conductive material in the second opening from the backside.

Figure 1B:
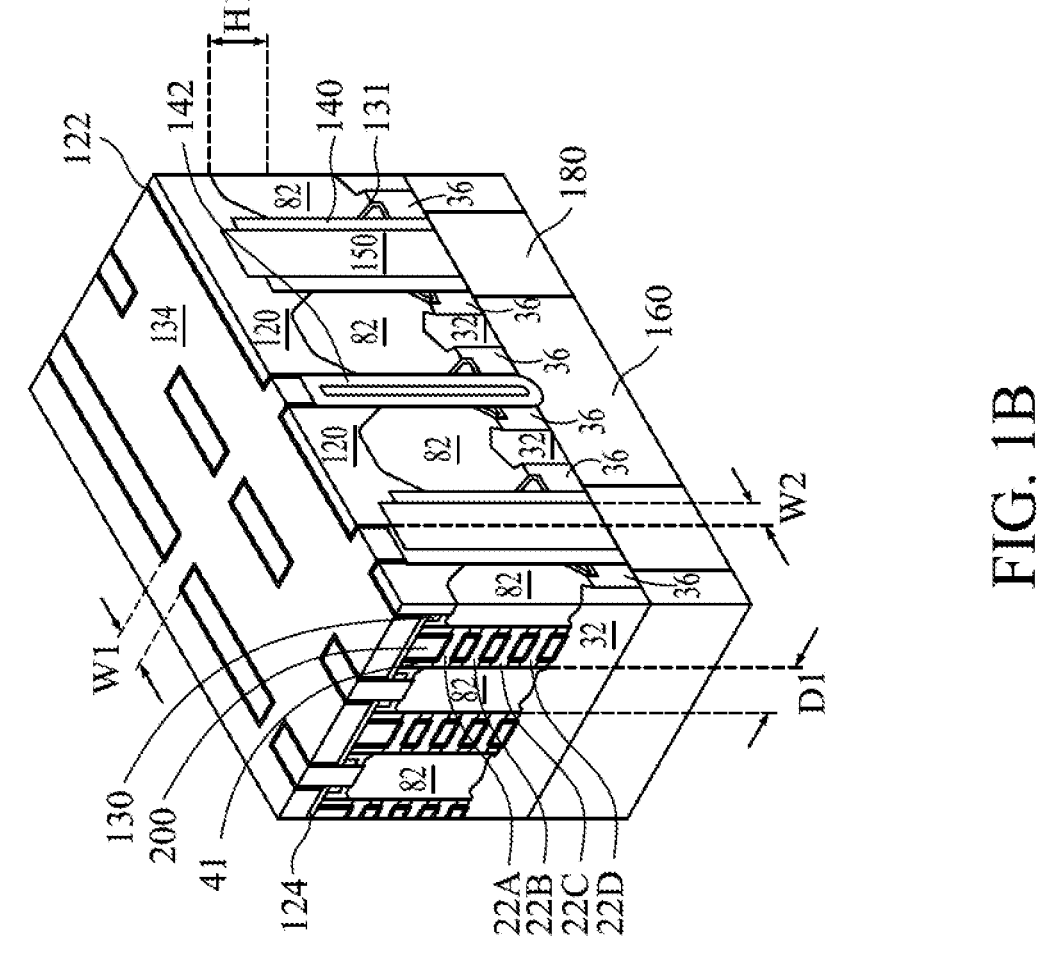
Figure 1C:
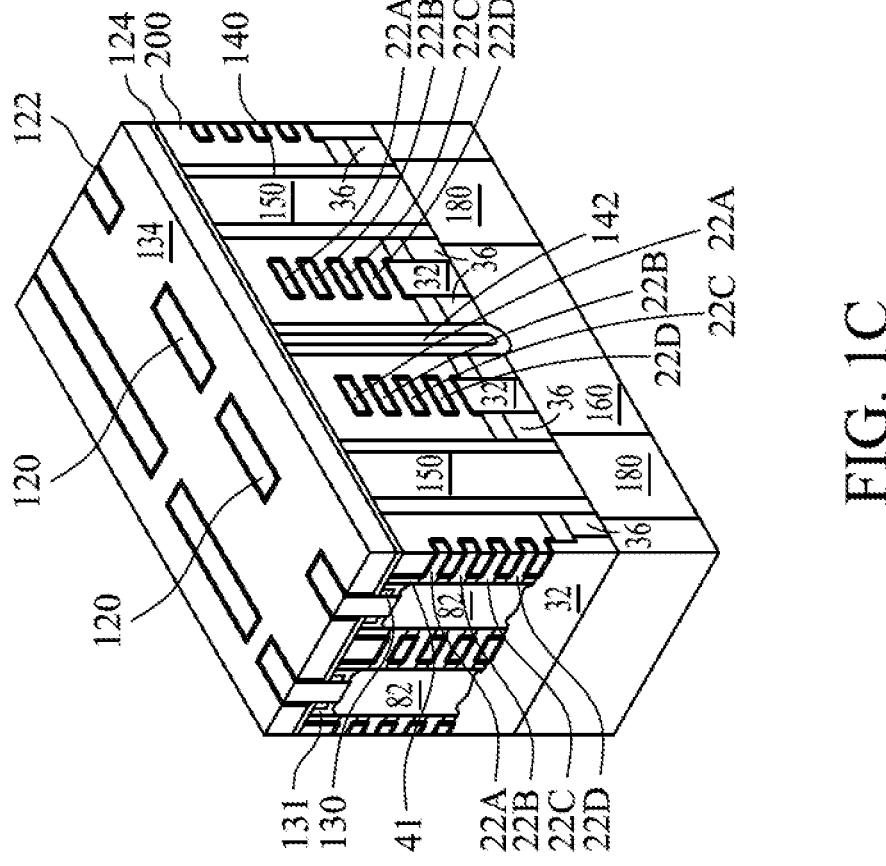
Figure 1D:
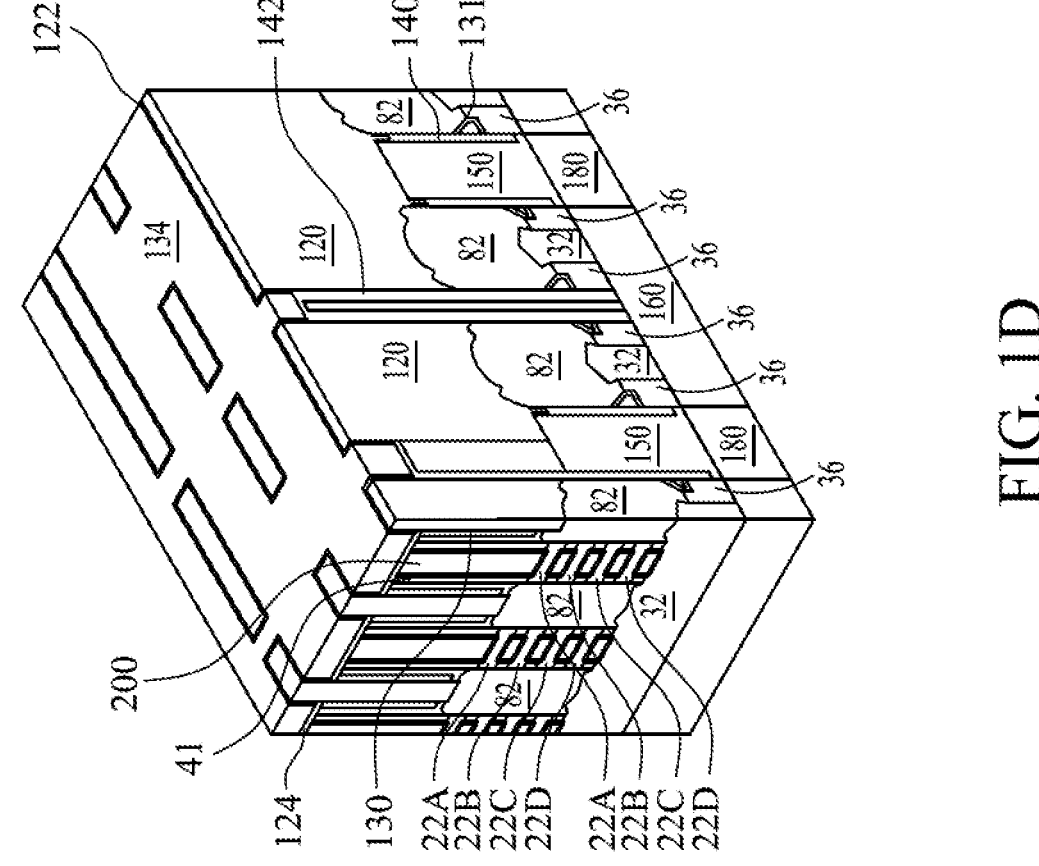
Figure 1E:
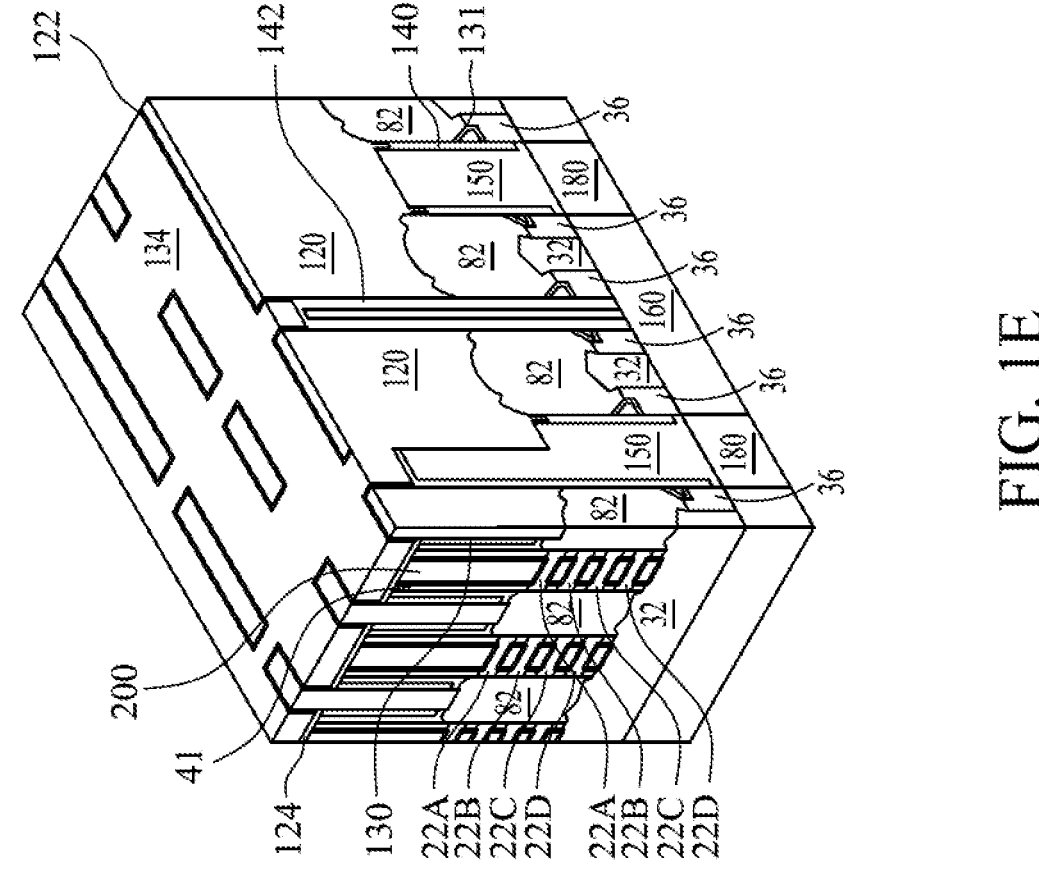
Figure 1E:
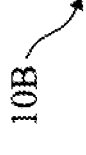
Figure 1E:
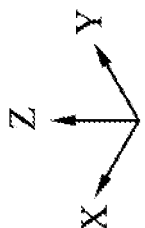
Figure 1F:
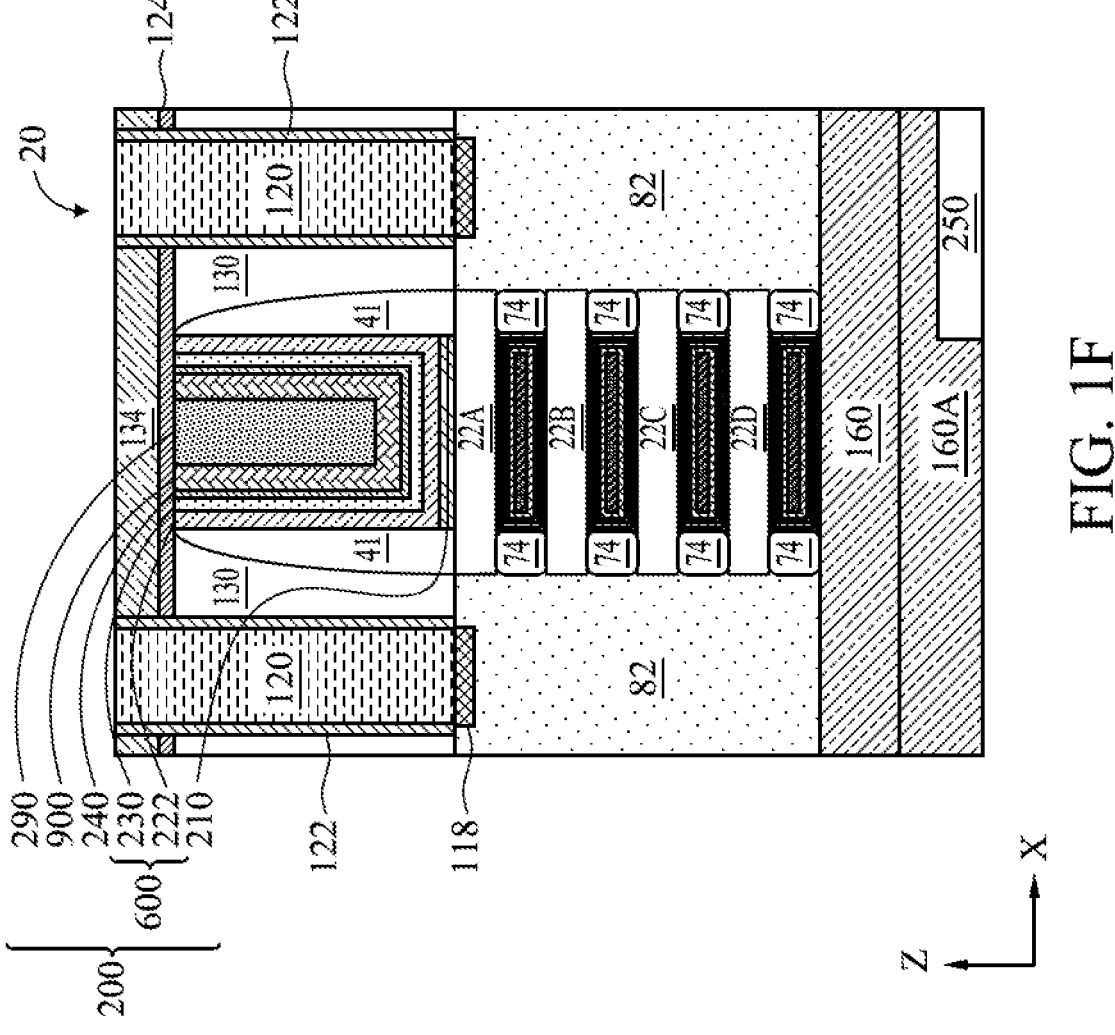
Figure 1G:
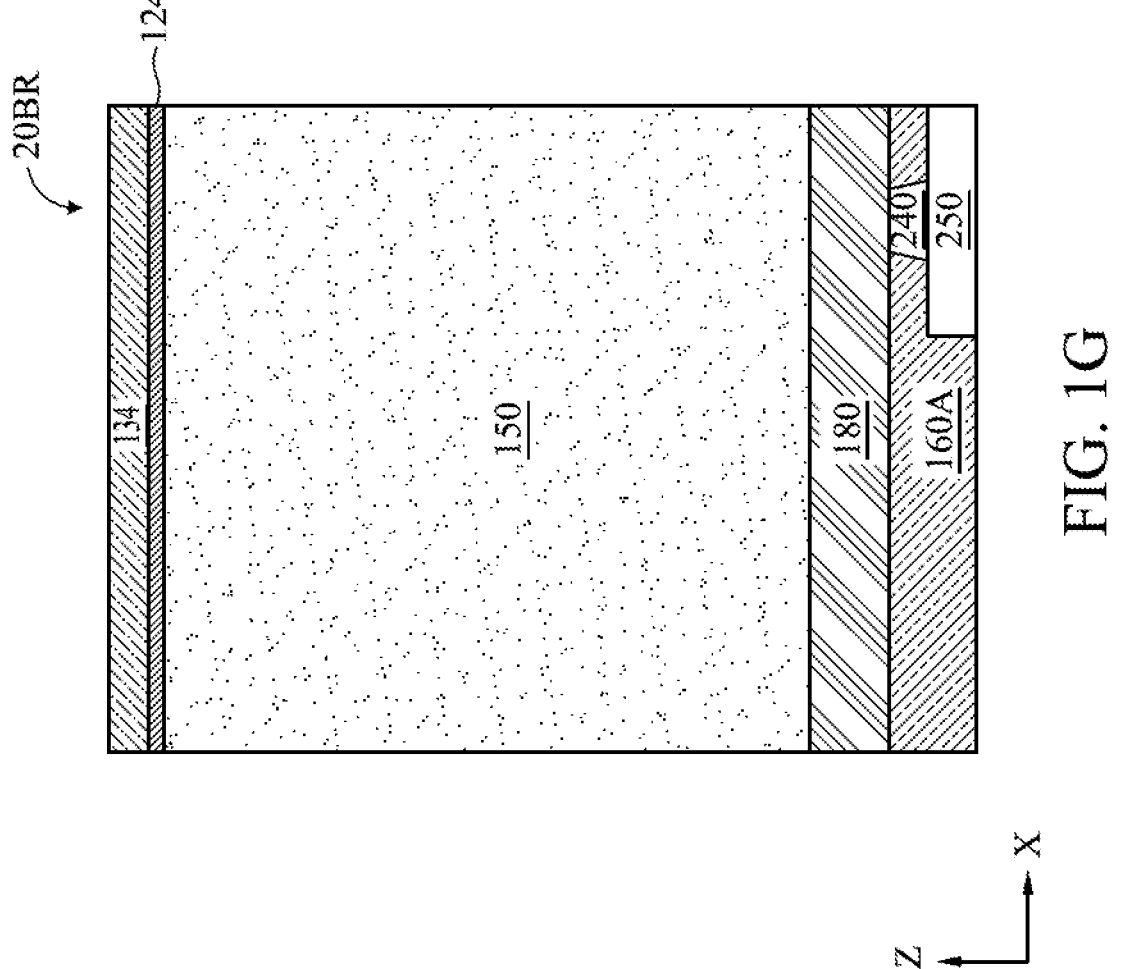
Figure 1H:
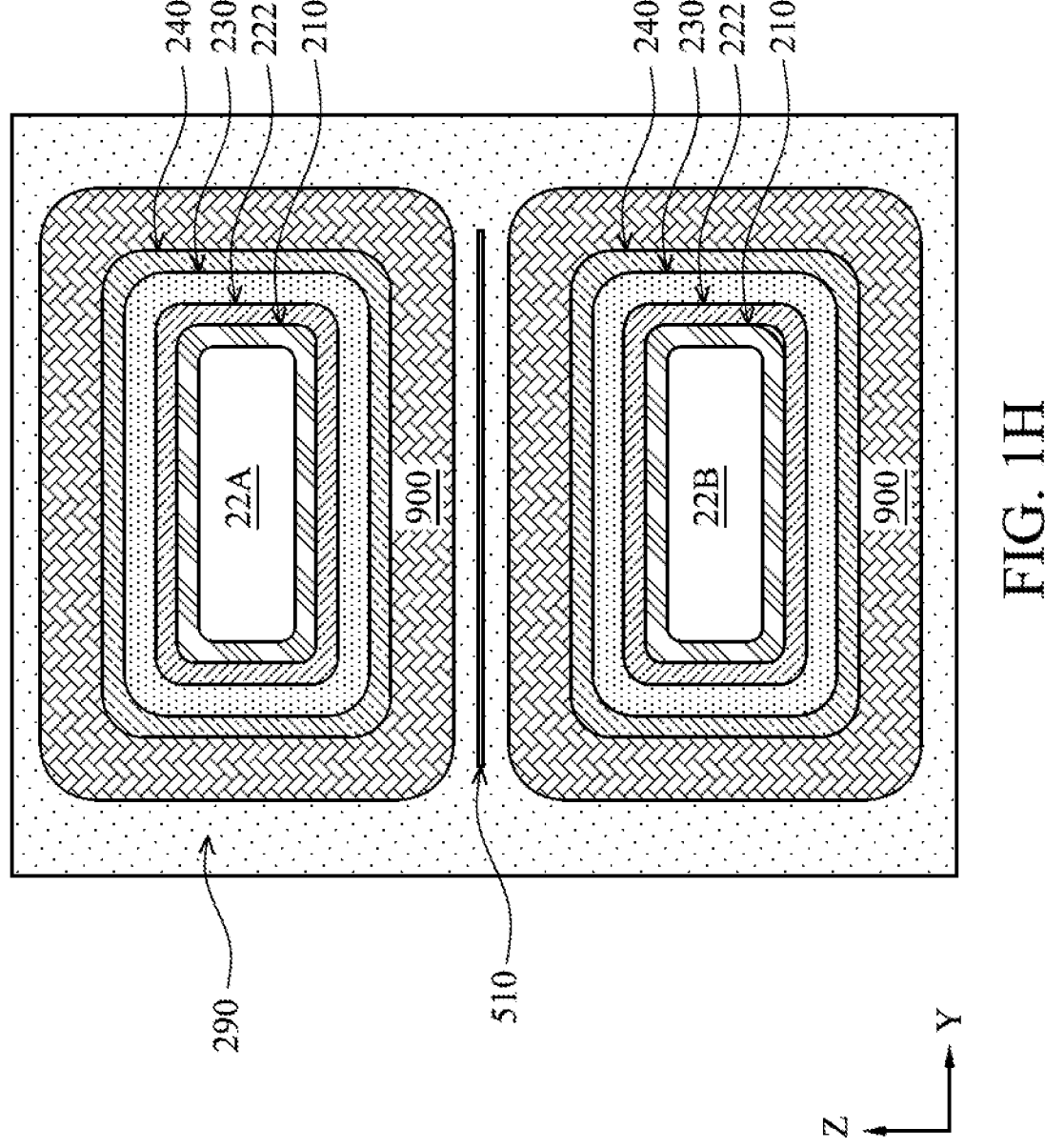

FIGS. 1A, 1B, 1C, 1D, 1E, IF, and 1G illustrate portions of IC devices 10, 10A, 10B in accordance with various embodiments. FIG. 1A is a diagrammatic plan view of a portion of IC device 10 in accordance with various embodiments. FIGS. 1B, 1C, 1D, and 1E are diagrammatic perspective views of portions of the IC devices 10, 10A, 10B. FIGS. 1F and 1G are diagrammatic cross-sectional side views of a nanostructure device 20 and boundary region 20BR of the IC devices 10, 10A, 10B.

In FIG. 1A, IC cells 100A, 100B, 100C are arranged with boundary regions 100BR therebetween. The IC cell 100A is separated from the IC cell 100B by a boundary region 100BR, and the IC cell 100B is separated from the IC cell 100C by a boundary region 100BR. Nanostructure devices 20 are positioned at regions in which gate structures 200 are abutted on either side by source/drain regions 82. Source/drain region(s) may refer to a source or a drain, individually or collectively dependent upon the context.

As shown in FIG. 1A, each of the IC cells 100A-100C may include four nanostructure devices 20. In some embodiments, the IC cells 100A-100C may include fewer than four nanostructure devices 20 or more than four nanostructure devices 20. The nanostructure devices 20 may include n-type transistors, p-type transistors, or both. The IC cells 100A-100C may include other integrated devices, such as integrated capacitors, integrated resistors, integrated inductors, integrated diodes, or the like.

Power vias 150 (or via structures 150) are positioned in the IC device 10. The power vias 150 may electrically connect one or more of the source/drain regions 82 at the frontside of the IC device 10 with a power rail 250 (see FIGS. 1F and 1G) at a backside of the IC device 10. For example, the source/drain region 82 may be in contact with a source/drain contact 120 (or contact structure 120; see FIG. 1B), which is in contact with the power via 150, which is in contact with a backside conductive feature 180, which is in contact with the power rail 250 directly or by a backside via 240 (see FIGS. 1F and 1G). The source/drain regions 82 may be separated from the power via 150, the backside conductive feature 180, the backside via 240 and the power rail 250 by isolation regions 36 (see FIG. 1B), a first backside dielectric layer 160, and a second backside dielectric layer 160A (see FIGS. 1F and 1G). In some embodiments, as shown in FIG. 1A, the power vias 150 are positioned in the boundary regions 100BR instead of being positioned in the IC cells 100A-100C.

In some embodiments, the power vias 150 are or comprise one or more of W, Ru, Co, Cu, Mo, or the like. The power vias 150 include a glue layer, which may be TaN, TiN, or the like. In some embodiments, the glue layer is omitted, such that the metal material of the power vias 150 is in direct contact with surrounding features thereof, such as fourth isolation layer 140 (see FIG. 1B), source/drain contacts 120, first isolation layer 122 and second isolation layer 124. The glue layer may be formed on and along sidewalls of the metal material of the power vias 150.

Height of the power vias 150 (e.g., in the Z-axis direction) may be in a range of about 10 nm to about 150 nm. In some embodiments, when the source/drain contact 120 has height greater than about 150 nm, the power vias 150 may have height greater than about 150 nm. When the power vias 150 are shorter than about 10 nm, resistance of the power vias 150 may be too high.

Width of the power vias 150 (e.g., in the Y-axis direction) may be in a range of about 50 nm to about 85 nm. Width greater than about 85 nm may cause cell dimensions (e.g., in the X-Y plane) to be too large. Width narrower than about 50 nm may lead to leakage current at the boundary region 100BR between cells. In some embodiments, the power vias 150 have tapered profile, for example, in the Y-Z plane. In FIG. 1B and FIG. 1E, corresponding to embodiments in which openings for forming the power vias 150 are etched from the frontside of the IC device 10, the power vias 150 may have profile in the Y-Z plane that becomes gradually narrower with increased proximity to a backside conductive feature 180. In FIG. 1D, which corresponds to embodiments in which the openings for forming the power vias 150 are etched from the backside of the IC device 10, the power vias 150 may have profile in the Y-Z plane that becomes gradually wider with increased proximity to the backside conductive feature 180. In some embodiments, an angle of tapering of the power vias 150 may be in a range of about 80 degrees to 90 degrees (e.g., vertical). Angle of tapering less than about 80 degrees may cause contact area between the power via 150 and the source/drain contact 120 or the backside metal feature 180 to be too small, increasing resistance to a level that causes circuit performance degradation or failure.

In some embodiments, as shown in FIG. 1B, a fourth isolation layer 140 is positioned along sidewalls of the power vias 150 between the power vias 150 and the source/drain regions 82. In FIG. 1B, the fourth isolation layer 140 is positioned partially between the power vias 150 and source/drain contacts 120, such that one or more of the source/drain contacts 120 contact the power vias 150. In some embodiments, the fourth isolation layer 140 is or includes one or more of SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO or SiO.

As described with reference to FIG. 1A, the power vias 150 may be positioned at boundary regions 100BR between IC cells 100A, 100B, 100C. As shown in FIG. 1B, spacing W1 (e.g., in the Y-axis direction) between adjacent source/drain regions 82 within an IC cell (e.g., the IC cell 100A) may be in a range of about 10 nm to about 50 nm. Also shown in FIG. 1B, contact width W2 (e.g., in the Y-axis direction) between the source/drain contact 120 and the power via 150 may be in a range of about 10 nm to about 85 nm. In some embodiments, the source/drain contact 120 is in contact with the entire upper surface of the power via 150 (e.g., the source/drain contact 120 lands fully on the power via 150). In some embodiments, the source/drain contact 120 is in contact with a portion of the upper surface of the power via 150 that is less than the entirety of the upper surface of the power via 150 (e.g., the source/drain contact 120 lands partially on the power via 150). In the vertical direction (e.g., the Z-axis direction), contact between the source/drain contact 120 and the power via 150 may be in a range of about 3 nm to about 100 nm. In some embodiments, an upper surface of fourth isolation layer 140 in contact with sidewalls of the power via 150 is at a level lower than an upper surface of the power via 150 by about 0 nm (e.g., coplanar) to about 99 nm. In some embodiments, length of the power via 150 (e.g., in the X-axis direction) may be equal to or greater than one cell pitch (e.g., length of the IC cell 100A in the X-axis direction). When width and height of contact area between the power via 150 and the source/drain contacts 120 are less than the dimensions given above, contact resistance therebetween may be too great, leading to circuit performance degradation or failure.

FIG. 1F illustrates a diagrammatic cross-sectional side view of a portion of an IC device 10 fabricated according to embodiments of the present disclosure, where the IC device 10 includes nanostructure device 20. The nanostructure device 20 may be an n-type FET (NFET) or a p-type FET (PFET) in some embodiments. Integrated circuit devices such as the IC device 10 frequently include transistors having different threshold voltages based on their function in the IC device. For example, input/output (IO) transistors typically have the highest threshold voltages due to the high current handling required of the IO transistors. Core logic transistors typically have the lowest threshold voltages to achieve higher switching speeds at lower operating power. A third threshold voltage between that of the IO transistors and that of the core logic transistors may also be employed for certain other functional transistors, such as static random access memory (SRAM) transistors. Some circuit blocks within the IC device 10, such as one or more of the IC cells 100A-100C, may include two or more NFETs and/or PFETs of two or more different threshold voltages.

The cross-sectional view of the IC device 10 in FIG. 1F is taken along an X-Z plane, where the X-direction is the horizontal direction, and the Z-direction is the vertical direction. The nanostructure device 20 includes channels 22A-22D (alternately referred to as "nanostructures 22" or "channels 22") over an optional fin structure 32 (see FIG. 1B). In some embodiments, the fin structure 32 is removed with a substrate 110 (see FIG. 2A) during backside processing.

The channels 22A-22D are laterally abutted by source/drain regions 82, and covered and surrounded by gate structure 200. The gate structure 200 controls flow of electrical current through the channels 22A-22D based on voltages applied at the gate structure 200 and at the source/drain regions 82. The threshold voltage is a voltage (e.g., gate-source voltage or source-gate voltage) below which negligible current flows through the channels 22, and above which significant current (e.g., orders of magnitude more current) flows through the channels 22. Voltage at or above the threshold voltage establishes a conducting path in the channels 22A-22D. Threshold voltage tuning may be performed during fabrication of the various transistors, e.g., IO transistors, core logic transistors, and SRAM transistors, for example, during fabrication of the gate structure 200.

In some embodiments, the fin structure 32 includes silicon. In some embodiments, the nanostructure device 20 is an NFET, and the source/drain regions 82 thereof include silicon phosphorous (SiP). In some embodiments, the nanostructure device 20 is a PFET, and the source/drain regions 82 thereof include silicon germanium (SiGe). In some embodiments, NFETs and PFETs include the source/drain regions 82 having the same material at different doping levels to achieve operating characteristics of NFETs or PFETs. In some embodiments, the source/drain regions 82 include one or more of SiGeB, SiP, SiAs, SiGe, or another suitable semiconductive material. In some embodiments, the source/drain regions 82 have width (e.g., in the Y-axis direction) in a range of about 0.5 nm to about 100 nm (see FIG. 1B). In some embodiments, extension H1 of the source/drain regions 82 above a level of interface between the source/drain regions 82 and fourth isolation layer 140 (see FIG. 1B) is in a range of about 0.1 nm to about 50 nm. In some embodiments, height of the source/drain regions 82 (e.g., in the Z-axis direction) is in a range of about 0.1 nm to about 100 nm. The height of the source/drain regions 82 may be measured from an interface between a respective source/drain region 82 and the fin 32 on which it is disposed to a top of the source/drain region 82.

The channels 22A-22D each include a semiconductive material, for example silicon or a silicon compound, such as silicon germanium, or the like. The channels 22A-22D are nanostructures (e.g., having sizes that are in a range of a few nanometers) and may also each have an elongated shape and extend in the X-direction. In some embodiments, the channels 22A-22D each have a nano-wire (NW) shape, a nano-sheet (NS) shape, a nano-tube (NT) shape, or other suitable nanoscale shape. The cross-sectional profile of the channels 22A-22D may be rectangular, round, square, circular, elliptical, hexagonal, or combinations thereof.

In some embodiments, the lengths (e.g., measured in the X-axis direction) of the channels 22A-22D may be different from each other, for example due to tapering during a fin etching process. In some embodiments, length of the channel 22A may be less than a length of the channel 22B, which may be less than a length of the channel 22C, which may be less than a length of the channel 22D. The channels 22A-22D may not have uniform thickness, for example due to a channel trimming process used to expand spacing (e.g., measured in the Z-direction) between the channels 22A-22D to increase gate structure fabrication process window. For example, a middle portion of each of the channels 22A-22D may be thinner than the two ends of each of the channels 22A-22D. Such shape may be collectively referred to as a "dog-bone" shape.

In some embodiments, the spacing between the channels 22A-22D (e.g., between the channel 22B and the channel 22A or the channel 22C) is in a range between about 8 nanometers (nm) and about 12 nm. In some embodiments, a thickness (e.g., measured in the Z-direction) of each of the channels 22A-22D is in a range between about 5 nm and about 8 nm. In some embodiments, a width (e.g., measured in the Y-direction, not shown in FIG. 1F, orthogonal to the X-Z plane) of each of the channels 22A-22D is at least about 8 nm.

The gate structure 200 is disposed over and between channels 22A-22D, respectively. In some embodiments, threshold voltage tuning is achieved by driving at least one specific dopant into first high-k gate dielectric layer 222 of the gate structure 200. In some embodiments, threshold voltage tuning is alternately or further achieved by adding one or more barrier layers 700 (also referred to as "work function barrier layers") in a work function metal layer between a second high-k gate dielectric layer 230 and a metal core layer 290.

A first interfacial layer (IL) 210, which may be an oxide of the material of the channels 22A-22D, is disposed on exposed areas of the channels 22A-22D and the top surface of the fin 32 when present. The first IL layer 210 promotes adhesion of the first gate dielectric layer 222 to the channels 22A-22D. In some embodiments, the first IL layer 210 has thickness of about 5 Angstroms (A) to about 50 Angstroms (A). In some embodiments, the first IL layer 210 has thickness of about 10 A. The first IL layer 210 having thickness that is too thin may exhibit voids or insufficient adhesion properties. The first IL layer 210 being too thick consumes gate fill window, which is related to threshold voltage tuning and resistance as described above.

The first gate dielectric layer 222 and the second gate dielectric layer 230 are collectively referred to as "the gate dielectric layers" or gate dielectric structure 600. In some embodiments, the gate dielectric layers 222, 230 include a high-k gate dielectric material, which may refer to dielectric materials having a high dielectric constant that is greater than a dielectric constant of silicon oxide ($k \approx 3.9$). Example high-k dielectric materials include $HfO_2$, HfSiO, HfSiON, HfTaO, HfTiO, HfZrO, $ZrO_2$, $Ta_2O_5$, LaOx, AlOx, or combinations thereof. In some embodiments, the first gate dielectric layer 222 has thickness of about 5 Å to about 50 A, which may be similar to, or somewhat thinner than, the first IL layer 210. In some embodiments, the first gate dielectric layer 222 each have thickness of about 9 A. In some embodiments, the second gate dielectric layer 230 has thickness of about 5 Å to about 50 A, and is substantially thinner than the first gate dielectric layer 222. In some embodiments, the second gate dielectric layer 230 has thickness of about 6 A, which is about two-thirds that of the first gate dielectric layer 222.

In some embodiments, the first gate dielectric layer 222 may further include dopants, such as metal ions driven into the high-k gate dielectric from La$_2$O$_3$, MgO, Y$_2$O$_3$, TiO$_2$, Al$_2$O$_3$, Nb$_2$O$_5$, or the like, or boron ions driven in from B$_2$O$_3$, at a concentration to achieve threshold voltage tuning, while the second gate dielectric layer 230 is substantially devoid of the dopants. As one example, for N-type transistor devices, lanthanum ions in higher concentration reduce the threshold voltage relative to layers with lower concentration or devoid of lanthanum ions, while the reverse is true for P-type devices. In some embodiments, the first gate dielectric layer 222 of certain transistor devices (e.g., IO transistors) is also devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage. The second gate dielectric layer 230 is substantially devoid of the dopant present in the first gate dielectric layer 222. The second gate dielectric layer 230 reduces gate leakage.

The gate structure 200 includes one or more work function metal layers, represented collectively as the first work function metal layer 900. In the nanostructure device 20, which is an NFET in most embodiments, the first work function metal layer 900 may include at least an N-type work function metal layer, an in-situ capping layer, and an oxygen blocking layer. In some embodiments, the first work function metal layer 900 includes more or fewer layers than those described. In the nanostructure device 20 that is a PFET, the first work function metal layer 900 is substantially the same as for an NFET, and the gate structure 200 may further include an additional second work function layer 700, which generally includes one or more barrier layers comprising a metal nitride, such as TiN, WN, MoN, TaN, or the like. Each of the one or more barrier layers may have thickness ranging from about 5 Å to about 20 A. Inclusion of the one or more barrier layers provides additional threshold voltage tuning flexibility. In general, each additional barrier layer increases the threshold voltage.

The gate structure 200 also includes metal core layer 290. The metal core layer 290 may include a conductive material such as tungsten, cobalt, ruthenium, iridium, molybdenum, copper, aluminum, or combinations thereof. Between the channels 22A-22D, the metal core layer 290 is circumferentially surrounded (in the cross-sectional view) by the one or more work function metal layers 900, and further by the work function barrier layers 700 in the gate structure 200, which are then circumferentially surrounded by the gate dielectric layers 600 (see FIG. 1F). In the portion of the gate structure 200 positioned over the channel 22A most distal from the fin 32, the metal core layer 290 is positioned over the one or more work function metal layers 900. The one or more work function metal layers 900 wrap around the metal core layer 290. The gate dielectric layers 600 also wrap around the one or more work function metal layers 900, and further wrap around the work function barrier layers 700. The gate structure 200 may also include a glue layer that is formed between the one or more work function layers 900 and the metal core layer 290 to increase adhesion. The glue layer is not specifically illustrated in FIG. 1F for simplicity.

Referring to FIG. 1B, distance D1 between adjacent stacks of nanostructures 22 (e.g., in the X-axis direction) may be in a range of about 0.5 nm to about 100 nm.

Referring to FIG. 1F, the nanostructure device 20 also includes gate spacers 41 and inner spacers 74 that are disposed on sidewalls of the first gate dielectric layer 222. The inner spacers 74 are also disposed between the channels 22A-22D. The gate spacers 41 and the inner spacers 74 may include a dielectric material, for example a low-k material such as SiOCN, SiON, SiN, SiCN, SiO, or SiOC.

The nanostructure device 20 further includes source/drain contacts 120 that are formed over the source/drain regions 82. The source/drain contacts 120 may include a conductive material such as tungsten, cobalt, ruthenium, iridium, molybdenum, copper, aluminum, TaN, TiN, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain regions 82 and the source/drain contacts 120, so as to reduce the source/drain contact resistance. The silicide layer 118 may contain a metal silicide material, such as cobalt silicide in some embodiments, or TiSi in some other embodiments. Height of the source/drain contacts 120 (e.g., in the Z-axis direction) may be in a range of about 3 nm to about 150 nm.

The nanostructure device 20 further include an interlayer dielectric (ILD) 130. The ILD 130 provides electrical isolation between the various components of the nanostructure device 20 discussed above, for example between the gate structure 200 and the source/drain contacts 120.

In some embodiments, a first isolation layer 122 is disposed on sidewalls of the ILD 130 between the ILD 130 and the source/drain contacts 120. The first isolation layer 122 may be or include one or more of SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO.

In some embodiments, a second isolation layer 124 is disposed on the ILD 130 and the gate structure 200. The second isolation layer 124 may be or include one or more of SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO.

In some embodiments, a third isolation layer 134 is disposed on the second isolation layer 124, and may be or include one or more of SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO.

The source/drain contacts 120 may extend through the second and third isolation layers 124, 134. Upper surfaces of the source/drain contacts 120 and the third isolation layer 134 may be coplanar or substantially coplanar.

Figure 13A:
FIGS. 13A, 13B, 13C, 13D, 13E, 13F, and 13G are views of various embodiments of an IC device at various stages of forming a frontside via for backside power delivery in accordance with various embodiments.
Figure 13A:
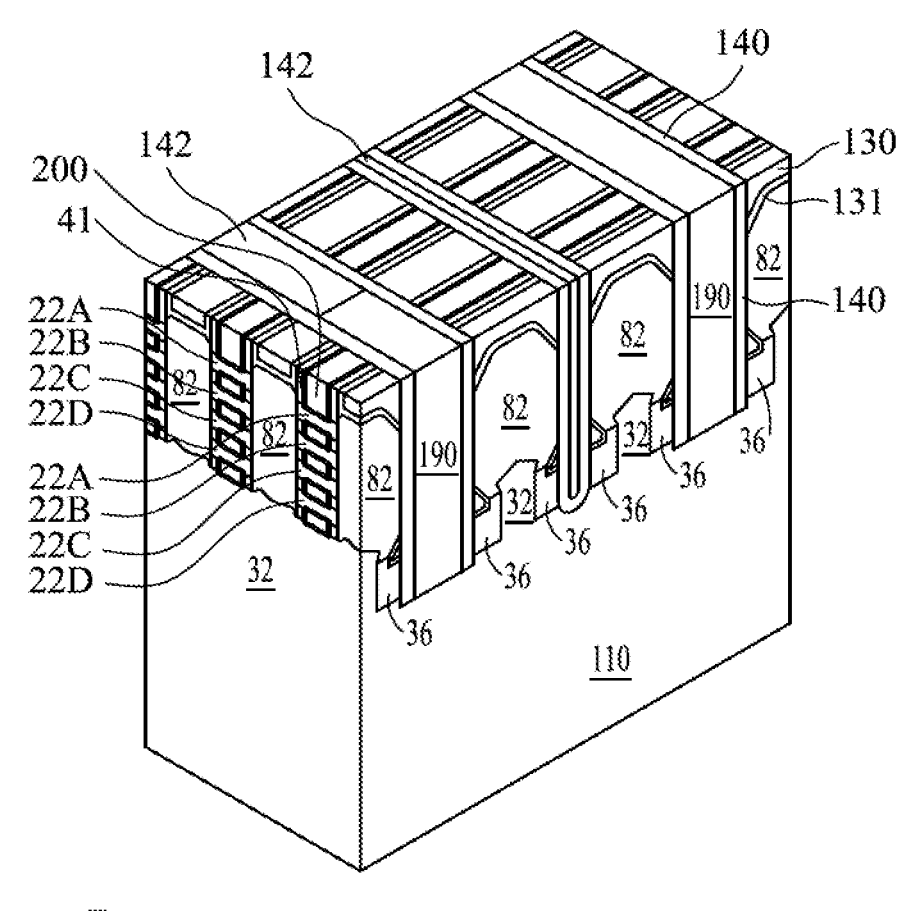
Figure 13B:
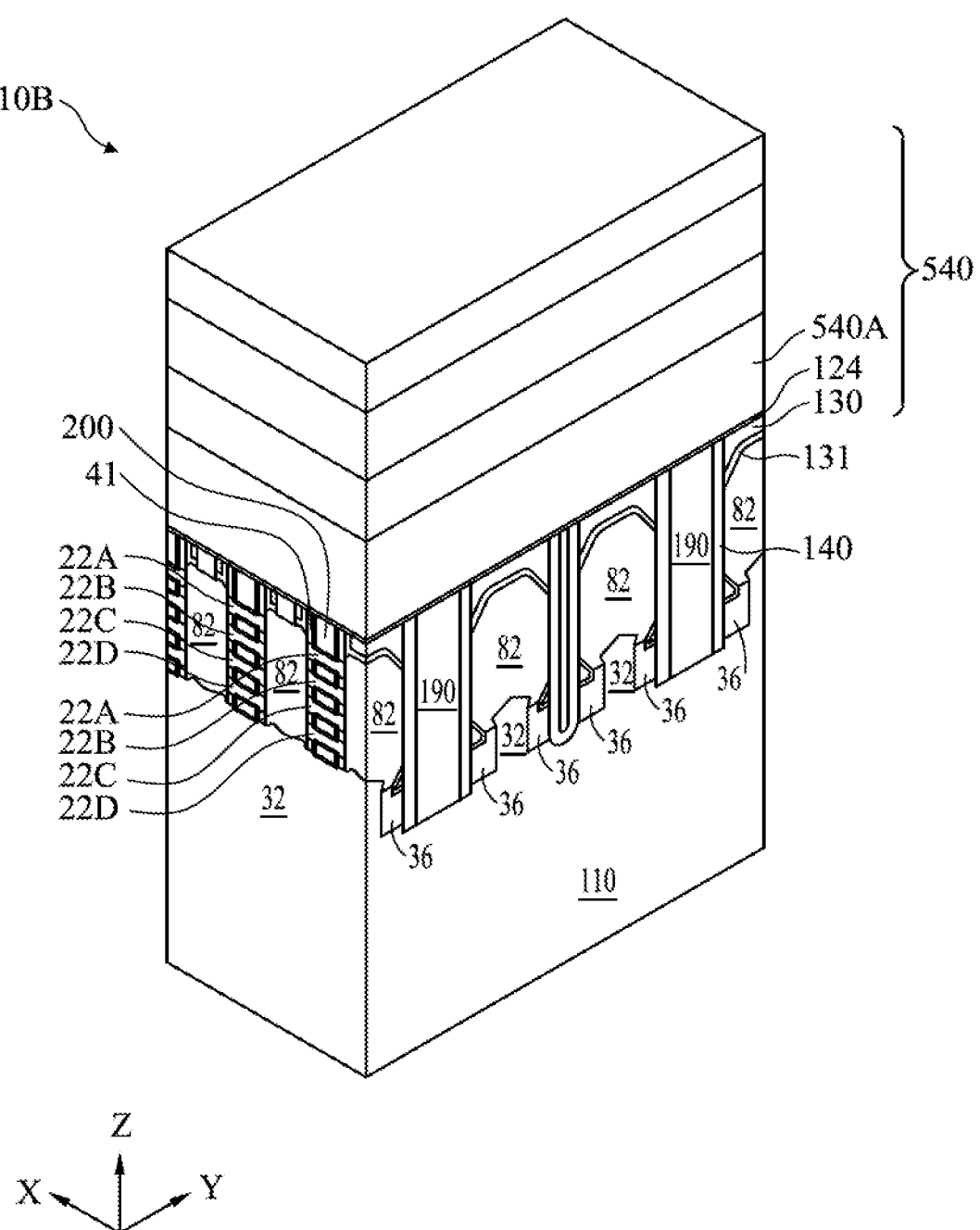
Figure 13C:
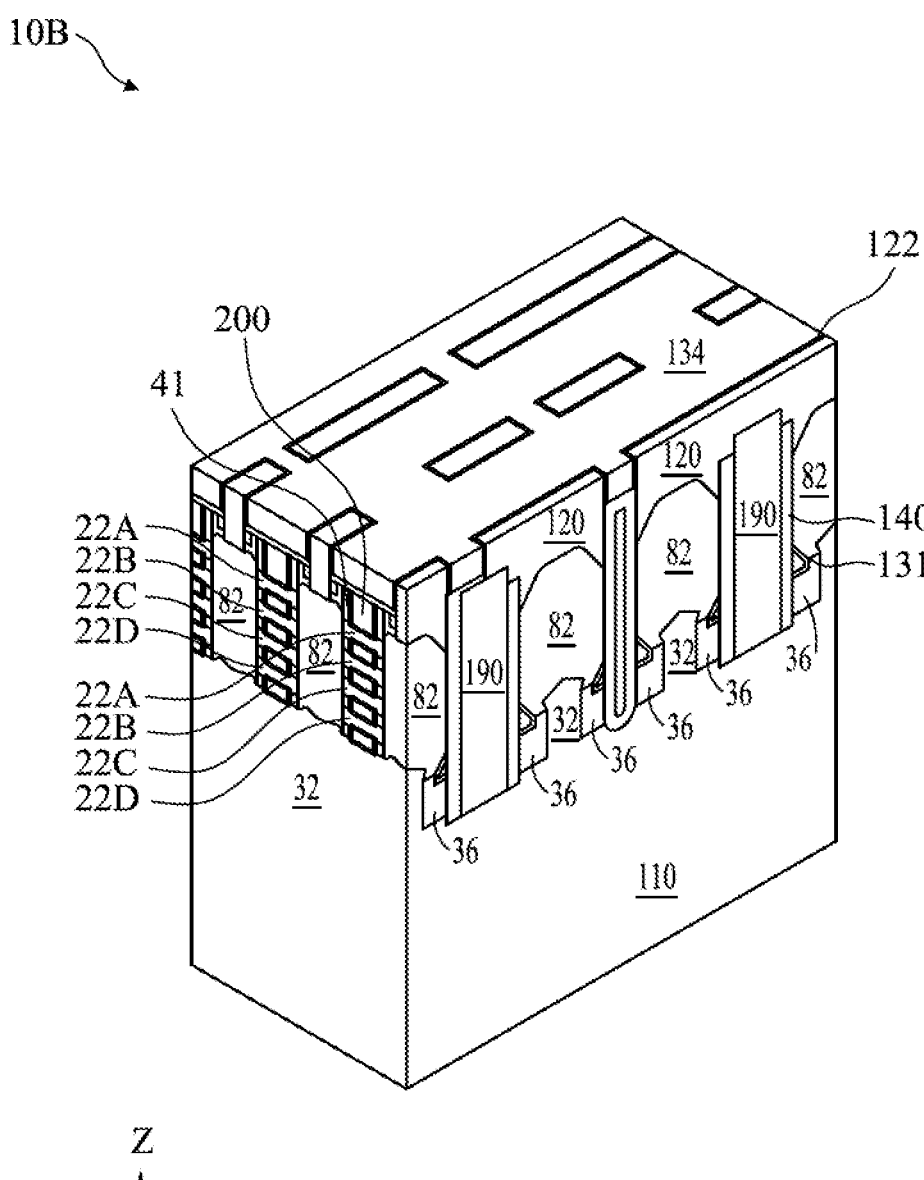
Figure 13D:
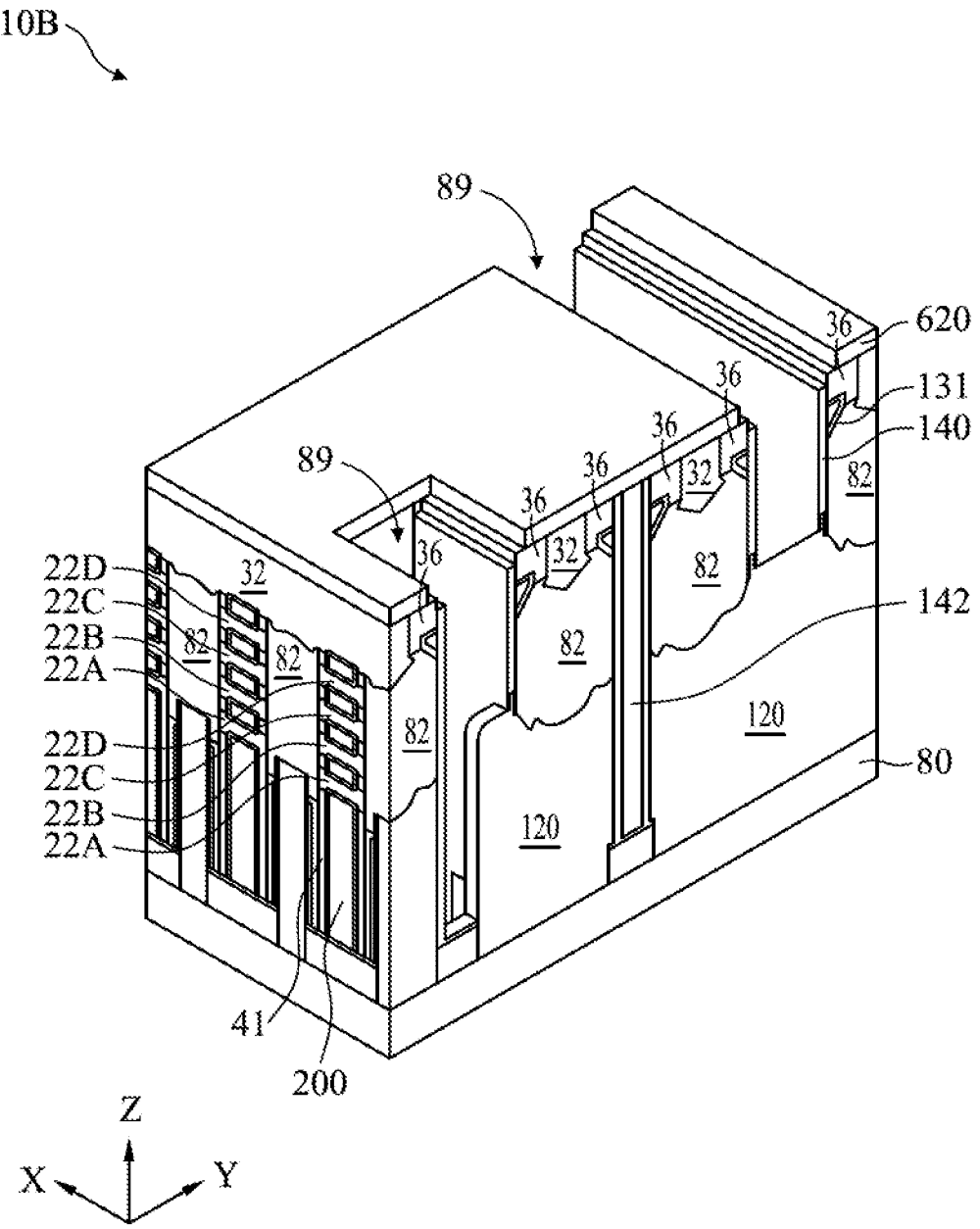
Figure 13E:
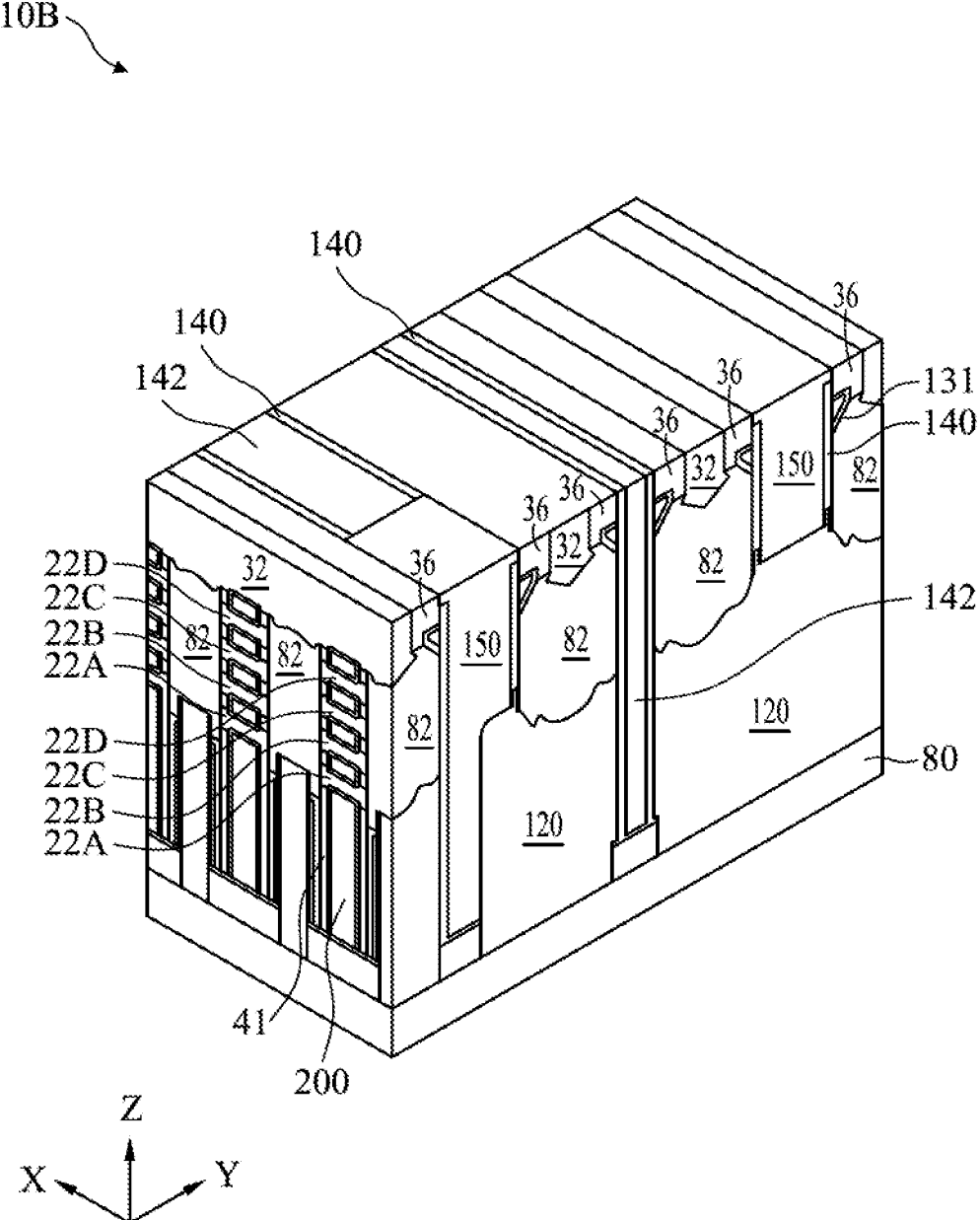
Figure 13F:
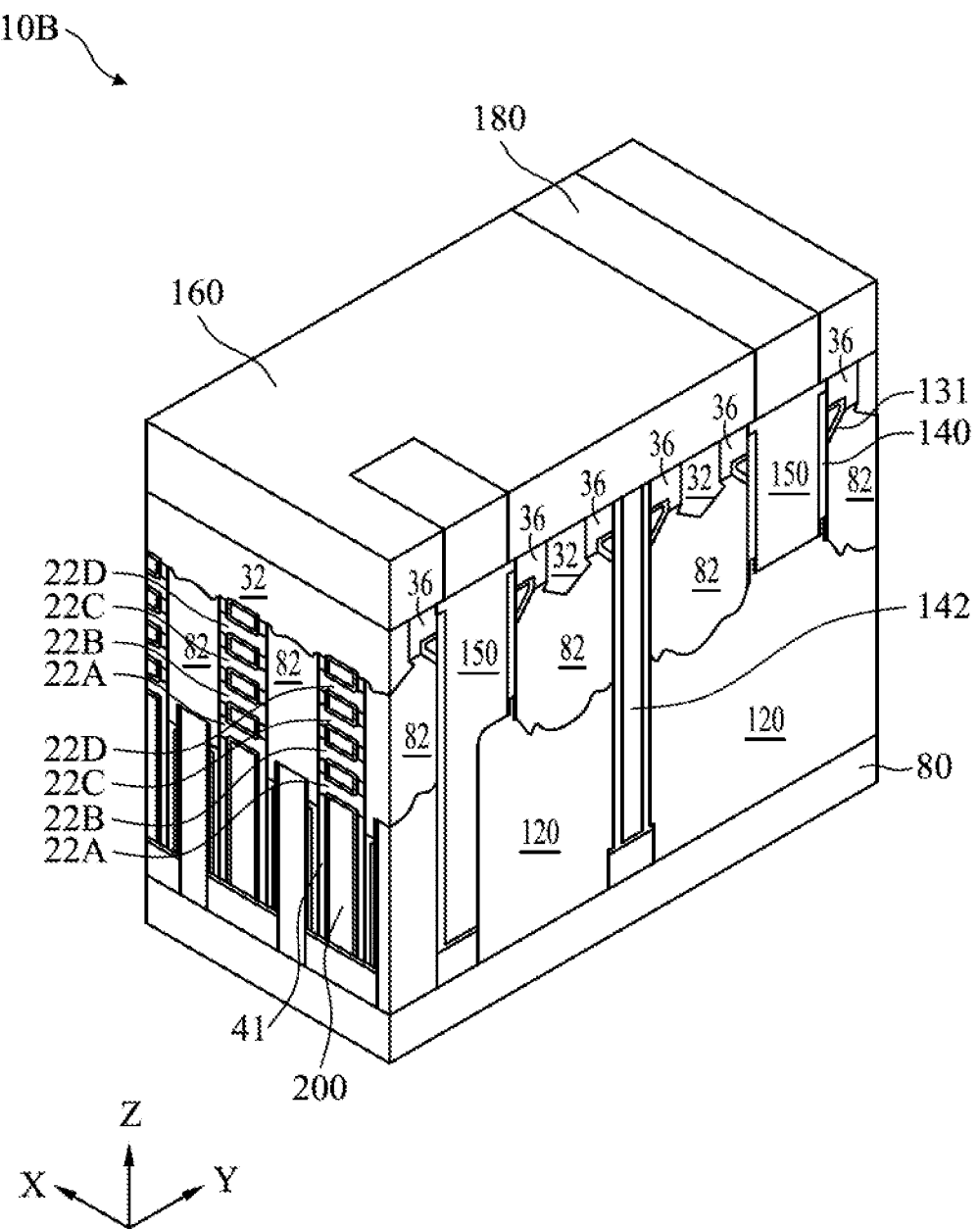
Figure 13G:
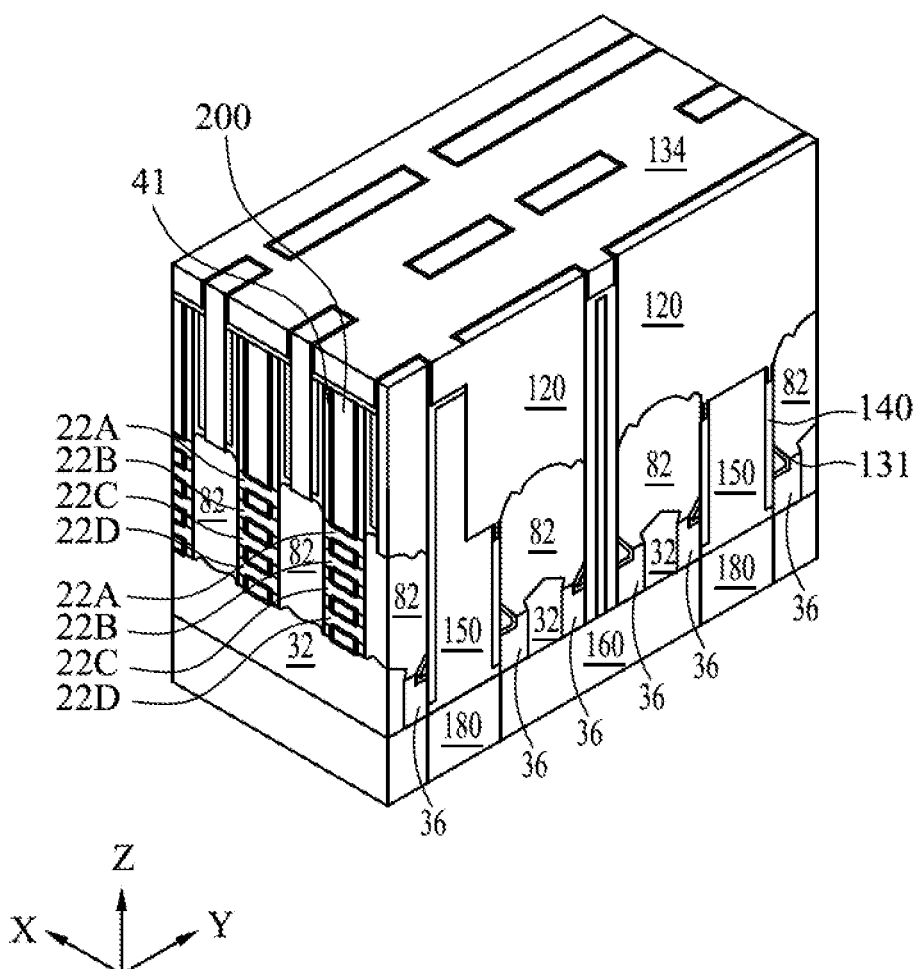
Figure 14:
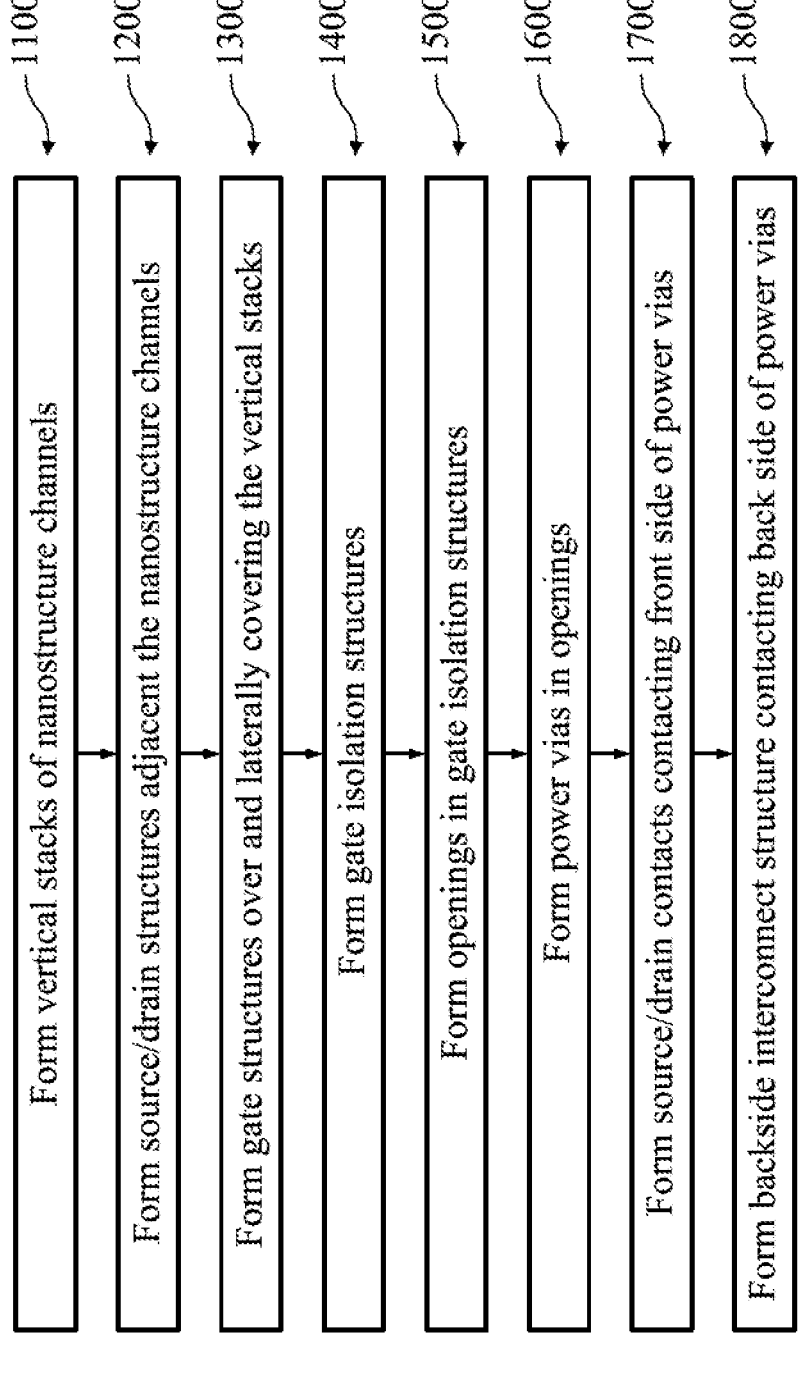
Figure 15:
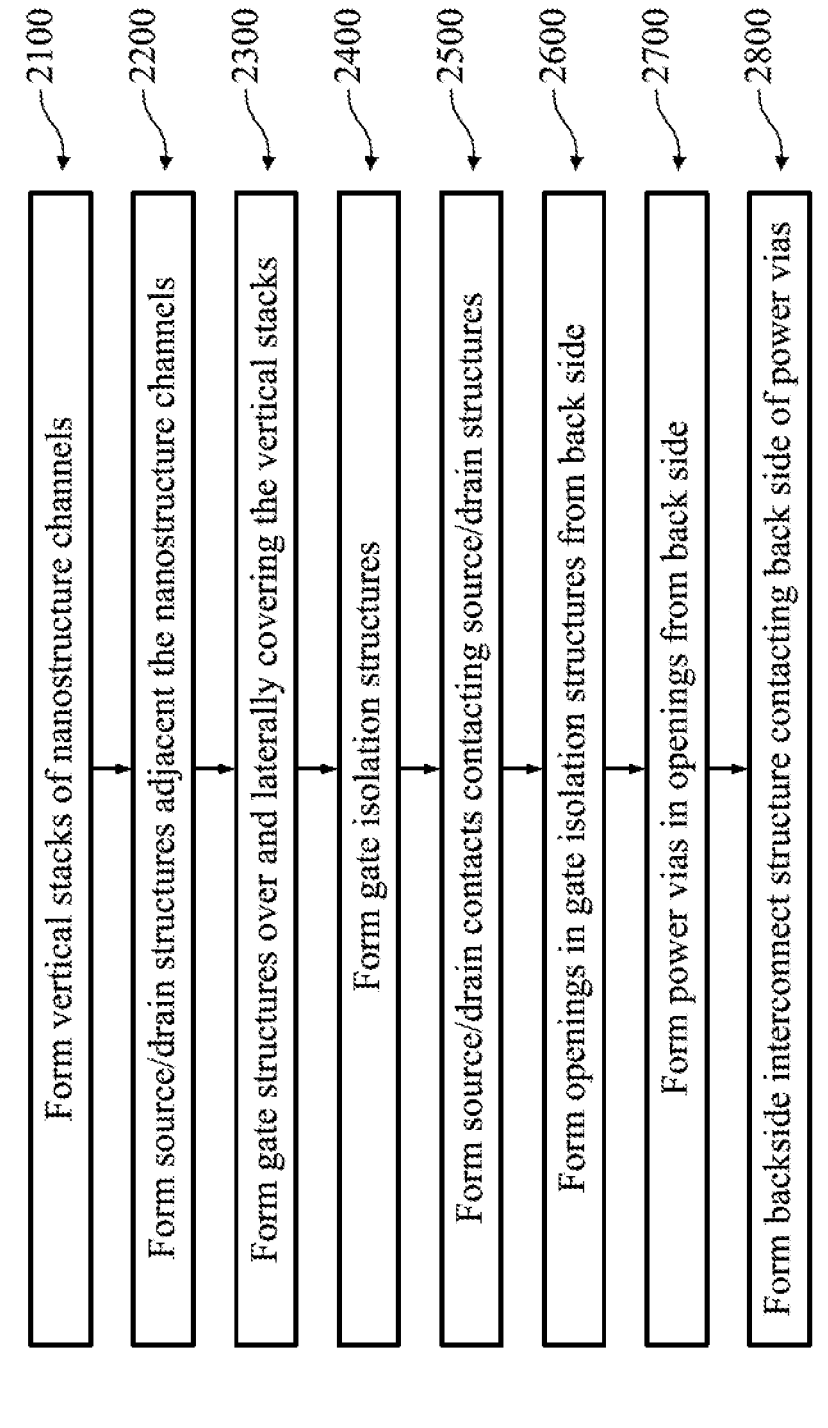

FIGS. 14, 15, and 16 illustrate flowcharts of methods 1000, 2000, 3000 for forming an IC device or a portion thereof from a workpiece, according to one or more aspects of the present disclosure. Methods 1000, 2000, 3000 is merely an example and is not intended to limit the present disclosure to what is explicitly illustrated in methods 1000, 2000, 3000. Additional acts can be provided before, during and after the methods 1000, 2000, 3000, and some acts described can be replaced, eliminated, or moved around for additional embodiments of the methods. Not all acts are described herein in detail for reasons of simplicity. Methods 1000, 2000, 3000 is described below in conjunction with fragmentary cross-sectional views of a workpiece (shown in FIGS. 2A, 2B, 3A, 3B, 4A, 4B, 4C, 5A, 5B, 5C, 6A, 6B, 6C, 7A, 7B, 7C, 8A, 8B, 8C, 9A, 9B, 9C, 10A, 10B, 10C, 10D, 11A, 11B, 11C, 11D, 11E, 11F, 11G, 11H, 11I, 11J, 12A, 12B, 12C, 12D, 12E, 12F, 12G, 12H, 12I, 13A, 13B, 13C, 13D, 13E, 13F, and 13G) at different stages of fabrication according to embodiments of methods 1000, 2000, 3000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A, 2B, 3A, 3B, 4A, 4B, 4C, 5A, 5B, 5C, 6A, 6B, 6C, 7A, 7B, 7C, 8A, 8B, 8C, 9A, 9B, 9C, 10A, 10B, and 10C are perspective views and cross-sectional views of intermediate stages in the manufacturing of nano-FETs including channels 22, source/drain regions 82 and gate structures 200, in accordance with some embodiments. FIGS. 2A, 3A, 4A, 5A, 6A, 7A, 8A, 9A, and 10A illustrate perspective views. FIGS. 2B, 3B, 4B, 5B, 6B, 7B, 8B, 9B, and 10B illustrate reference cross-section B-B' (gate cut) illustrated in FIGS. 2A, 3A, and 4A. FIGS. 4C, 5C, 6C, 7C, 8C, 9C, and 10C illustrate reference cross-section C-C' (channel/fin cut) illustrated in FIG. 4A.

Figures 2A, 2B:
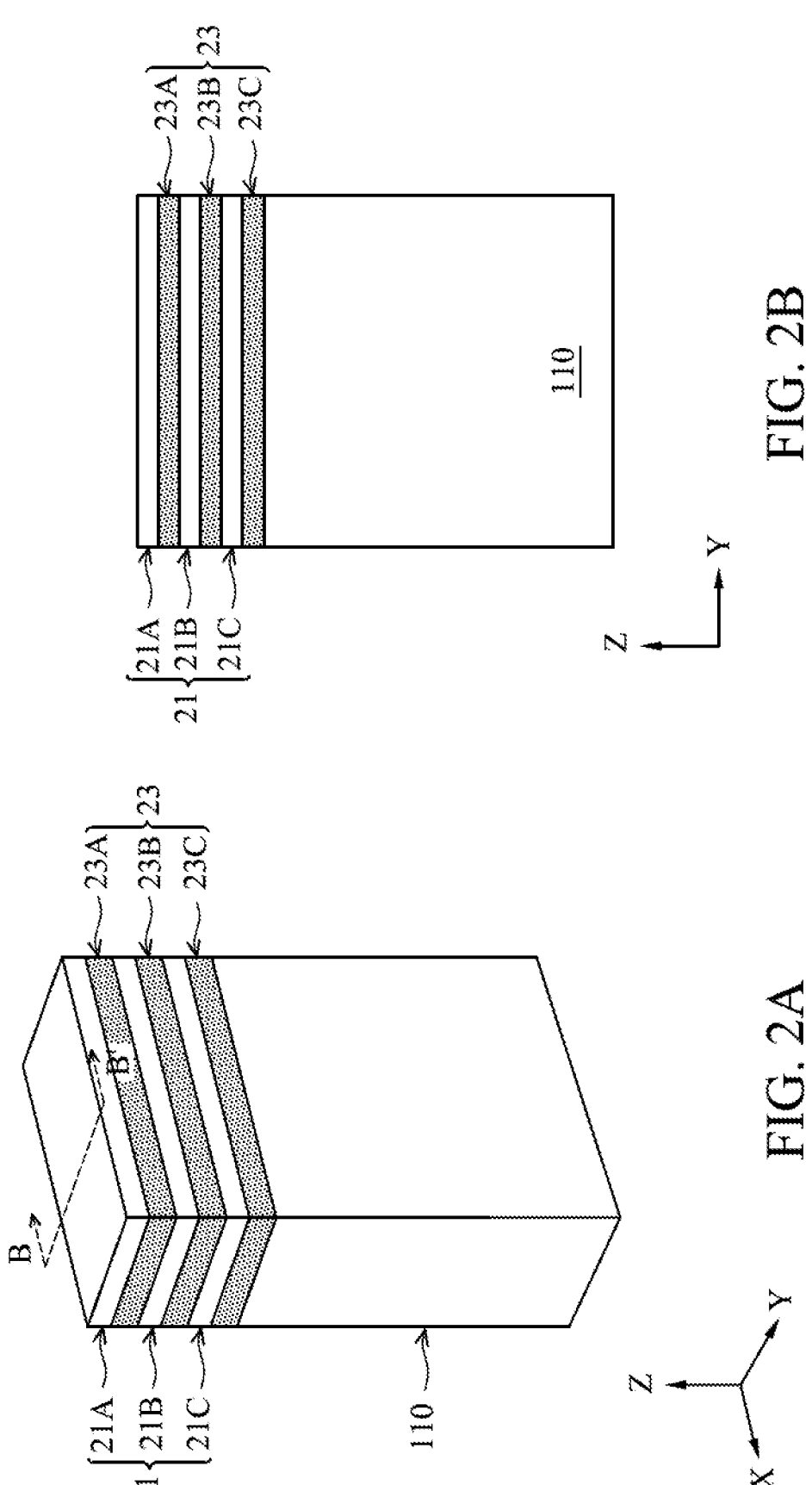
FIGS. 2A, 2B, 3A, 3B, 4A, 4B, 4C, 5A, 5B, 5C, 6A, 6B, 6C, 7A, 7B, 7C, 8A, 8B, 8C, 9A, 9B, 9C, 10A, 10B, 10C, and 10D are views of various embodiments of an IC device of at various stages of fabrication according to various aspects of the present disclosure.

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two or three or four or more each of the first semiconductor layers 21 and the second semiconductor layers 23. For example, the IC devices 10, 10A, 10B shown in FIGS. 1A, 1B, 1C, 1D, and 1E include stacks of nano-structure channels 22 that have four channels 22 each. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

Figure 3B:
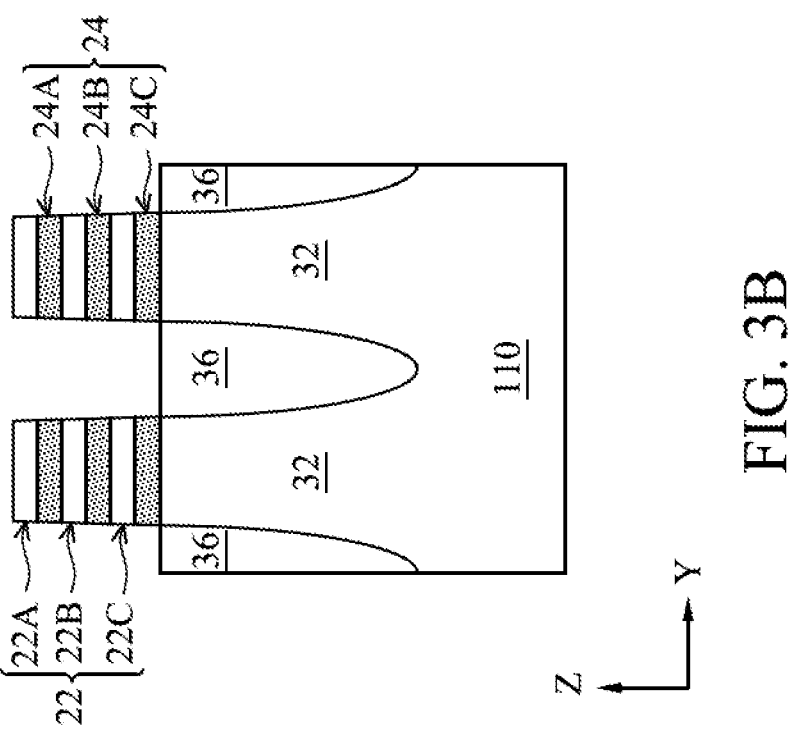
Figure 3A:
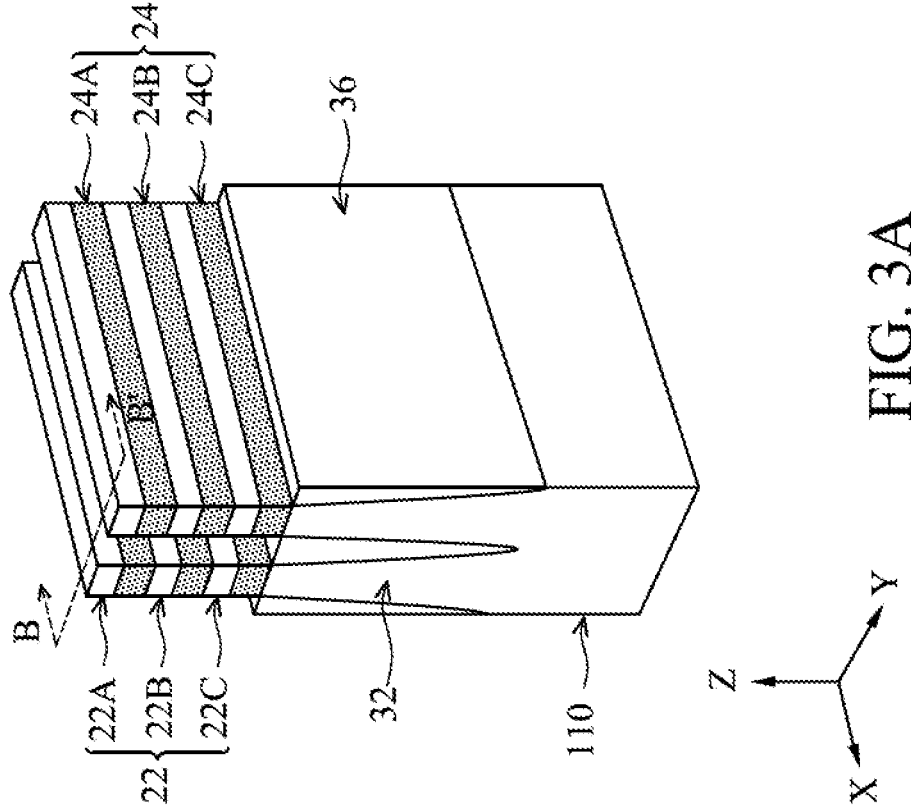

In FIG. 3A and FIG. 3B, fins 32 are formed in the substrate 110 and nanostructures 22, 24 are formed in the multi-layer stack 25 corresponding to operations 1100, 2100, 3100 of FIGS. 14, 15, and 16. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A-22C (also referred to as "channels" below) are formed from the first semiconductor layers 21, and second nanostructures 24A-24C are formed from the second semiconductor layers 23. Distance D1 between adjacent fins 32 and nanostructures 22, 24 may be from about 18 nm to about 100 nm.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A and 3B illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A and 3B, isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a fill or core material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A, 2B, 3A, and 3B illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIGS. 3A and 3B, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

Figure 4A:
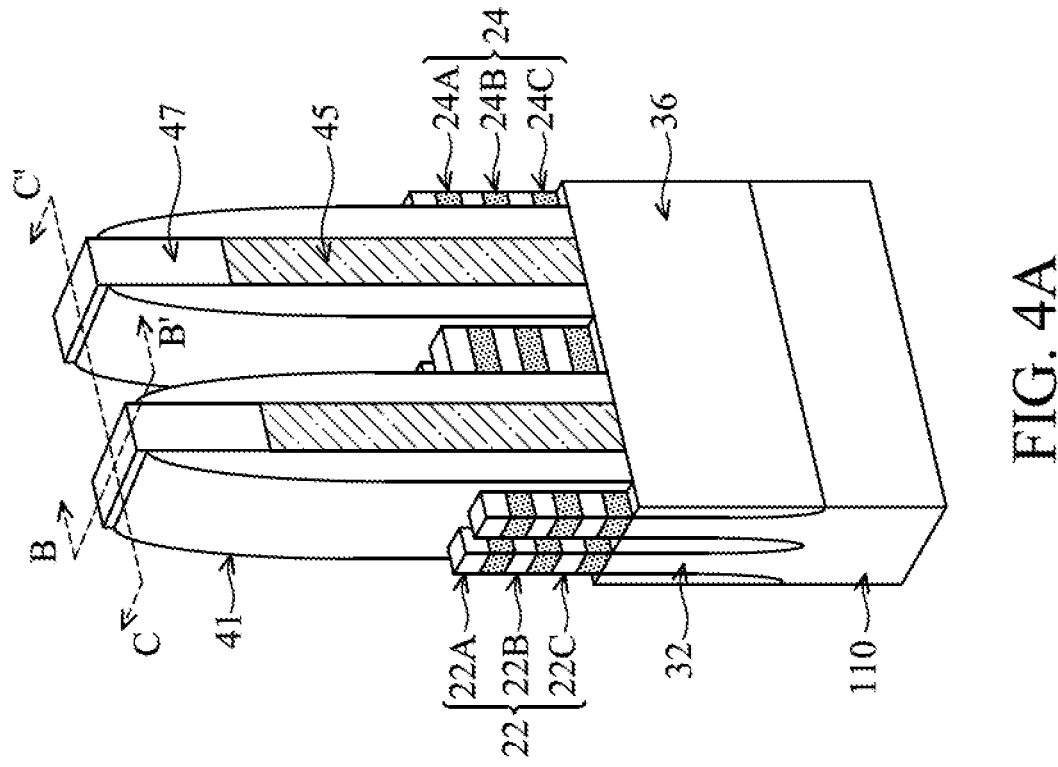
Figure 4C:
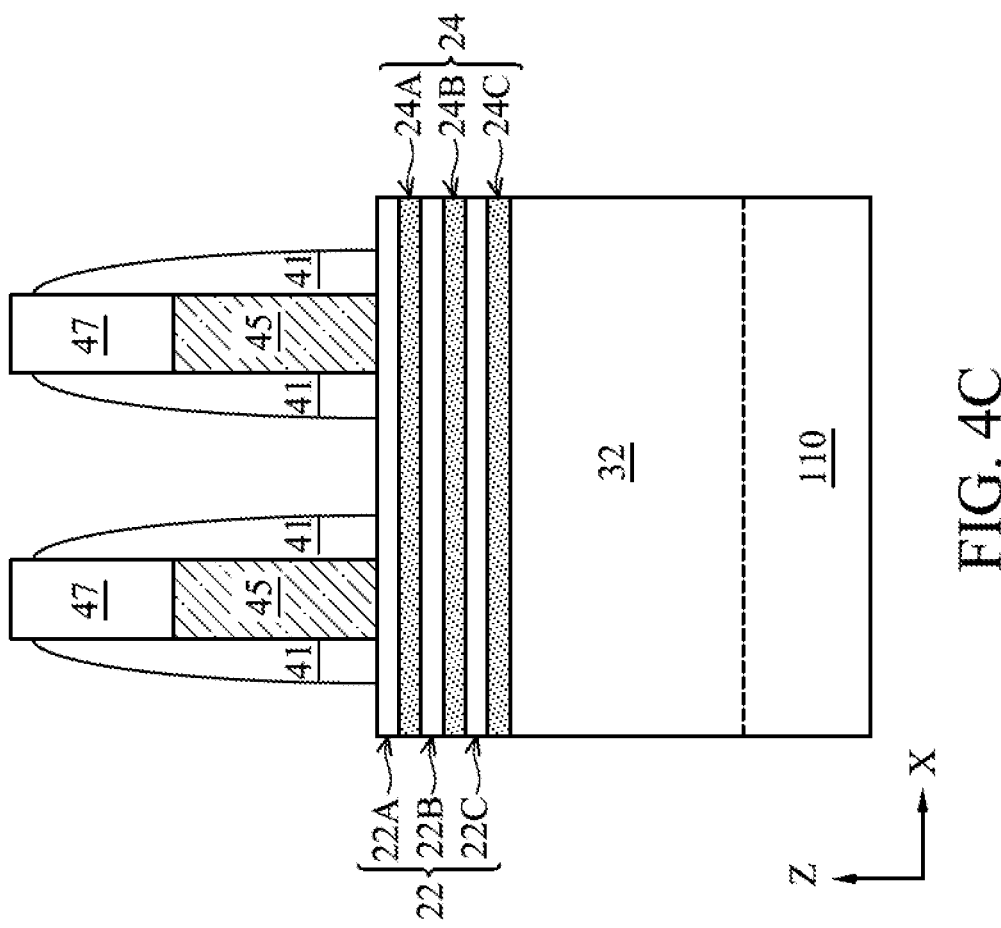
Figure 4B:
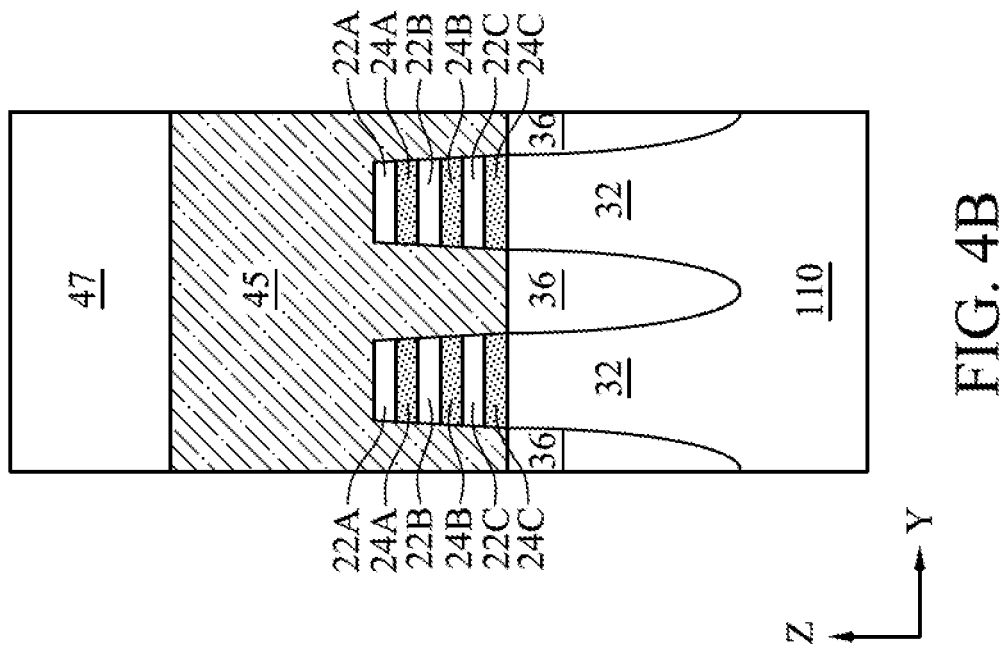

In FIGS. 4A, 4B, and 4C, dummy or sacrificial gate structures 40 are formed over the fins 32 and/or the nanostructures 22, 24. A dummy or sacrificial gate layer 45 is formed over the fins 32 and/or the nanostructures 22, 24. The dummy gate layer 45 may be made of materials that have a high etching selectivity versus the isolation regions 36. The dummy gate layer 45 may be a conductive, semiconductive, or non-conductive material and may be or include one or more of amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer (not illustrated for simplicity) is formed before the dummy gate layer 45 between the dummy gate layer 45 and the fins 32 and/or the nanostructures 22, 24.

A spacer layer 41 is formed over sidewalls of the mask layer 47 and the dummy gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments.

Figure 5A:
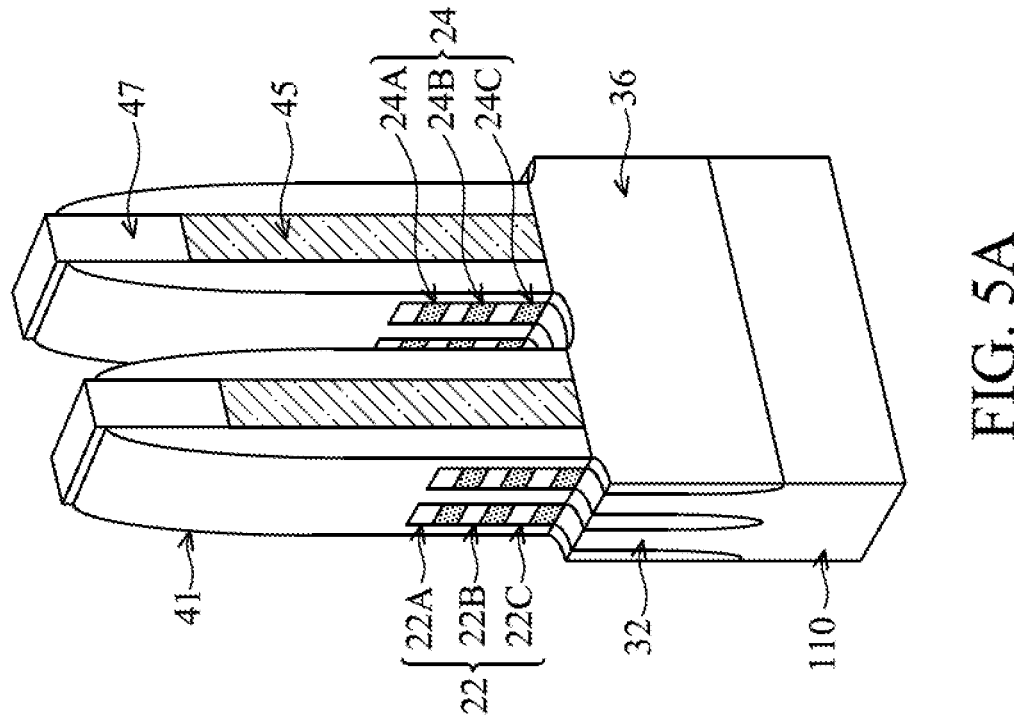
Figure 5A:
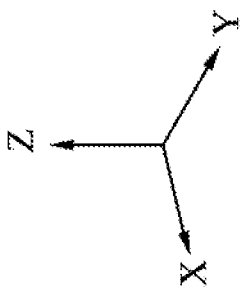
Figure 5C:
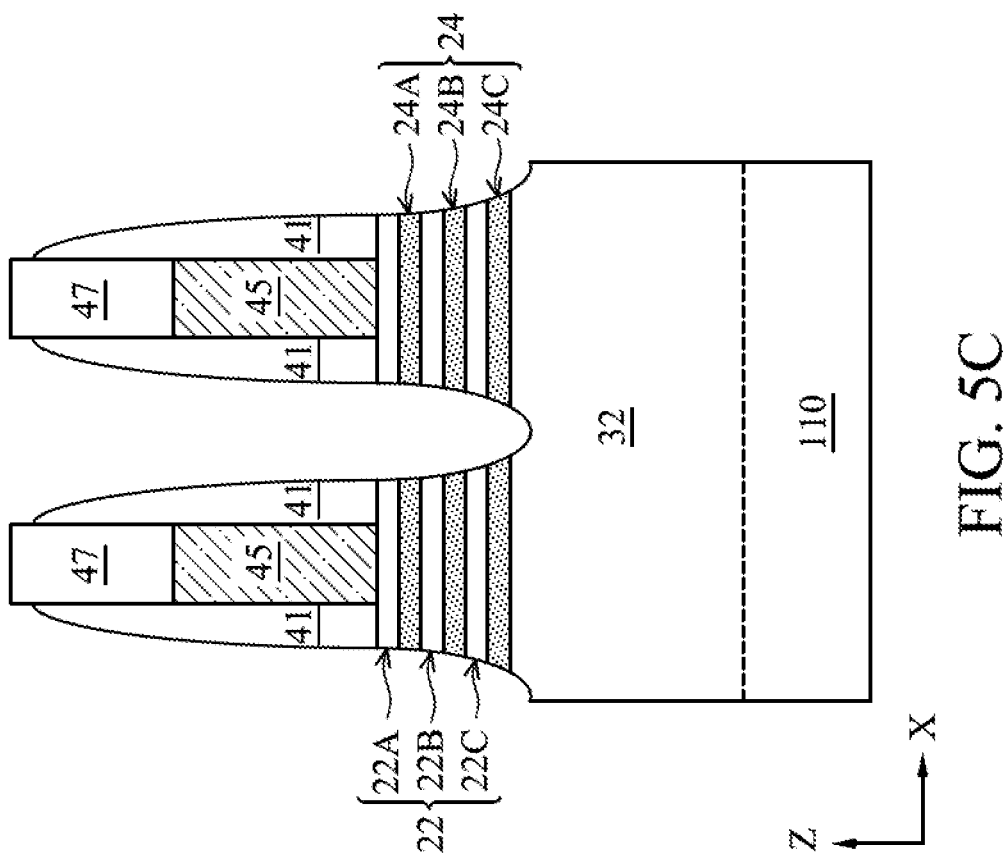
Figure 5B:
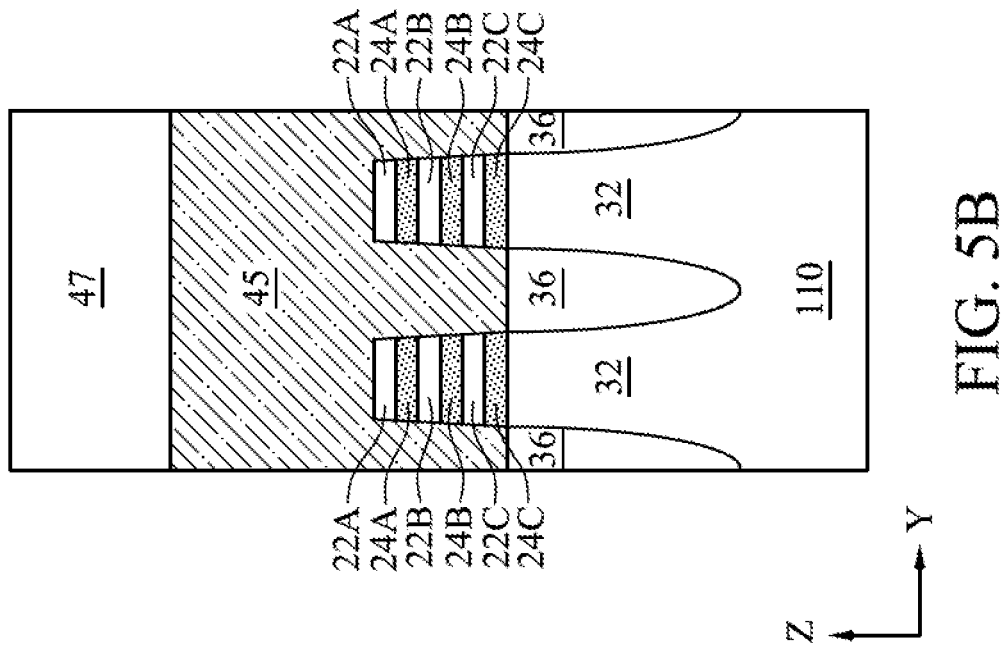

In FIGS. 5A, 5B, and 5C, an etching process is performed to etch the portions of protruding fins 32 and/or nanostructures 22, 24 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 36 as shown, in accordance with some embodiments. The top surfaces of the recessed fins 32 may be lower than the top surfaces of the isolation regions 36, in accordance with some other embodiments.

Figure 6A:
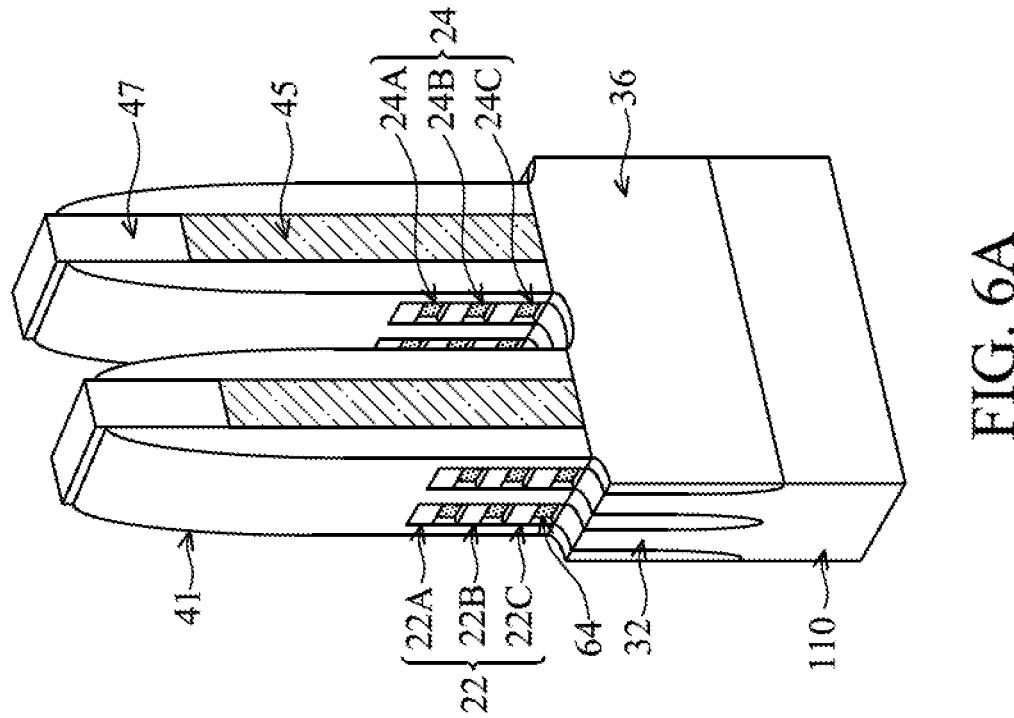
Figure 6C:
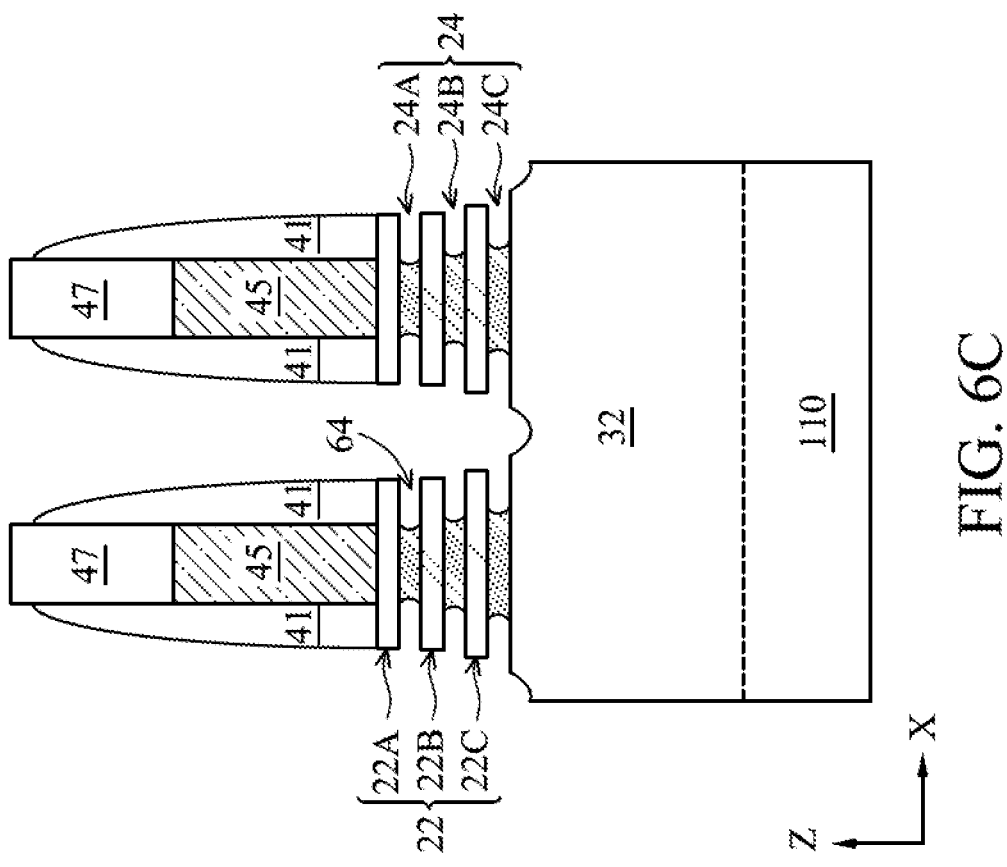
Figure 6B:
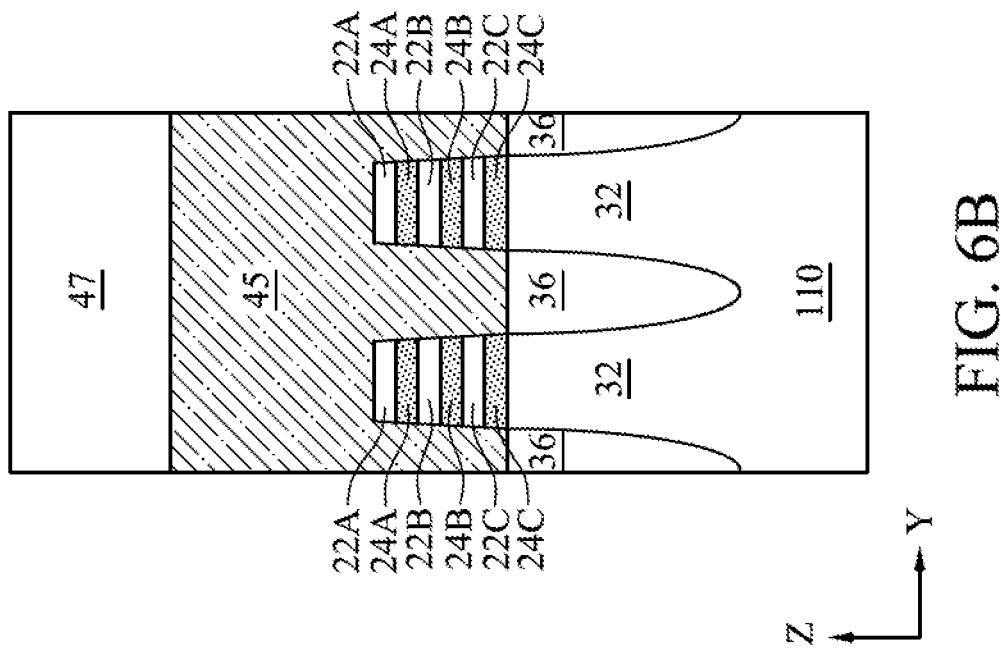

FIGS. 6A, 6B, 6C, 7A, 7B, and 7C illustrate formation of inner spacers 74. A selective etching process is performed to recess end portions of the nanostructures 24 exposed by openings in the spacer layer 41 without substantially attacking the nanostructures 22. After the selective etching process, recesses 64 are formed in the nanostructures 24 at locations where the removed end portions used to be. The resulting structure is shown in FIGS. 6A, 6B, and 6C.

Figure 7A:
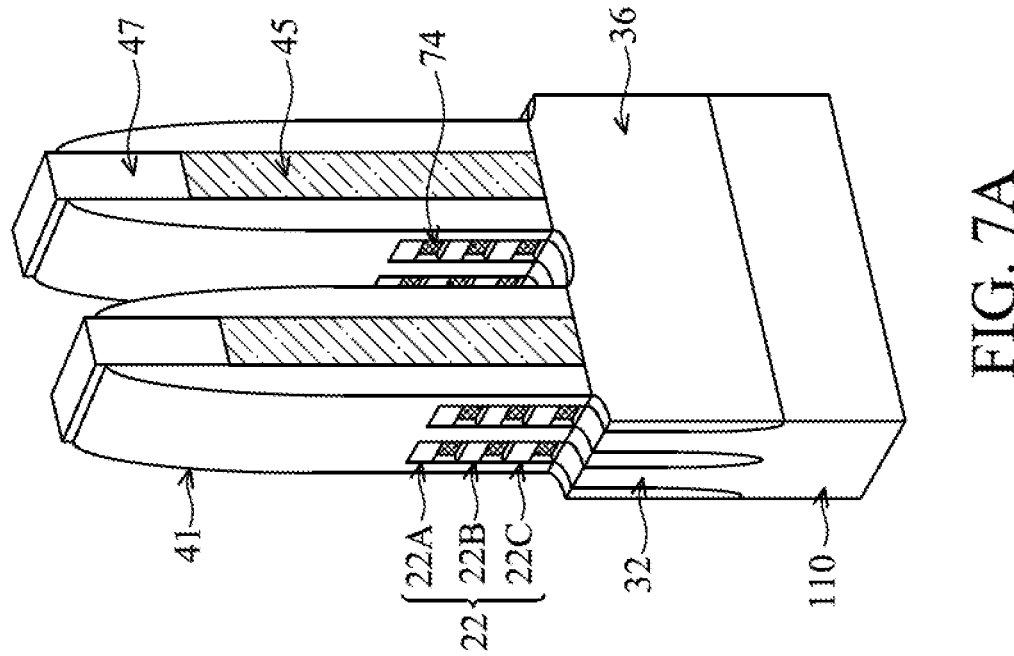
Figure 7C:
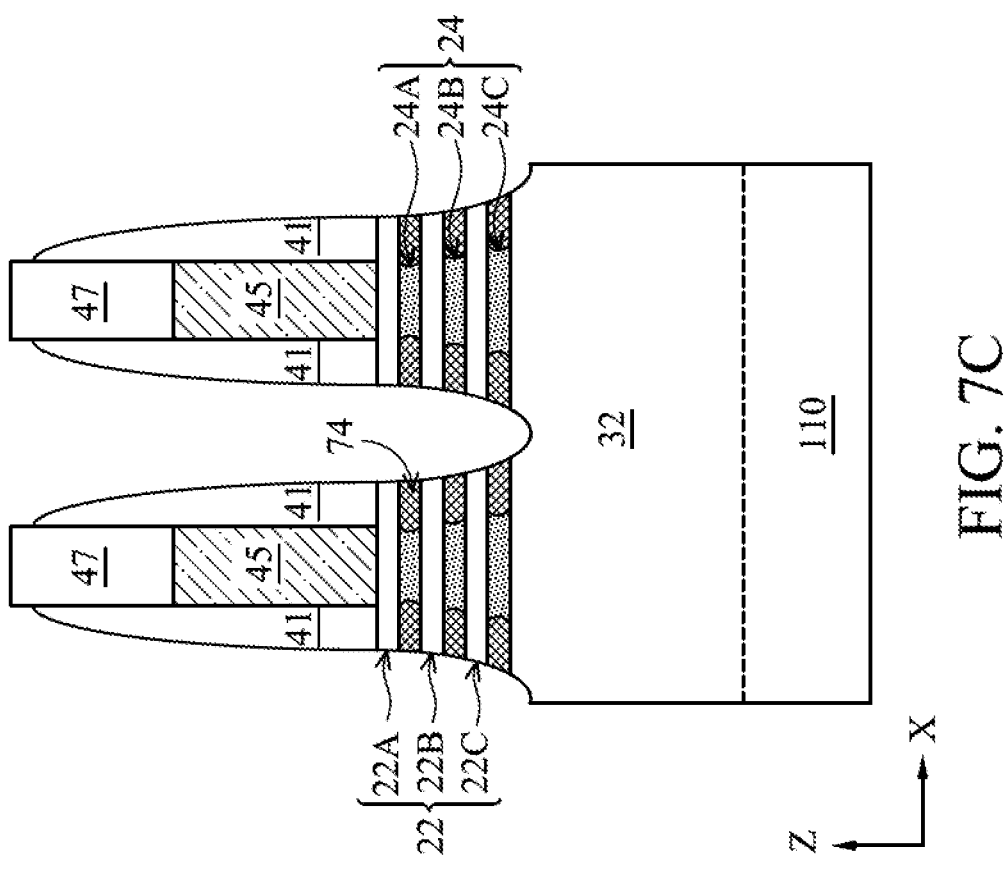
Figure 7B:
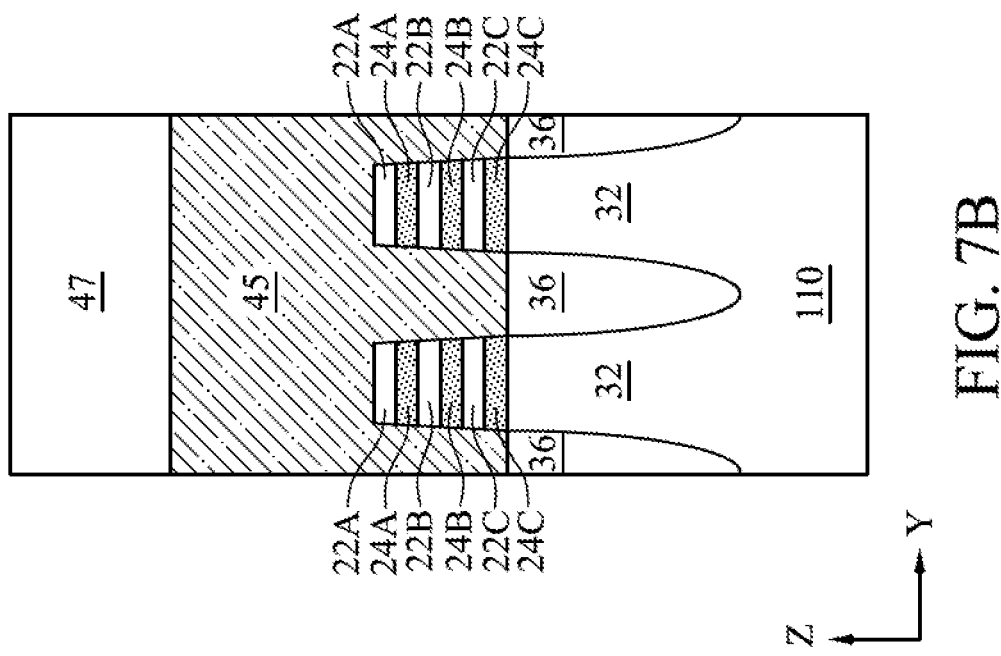

Next, an inner spacer layer is formed to fill the recesses 64 in the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses 64 in the nanostructures 24) form the inner spacers 74. The resulting structure is shown in FIGS. 7A, 7B, and 7C.

Figure 8A:
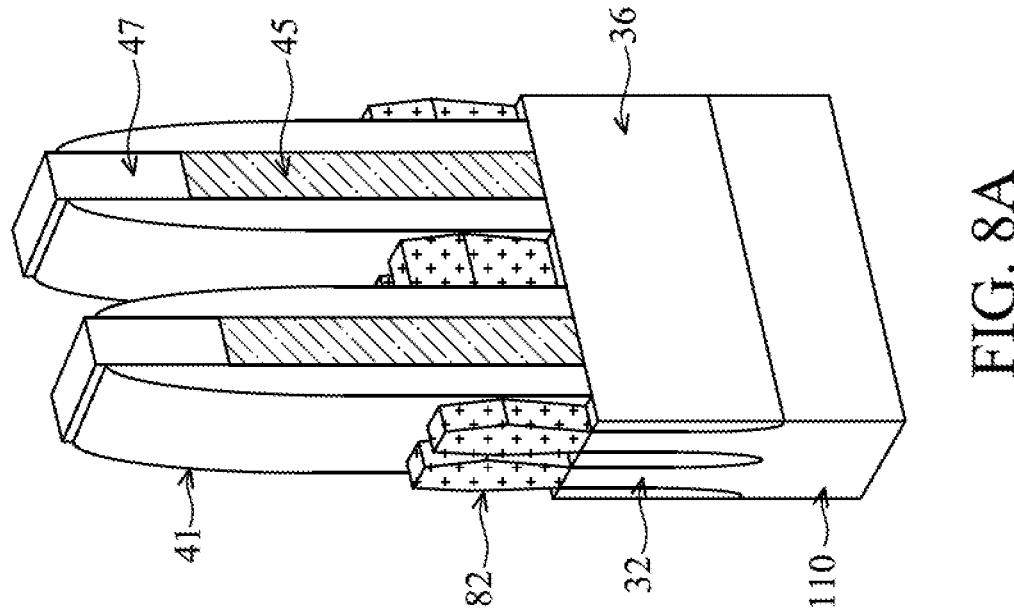
Figure 8C:
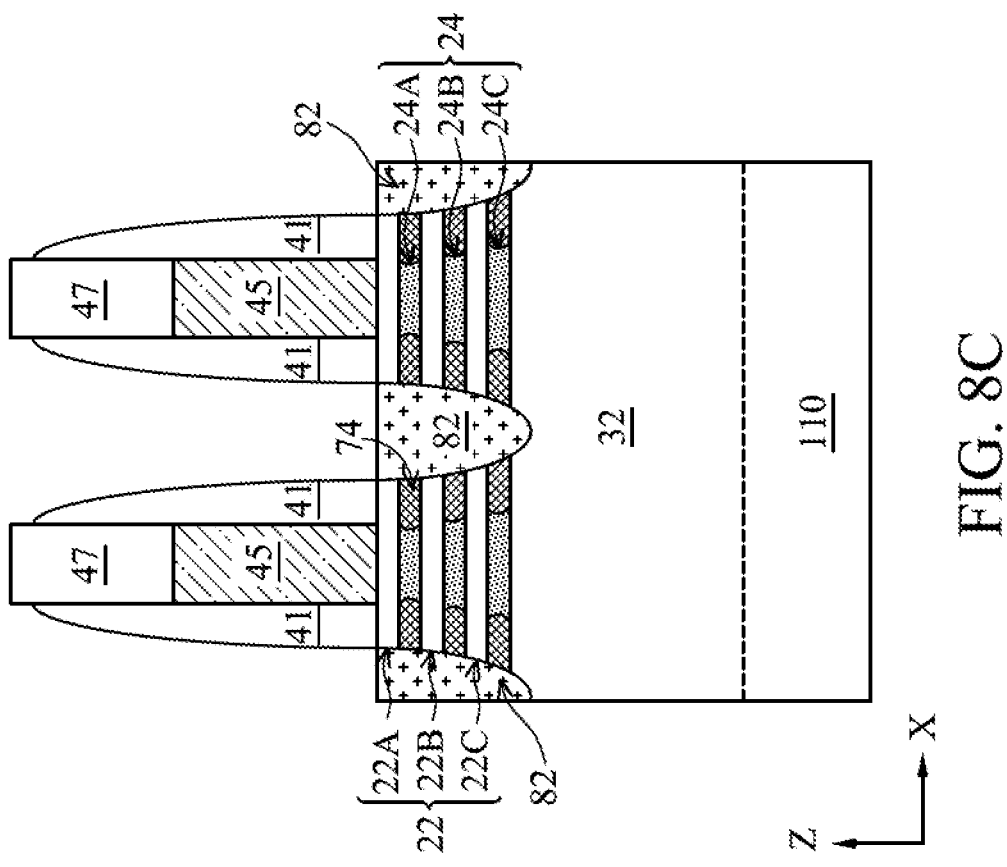
Figure 8B:
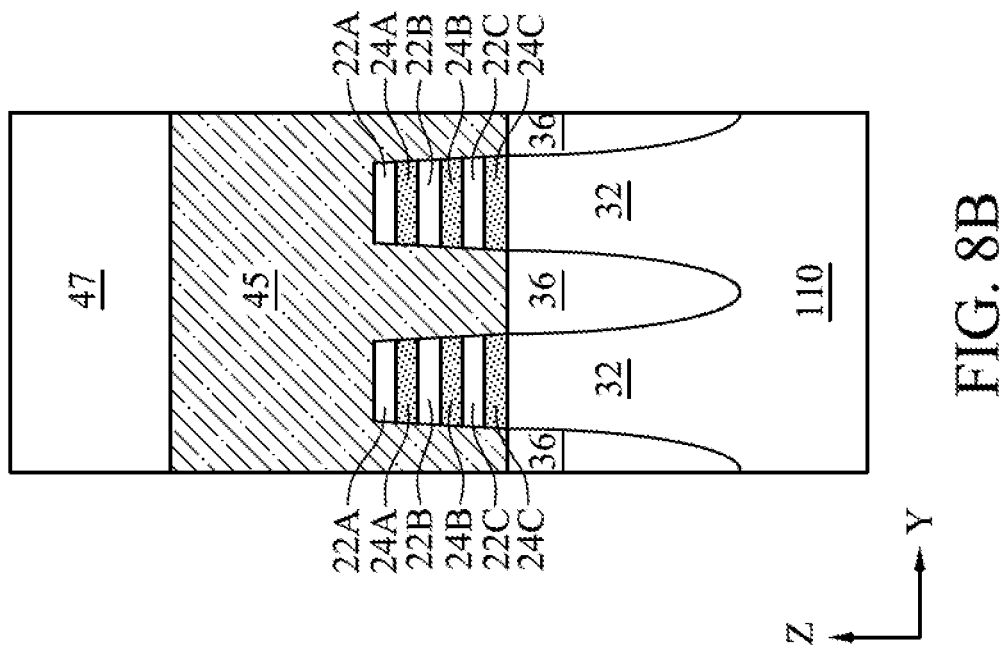

FIGS. 8A, 8B, and 8C illustrate formation of source/drain regions 82 corresponding to operations 1200, 2200, 3200 of FIGS. 14, 15, and 16. In the illustrated embodiment, the source/drain regions 82 are epitaxially grown from epitaxial material(s). In some embodiments, the source/drain regions 82 exert stress in the respective channels 22A-22C, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, SiAs or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32.

The source/drain regions 82 may be implanted with dopants followed by an anneal. The source/drain regions may have an impurity concentration of between about $10^{19}$ cm$^{-3}$ and about $10^{21}$ cm$^{-3}$. N-type and/or p-type impurities for source/drain regions 82 may be any of the impurities previously discussed. In some embodiments, the source/drain regions 82 are in situ doped during growth. A contact etch stop layer (CESL) and interlayer dielectric (ILD), not illustrated for simplicity, may then be formed covering the dummy gate structures 40 and the source/drain regions 82.

Figure 9A:
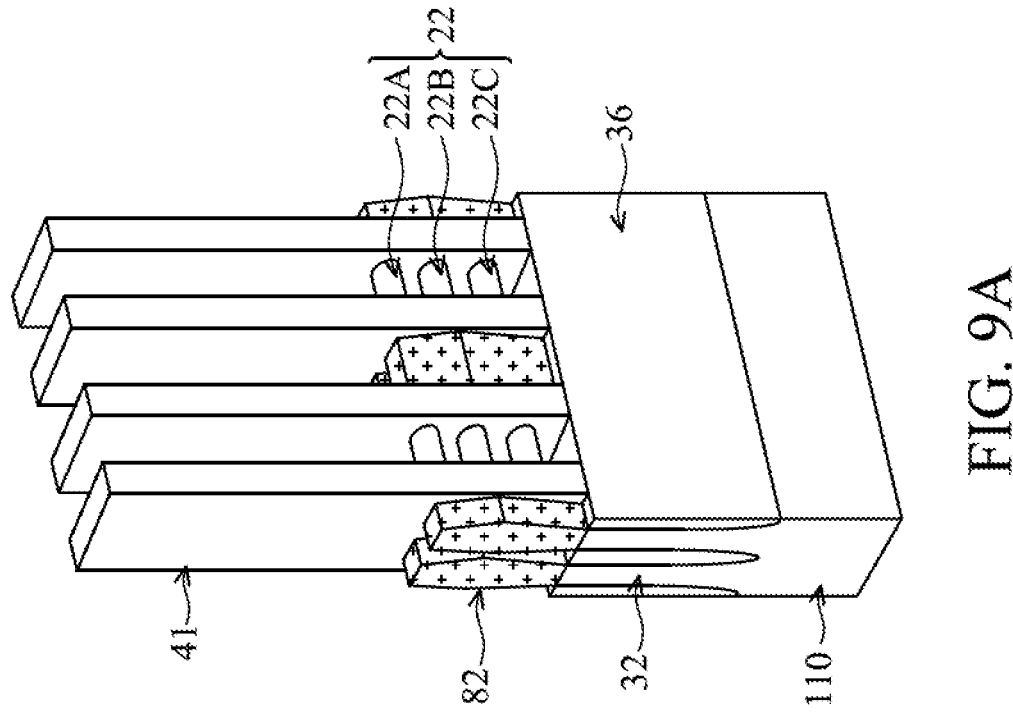
Figure 9C:
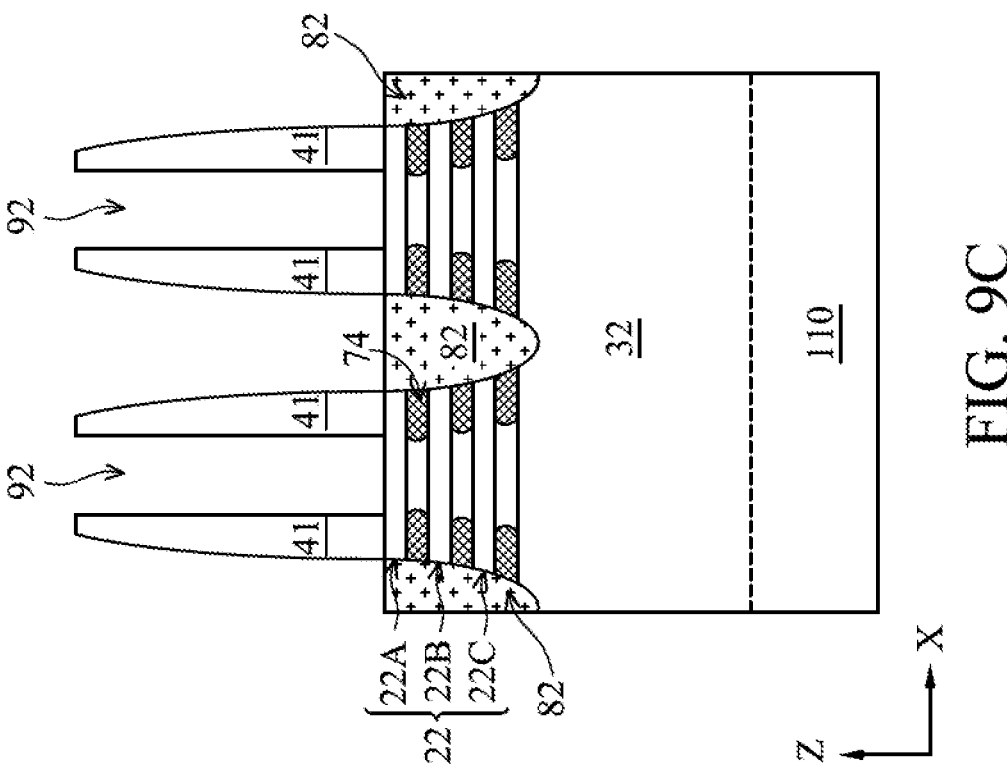
Figure 9B:
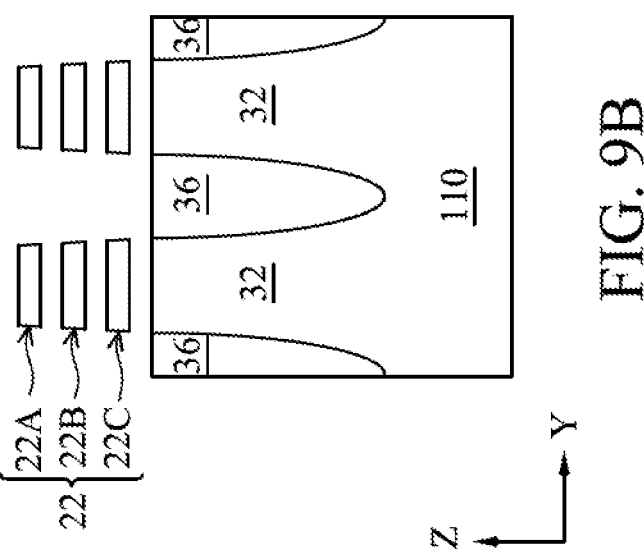

FIGS. 9A, 9B, and 9C illustrate release of fin channels 22A-22C by removal of the nanostructures 24A-24C, the mask layer 47, and the dummy gate layer 45, which corresponds to act 1500 of FIG. 14. A planarization process, such as a CMP, is performed to level the top surfaces of the dummy gate layer 45 and gate spacer layer 41. The planarization process may also remove the mask layer 47 (see FIG. 8A) on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric, when present, may be used as an etch stop layer when the dummy gate layer 45 is etched. The dummy gate dielectric may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). The nanosheets may be collectively referred to as the channels 22 of the nanostructure device 20 formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises $F_2$ and HF, and the carrier gas may be an inert gas such as Ar, He, $N_2$, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of the nanostructure devices 20 that are NFETs, and the nanostructures 22 may be removed and the nanostructures 24 may be patterned to form channel regions of the nanostructure devices 20 that are PFETs. In some embodiments, the nanostructures 22 may be removed and the nanostructures 24 may be patterned to form channel regions of the nanostructure devices 20 that are NFETs, and the nanostructures 24 may be removed and the nanostructures 22 may be patterned to form channel regions of the nanostructure devices 20 that are PFETs. In some embodiments, the nanostructures 22 may be removed and the nanostructures 24 may be patterned to form channel regions of both PFETs and NFETs.

In some embodiments, the nanosheets 22 of the nanostructure device 20 are reshaped (e.g., thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Figure 10A:
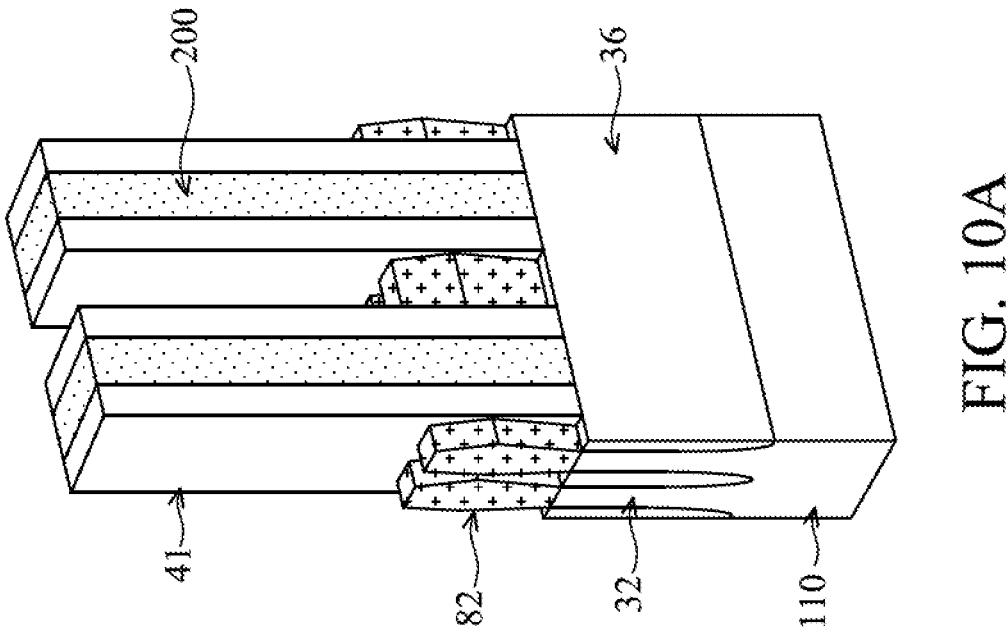
Figure 10A:
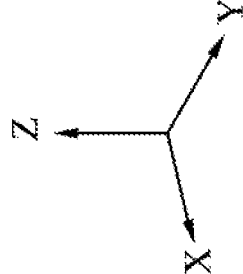
Figure 10C:
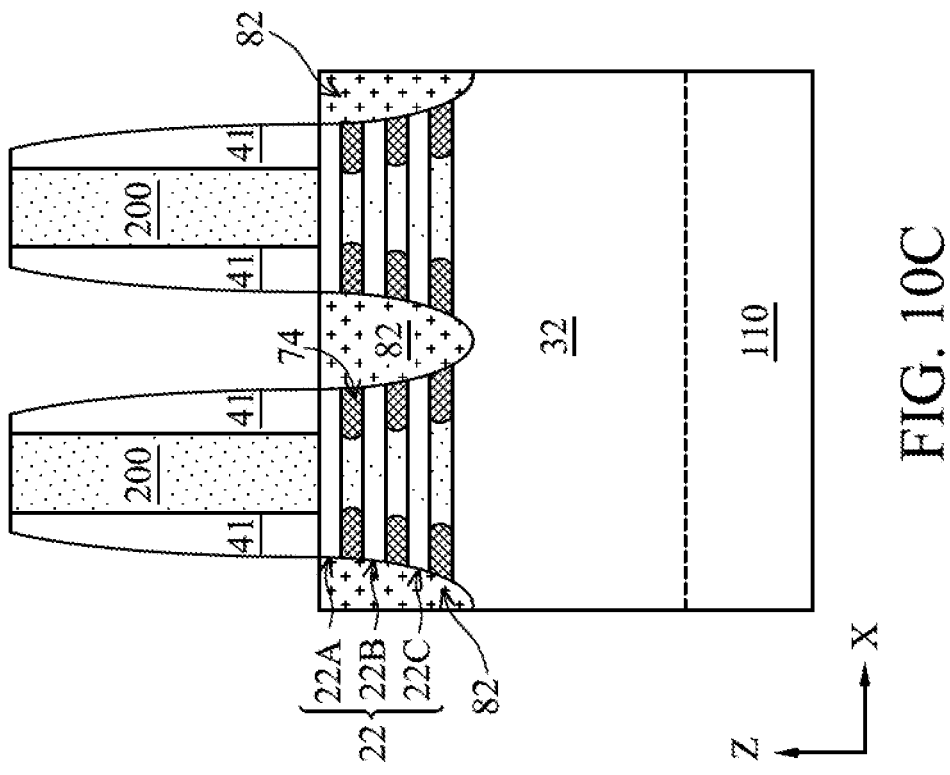
Figure 10B:
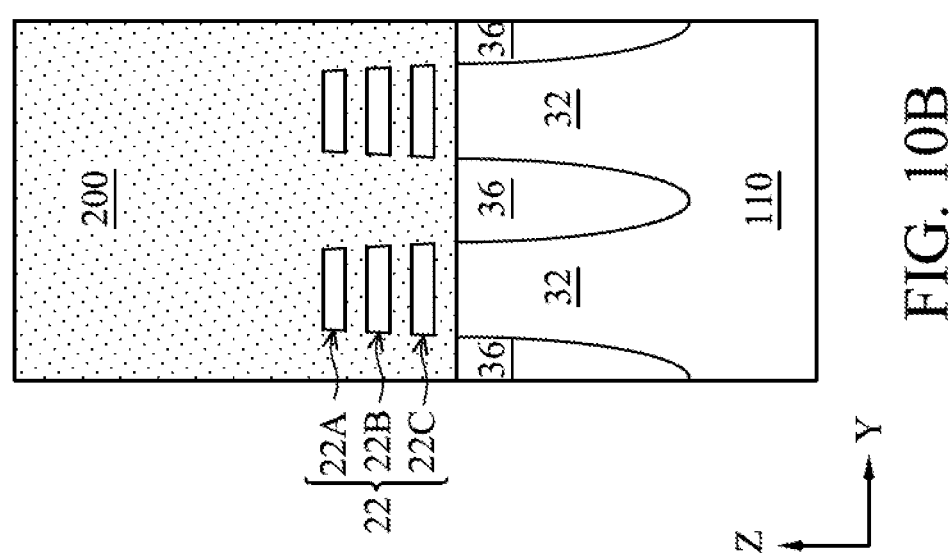
Figure 10D:
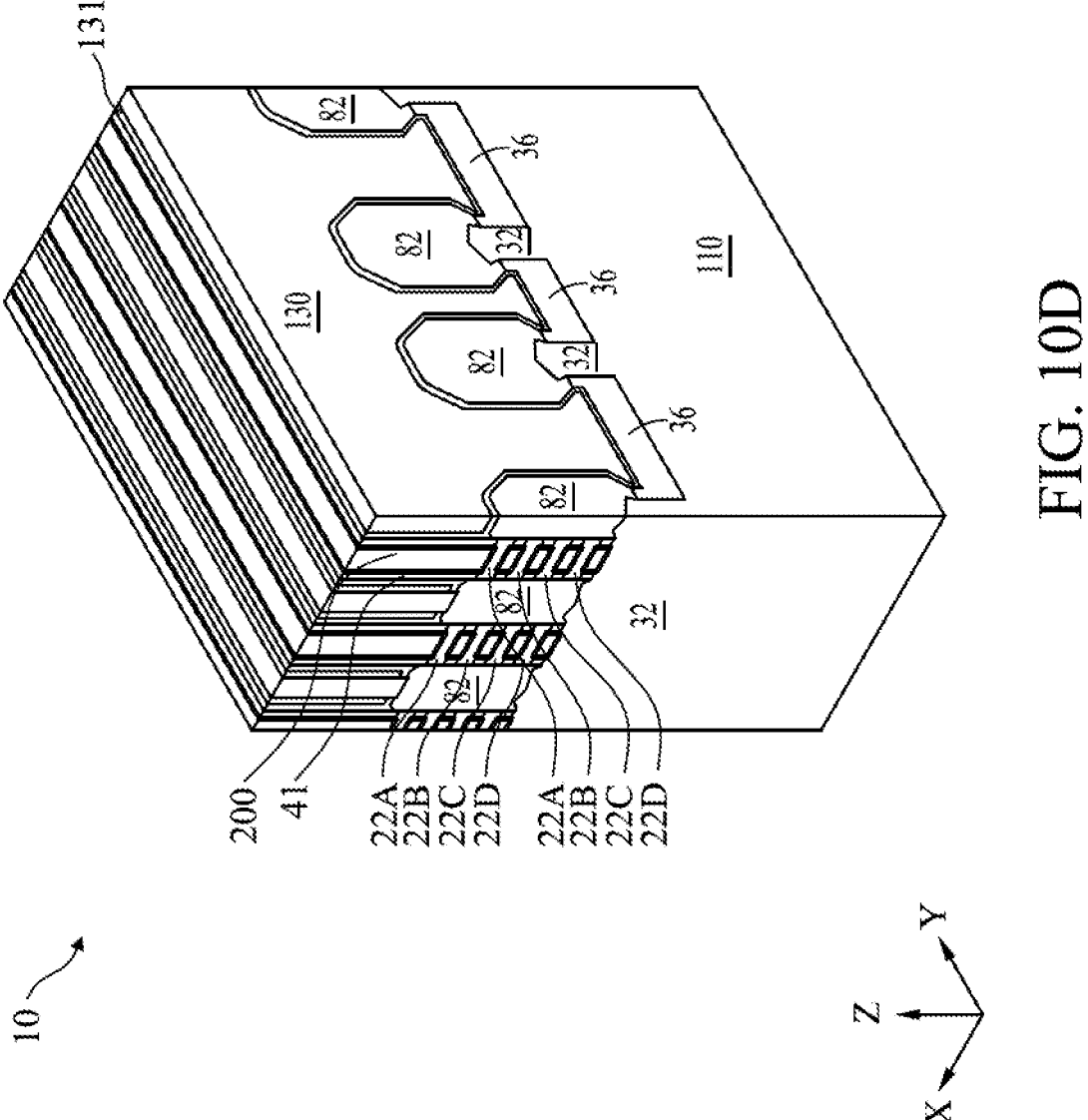

Next, in FIGS. 10A, 10B, 10C, and 10D, gate structures 200 are formed, corresponding to operations 1300, 2300, 3300 of FIGS. 14, 15, and 16. Each gate structure 200 may include the first IL layer 210, the first gate dielectric layer 222, the second gate dielectric layer 230, the second IL layer 240, the first work function metal layer 900, and the gate core layer 290. In some embodiments, the replacement gate 200 includes the second work function layer 700. Following deposition of materials of the gate structures 200, a removal operation, such as a CMP, may be performed to remove excess materials of the gate structures 200 overlying the ILD 130. The resulting structure is shown in FIG. 10D.

FIGS. 11A, 11B, 11C, 11D, 11E, 11F, 11G, 11H, 11I, and 11J are views of various embodiments of an IC device at various stages of forming a frontside via for backside power delivery in accordance with various embodiments. FIGS. 12A, 12B, 12C, 12D, 12E, 12F, 12G, 12H, and 12I are views of various embodiments of an IC device at various stages of forming a frontside via for backside power delivery in accordance with various embodiments. FIGS. 13A, 13B, 13C, 13D, 13E, 13F, and 13G are views of various embodiments of an IC device at various stages of forming a frontside via for backside power delivery in accordance with various embodiments.

Figure 11A:
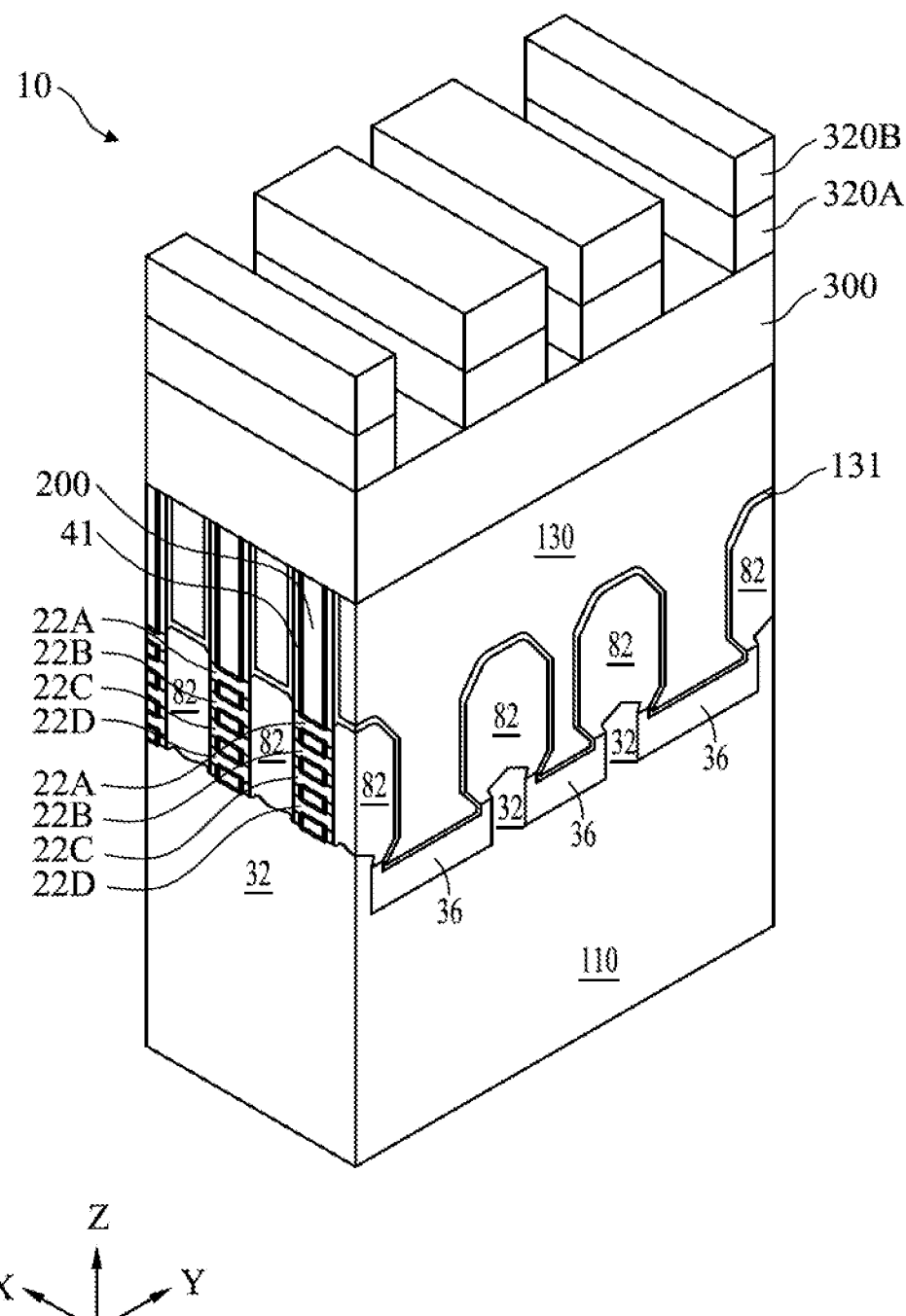
FIGS. 11A, 11B, 11C, 11D, 11E, 11F, 11G, 11H, 11I, and 11J are views of various embodiments of an IC device at various stages of forming a frontside via for backside power delivery in accordance with various embodiments.

In FIG. 11A, following formation of the gate structures 200, a first mask layer 300 is formed on the ILD 130 and the gate structures 200, followed by formation of one or more second mask layers 320A, 320B on the first mask layer 300. In some embodiments, the first mask layer 300 is a hard mask layer, and the second mask layers 320A, 320B include one or more of a photoresist layer, an anti-reflective coating layer, or the like. Portions of the first mask layer 300 are exposed by patterning the second mask layers 320A, 320B. The portions extend along a first direction (e.g., the X-axis direction) transverse a direction of extension of the gate structures 200. The portions are arranged along a second direction (e.g., the Y-axis direction).

Figure 11B:
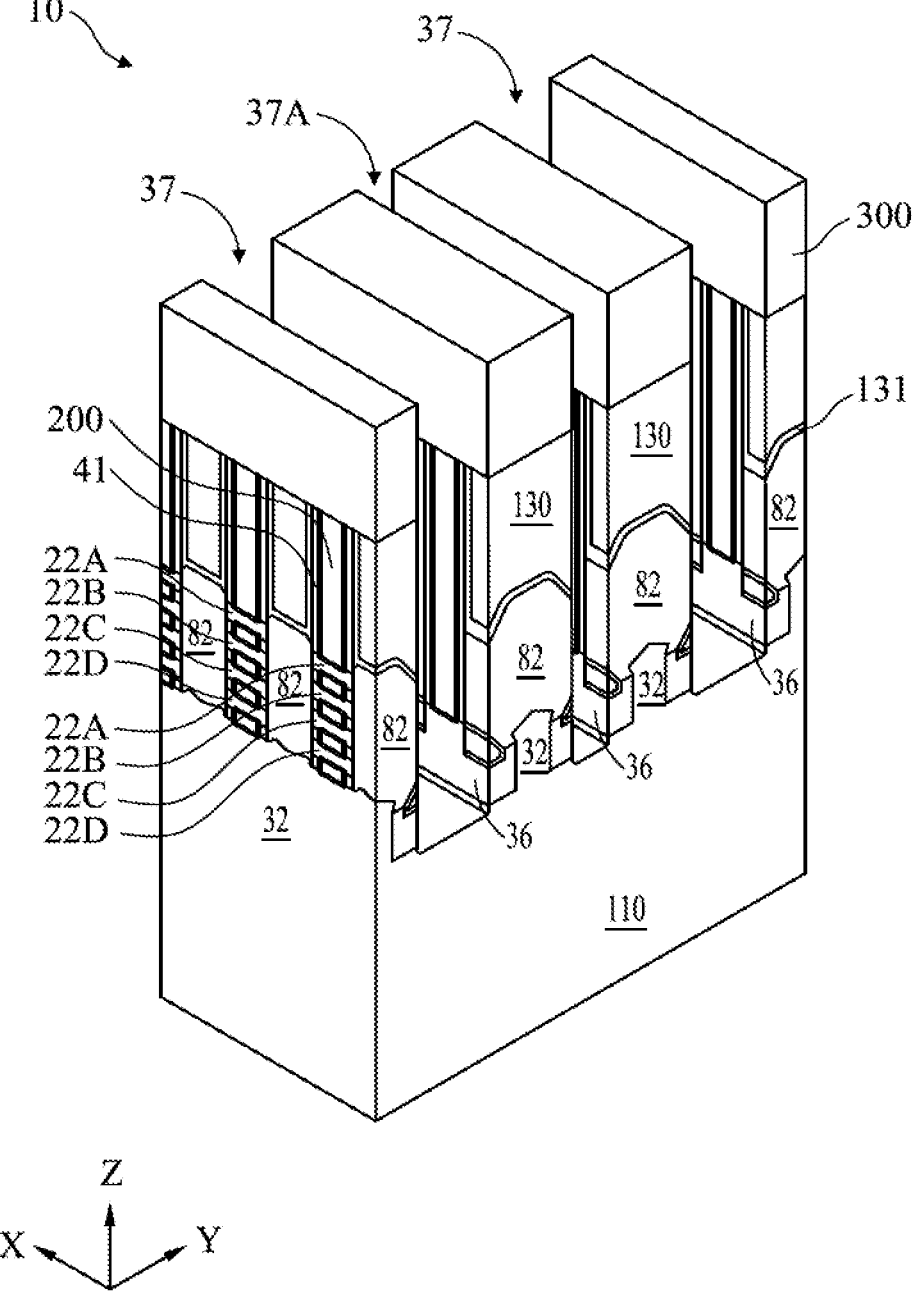

In FIG. 11B, openings 37, 37A are formed in the portions of the first mask layer 300 exposed by the second mask layers 320A, 320B. In some embodiments, the openings 37, 37A include cell boundary openings 37 and cell internal openings 37A. Portions of the IC device 10 exposed by the openings 37, 37A in the first mask layer 300 are then etched through the first mask layer 300 to extend the openings 37, 37A to the substrate 110, as shown. The openings 37, 37A may extend through the ILD 130, the gate structures 200 and the isolation regions 36, and may extend partially into substrate 110. One or more suitable etching operations may be performed to extend the openings 37, 37A by removing material of the ILD 130, the gate structures 200, the isolation regions 36 and the substrate 110.

Figure 11C:
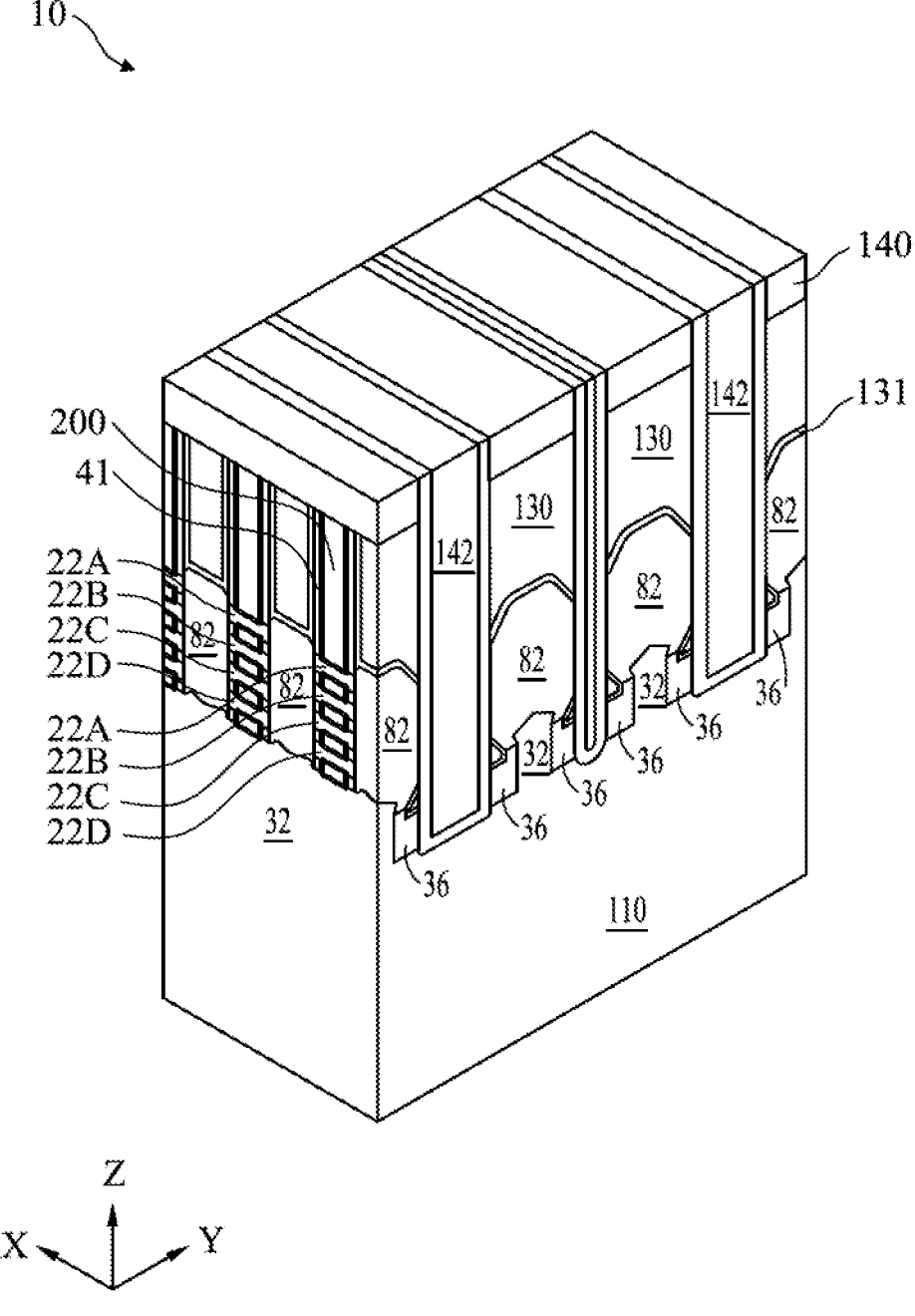

In FIG. 11C, a fourth isolation layer 140 and a dielectric plug layer 142 are formed in the openings 37, 37A by one or more deposition operations, corresponding to operations 1400, 2400, 3400 of FIGS. 14, 15, and 16. The fourth isolation layer 140 may be formed as a conformal layer of a first dielectric material by a first deposition operation, such as a PVD, CVD, ALD, or the like. Following formation of the isolation layer 140, the dielectric plug layer 142 is formed of a second dielectric material different than the first dielectric material by a second deposition operation, such as a PVD, CVD, ALD or the like. The dielectric plug layer 142 may be or include the same material as the ILD 130. In some embodiments, the fourth isolation layer 140 and the dielectric plug layer 142 are formed by depositing different materials of SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO and SiO. The fourth isolation layer 140 and the dielectric plug layer 142 may be referred to collectively as a gate isolation structure.

The operations shown in FIGS. 11A, 11B, and 11C may be referred to collectively as a gate structure isolation process (or "cut metal gate process"), and may be used to isolate IC cells from each other, and to isolate nanostructure devices 20 in each of the IC cells from each other.

Figure 11D:
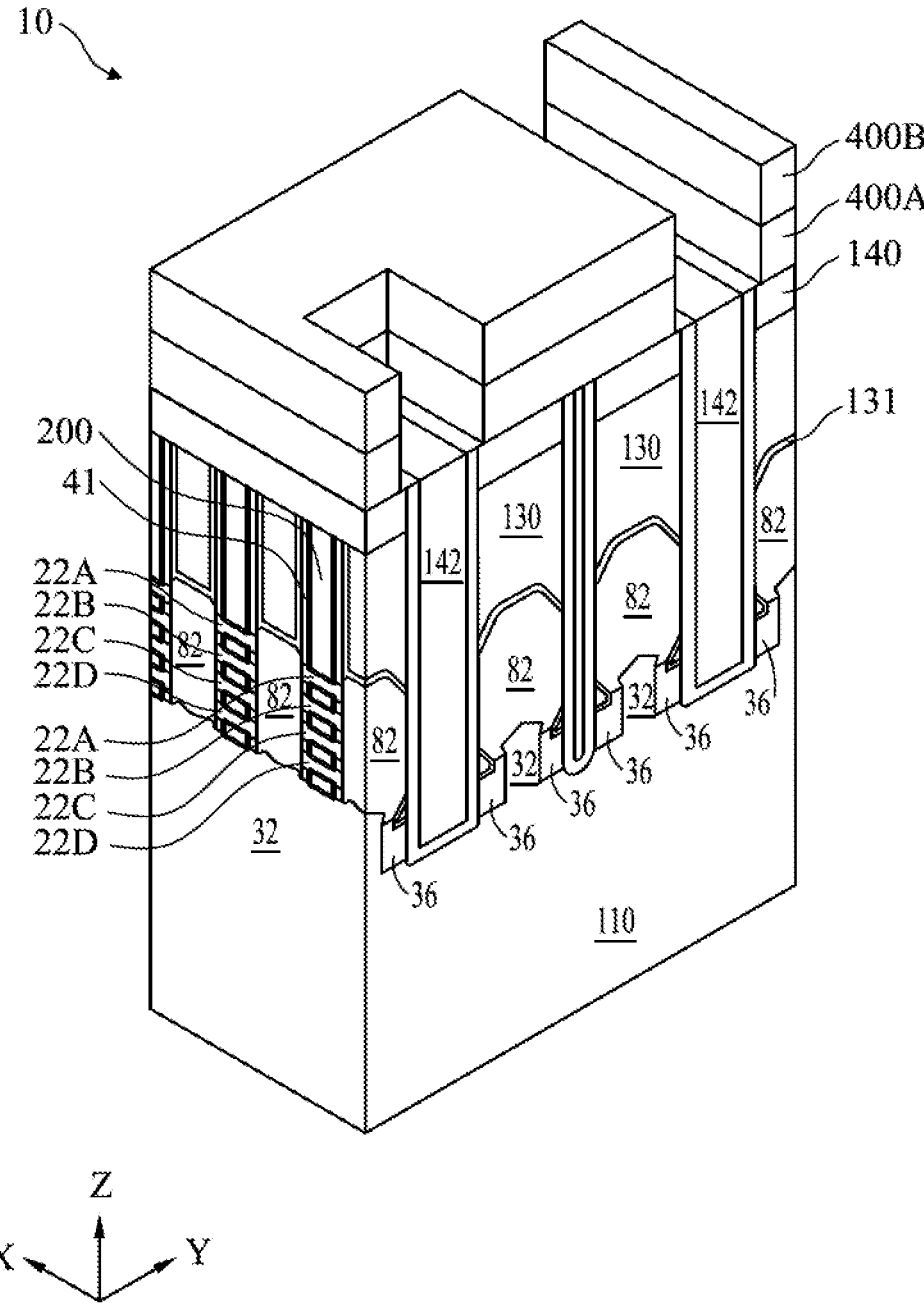

In FIG. 11D, third mask layers 400A, 400B are formed over the isolation layer 140 and the dielectric plug layer 142, then patterned to form openings that expose portions of the isolation layer 140 and the dielectric plug layer 142. The third mask layers 400A, 400B may include one or more photoresist layers, anti-reflective coating layers, hard mask layers, or the like.

Figure 11E:
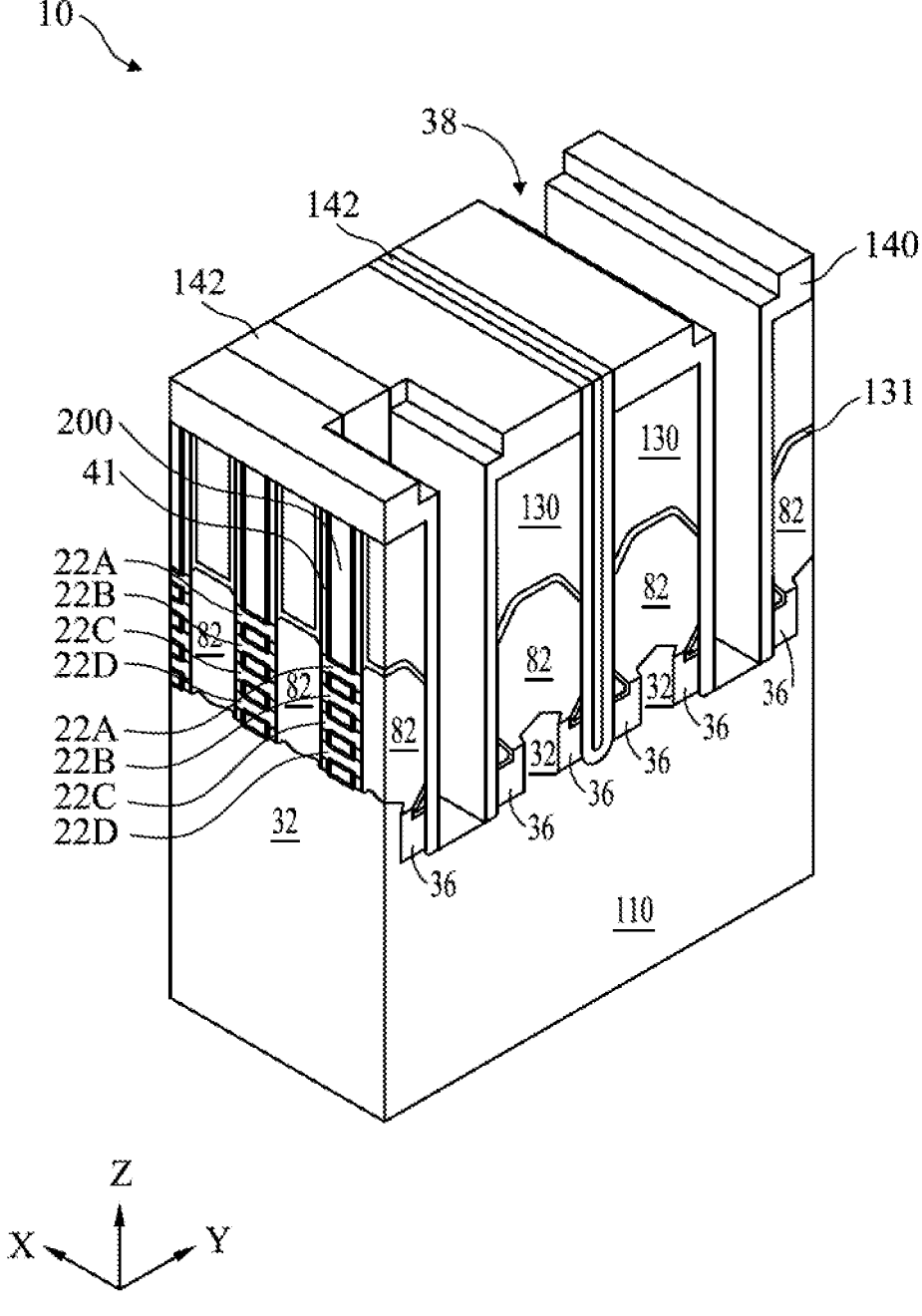

In FIG. 11E, openings 38 are formed by etching exposed portions of the isolation layer 140 and the dielectric plug layer 142 through the openings in the third mask layers 400A, 400B, corresponding to operation 1500 of FIG. 14 and operation 3500 of FIG. 16. In some embodiments, the exposed portions are etched by one or more anisotropic etching operations. For example, a first anisotropic etching operation may be performed to remove material of the dielectric plug layer 142 exposed by the openings in the third mask layers 400A, 400B. Then, a second anisotropic etching operation may be performed to remove (e.g., break through) material of the isolation layer 140 in contact with the substrate 110, so as to expose the substrate 110. In the second anisotropic etching operation, material at the top of the isolation layer 140 exposed by the openings in the third mask layers 400A, 400B may be recessed, as shown.

Figure 11F:
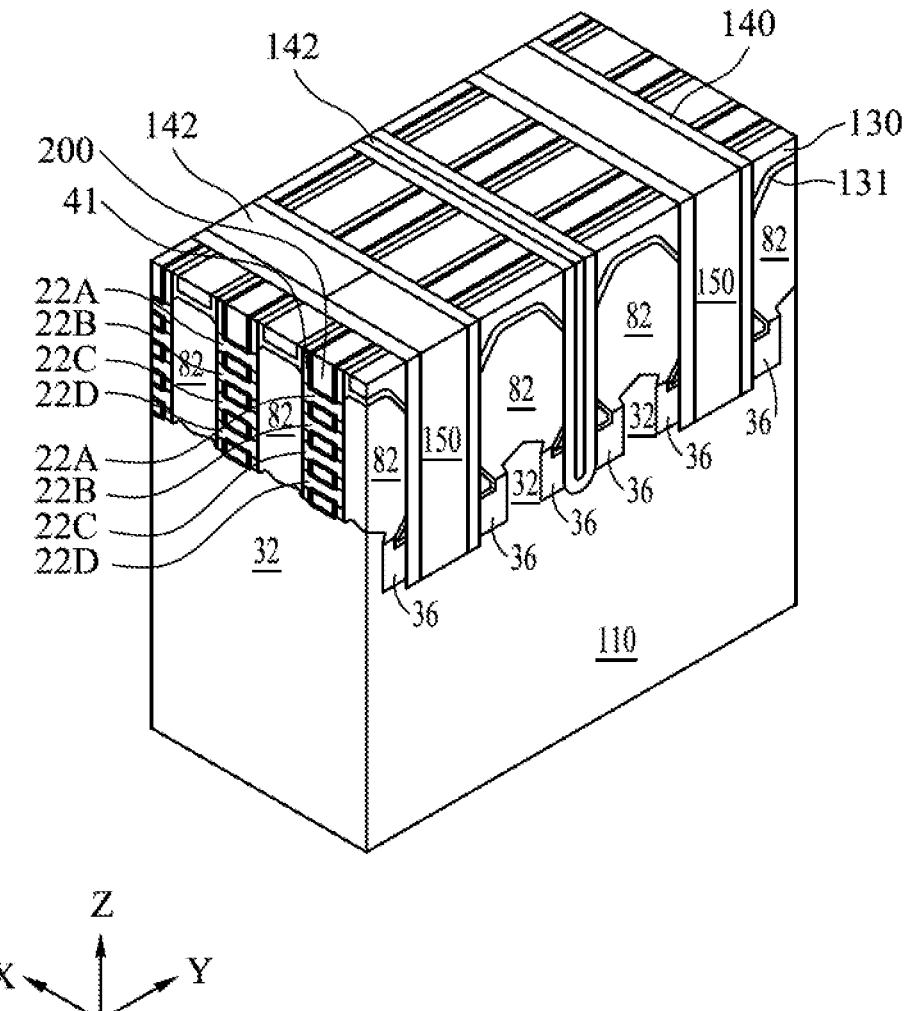

In FIG. 11F, material of the power vias 150 is deposited in the openings 38 formed by the process described with reference to FIG. 11E, corresponding to operation 1600 of FIG. 14. The material of the power vias 150 may be deposited by a PVD, CVD, ALD, sputtering, or other suitable deposition operation. Following deposition of the material of the power vias 150 in the openings 38, one or more removal operations, such as a CMP, may be performed to remove the third mask layers 400A, 400B and portions of the fourth isolation layer 140 and the dielectric plug layer 142 overlying the gate structures 200. The removal operations may recess the gate structures, the ILD 130 and the power vias 150 to a level lower than that shown in FIG. 11E.

Figure 11G:
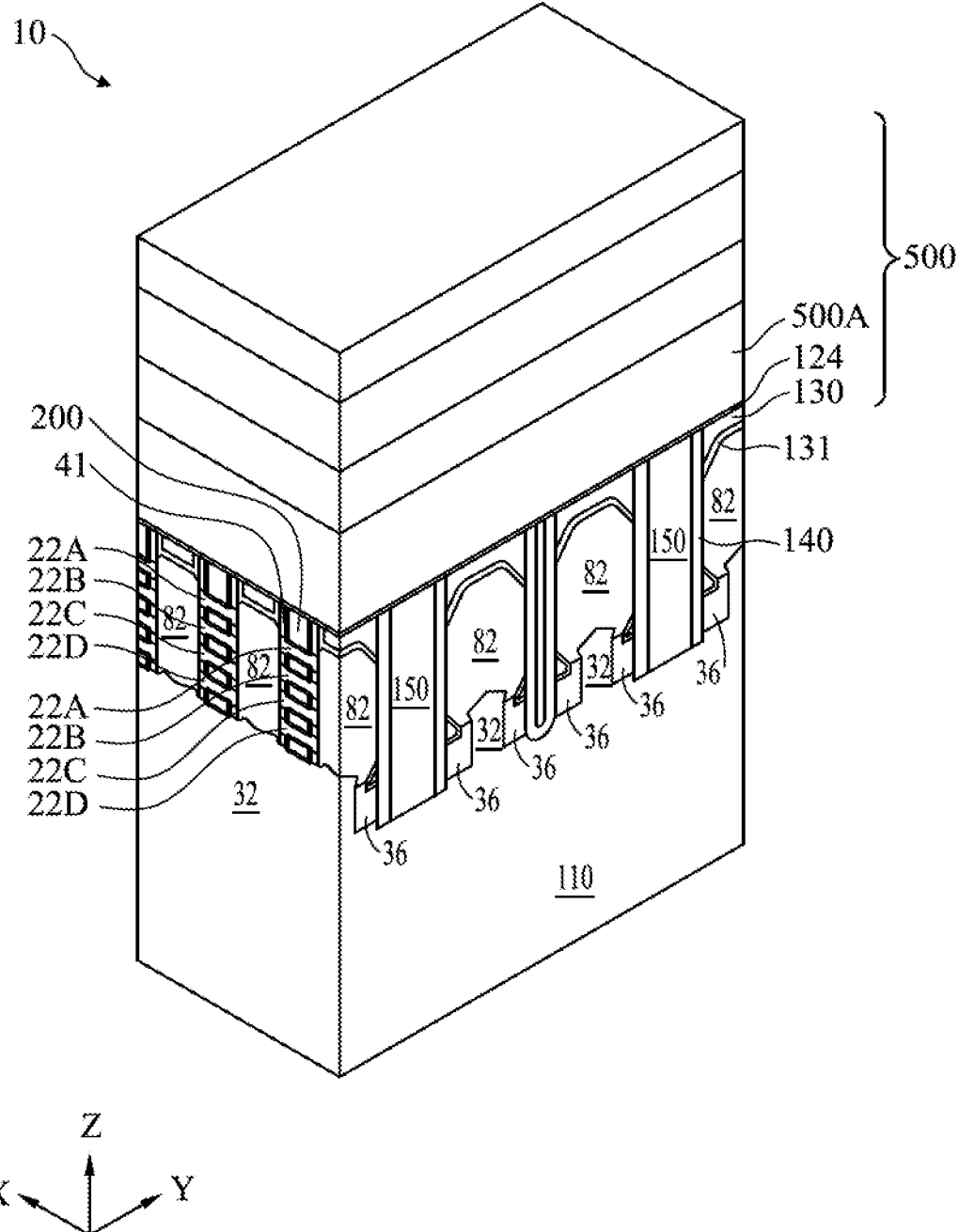

In FIG. 11G, following recessing and planarization of the structure 10 shown in FIG. 11F, a hard mask structure 500 may be formed over the gate structures 200, the ILD 130 and the power vias 150. In some embodiments, the hard mask structure 500 includes a second isolation layer 124 and a bottom hard mask layer 500A. The hard mask structure 500 may be a multilayer structure including two or more hard mask layers. For example, as shown in FIG. 11G, the hard mask structure 500 includes three hard mask layers on the bottom hard mask layer 500A.

Figure 11H:
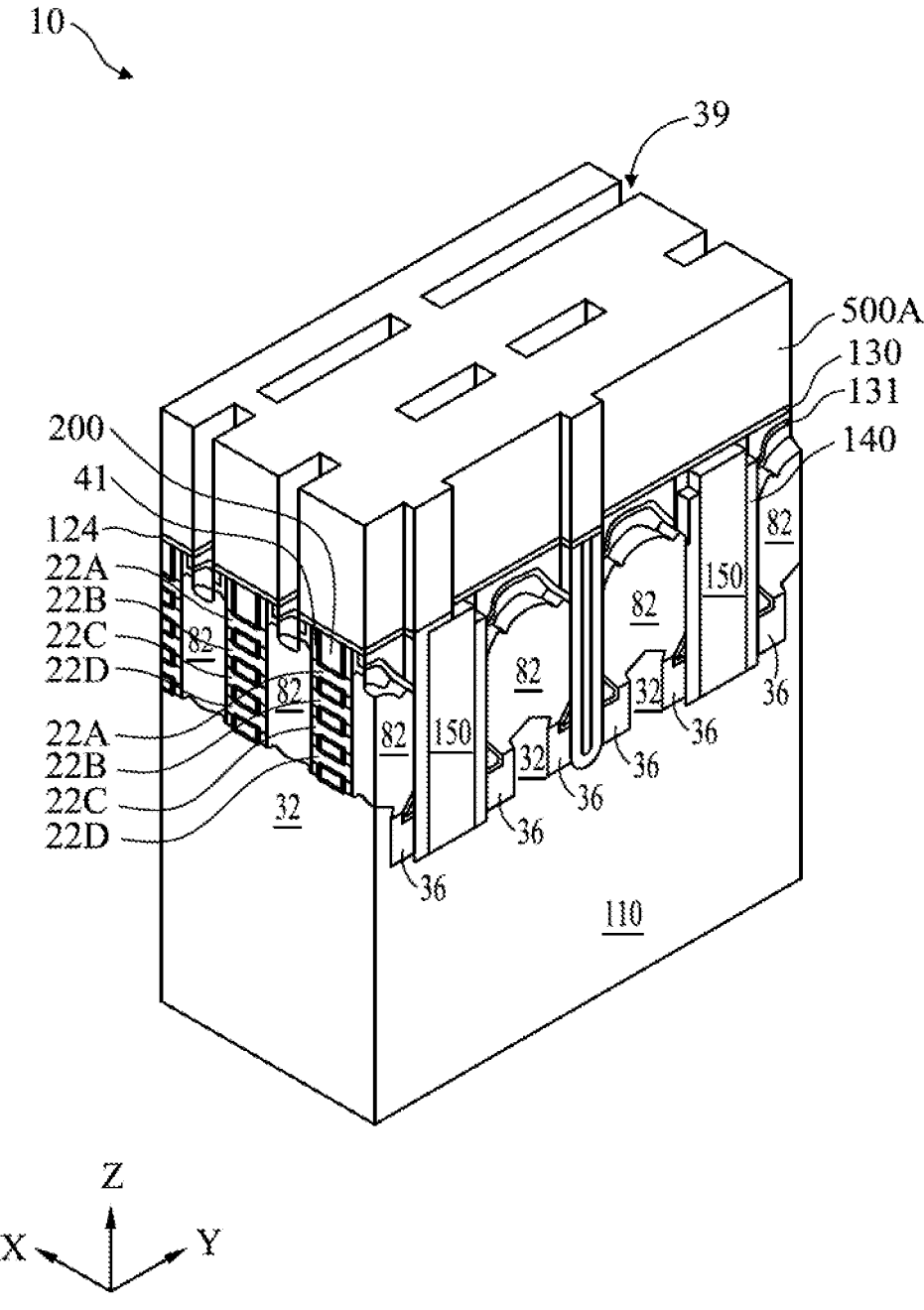

In FIG. 11H, following formation of the hard mask structure 500, the hard mask structure 500 is patterned, forming openings 39. Exposed portions of the second isolation layer 124 and the ILD 130 over the source/drain regions 82 are etched through the openings 39. In some embodiments, portions of the fourth isolation layer 140 are removed, such that the fourth isolation layer 140 is recessed at top portions of the power vias 150, exposing a portion of one or more sidewalls of the power vias 150, as shown. Recessing the fourth isolation layer 140 increases contact between the power vias 150 and the source/drain contacts 120 formed in a later operation.

Figure 11I:
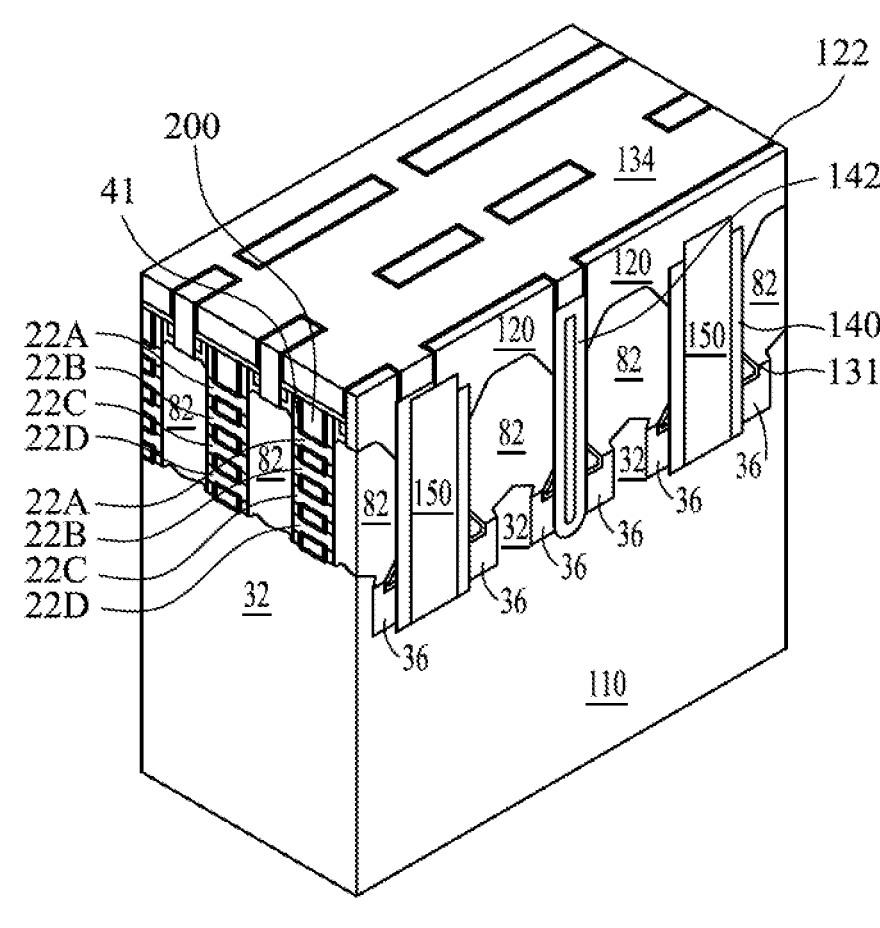

In FIG. 11I, the source/drain contacts 120 are formed in openings formed by the etching operation described with reference to FIG. 11H, corresponding to operation 1700 of FIG. 14. In some embodiments, the first isolation layer 122 is formed in the openings prior to forming the source/drain contacts 120. For example, the first isolation layer 122 may be deposited as a thin, conformal layer over sidewalls of the ILD 130. Then, a suitable etching operation may be performed to remove portions of the first isolation layer 122 overlying the source/drain regions 82, so as to expose the source/drain regions 82. Following formation of the first isolation layer 122, material of the source/drain contacts 120 may be deposited on the source/drain regions 82 and in contact with the first isolation layer 122. The material of the source/drain contacts 120 may include a glue layer and a conductive core layer. In some embodiments, a silicide layer 118 (see FIG. 1F) is formed at an interface of the source/drain contact 120 with the source/drain region 82. A CMP operation may be performed following deposition of the source/drain contacts 120 to remove excess material of the source/drain contacts 120 from over the bottom hard mask layer 500A, and to recess the bottom hard mask layer 500A and the source/drain contacts 120. The bottom hard mask layer 500A after recessing may be the third isolation layer 134, and is labeled as such in FIG. 11I.

Figure 11J:
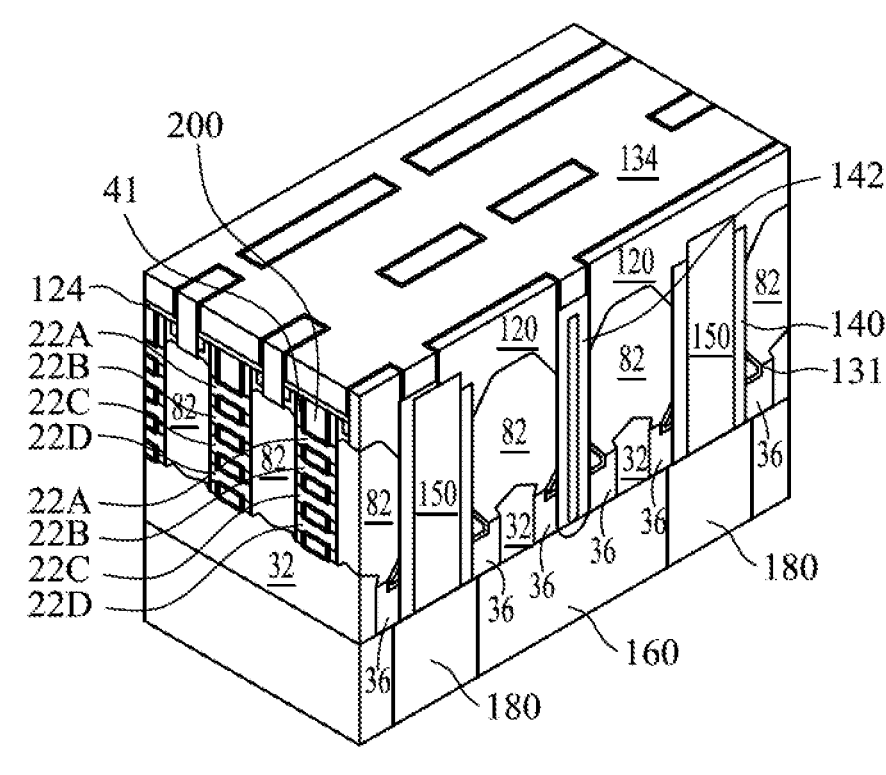

In FIG. 11J, following formation of the source/drain contacts 120, the backside conductive feature 180 is formed, corresponding to operation 1800 of FIG. 14. Formation of the backside conductive feature 180 may include multiple removal and deposition operations. For example, the substrate 110 may be removed by a CMP, grinding, or both. Following removal of the substrate 110, the power vias 150 may be exposed. A first backside dielectric layer 160 is formed by a suitable deposition operation on bottom surfaces of the isolation regions 36, the fins 32 when present, and the power vias 150. Following formation of the first backside dielectric layer 160, the backside dielectric layer 160 may be patterned to form openings in which the backside conductive features 180 are deposited.

In some embodiments, a frontside interconnect structure may be formed prior to removing the substrate 110. In some embodiments, the frontside interconnect structure is formed after forming the backside interconnect structure. The frontside interconnect structure may include one or more additional dielectric layers (e.g., intermetal dielectric or "IMD" layers) and one or more additional conductive features (e.g., conductive traces, conductive vias, or both) embedded therein.

The operations illustrated in FIGS. 11A, 11B, 11C, 11D, 11E, 11F, 11G, 11H, 11I, and 11J are used to form the power vias 150 from the frontside of the IC device 10. In some embodiments, the operations illustrated in FIGS. 11A-11J may also be used to form gate contacts (not shown) on and in contact with the gate structures 200.

FIGS. 12A, 12B, 12C, 12D, 12E, 12F, 12G, 12H, and 12I are views of various embodiments of an IC device at various stages of forming a frontside via for backside power delivery in accordance with various embodiments.

Figure 12A:
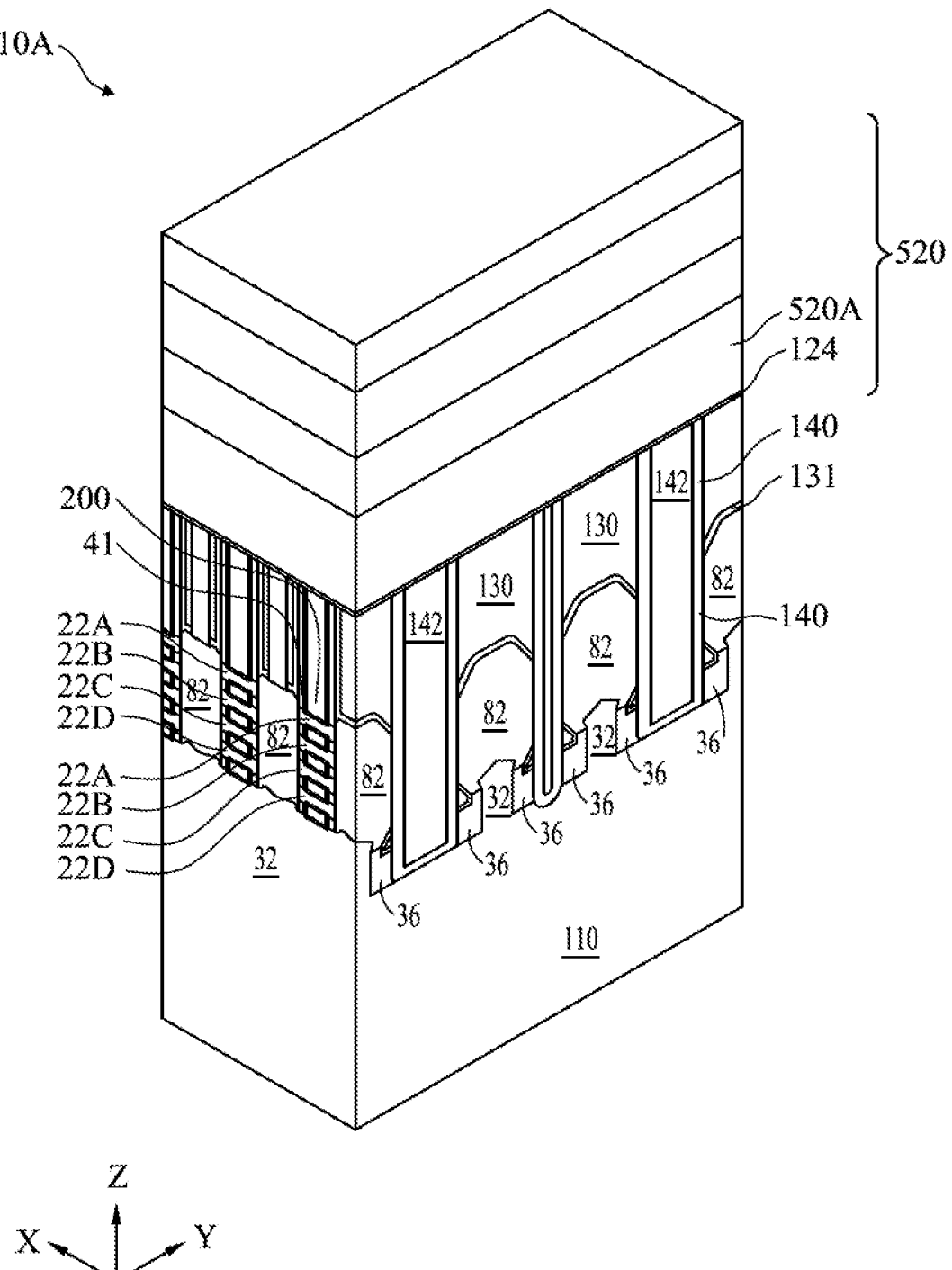
FIGS. 12A, 12B, 12C, 12D, 12E, 12F, 12G, 12H, and 12I are views of various embodiments of an IC device at various stages of forming a frontside via for backside power delivery in accordance with various embodiments.

In FIG. 12A, a removal operation, such as a CMP, is performed on the structure shown in FIG. 11C, then a hard mask structure 520 is formed over the resulting structure. For example, following deposition of the fourth isolation layer 140 and the dielectric plug layer 142, the removal operation may be performed to remove excess material of the fourth isolation layer 140 and the dielectric plug layer 142 overlying the gate structures 200 and the ILD 130, which exposes top surfaces of the gate structures 200 and the ILD 130. Then, a hard mask structure 520 is formed on the gate structures 200, the ILD 130, the fourth isolation layer 140 and the dielectric plug layer 142. The hard mask structure 520 may be similar to the hard mask structure 500 described with reference to FIG. 11G, and includes the second isolation layer 124, a bottom hard mask layer 520A, and one or more additional mask layers over the bottom hard mask layer 520A. The bottom hard mask layer 520A may be similar to or the same as the bottom hard mask layer 500A.

Figure 12B:
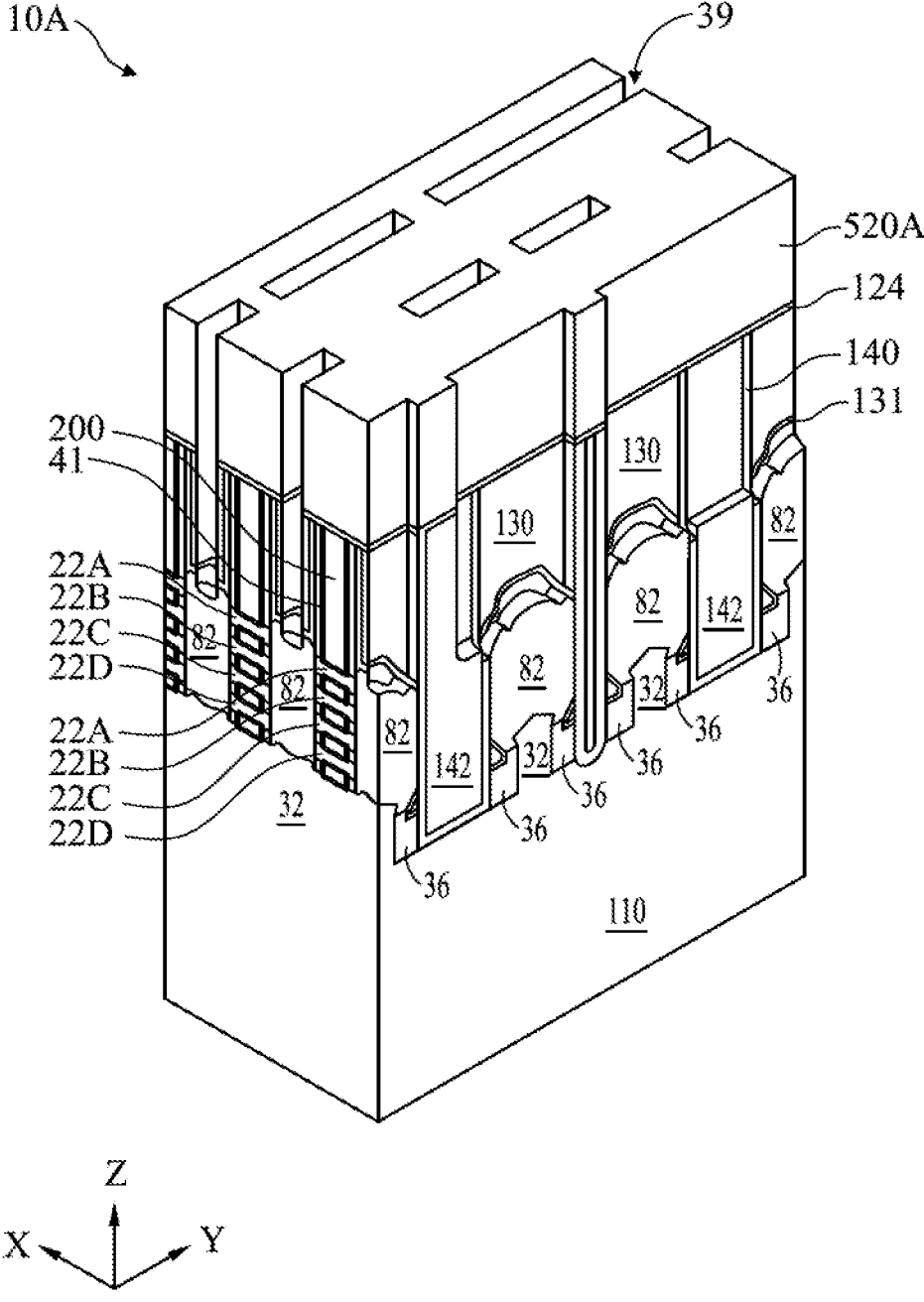

In FIG. 12B, following formation of the hard mask structure 520, the hard mask structure 520 is patterned, forming openings 39. Exposed portions of the second isolation layer 124 and the ILD 130 over the source/drain regions 82 are etched through the openings 39. In some embodiments, portions of the fourth isolation layer 140 are removed, such that the fourth isolation layer 140 is recessed at top portions of the dielectric plug layer 142, exposing a portion of one or more sidewalls of the dielectric plug layer 142, as shown. Recessing the fourth isolation layer 140 increases contact between the power vias 150 and the source/drain contacts 120, both of which are formed in respective later operations.

Figure 12C:
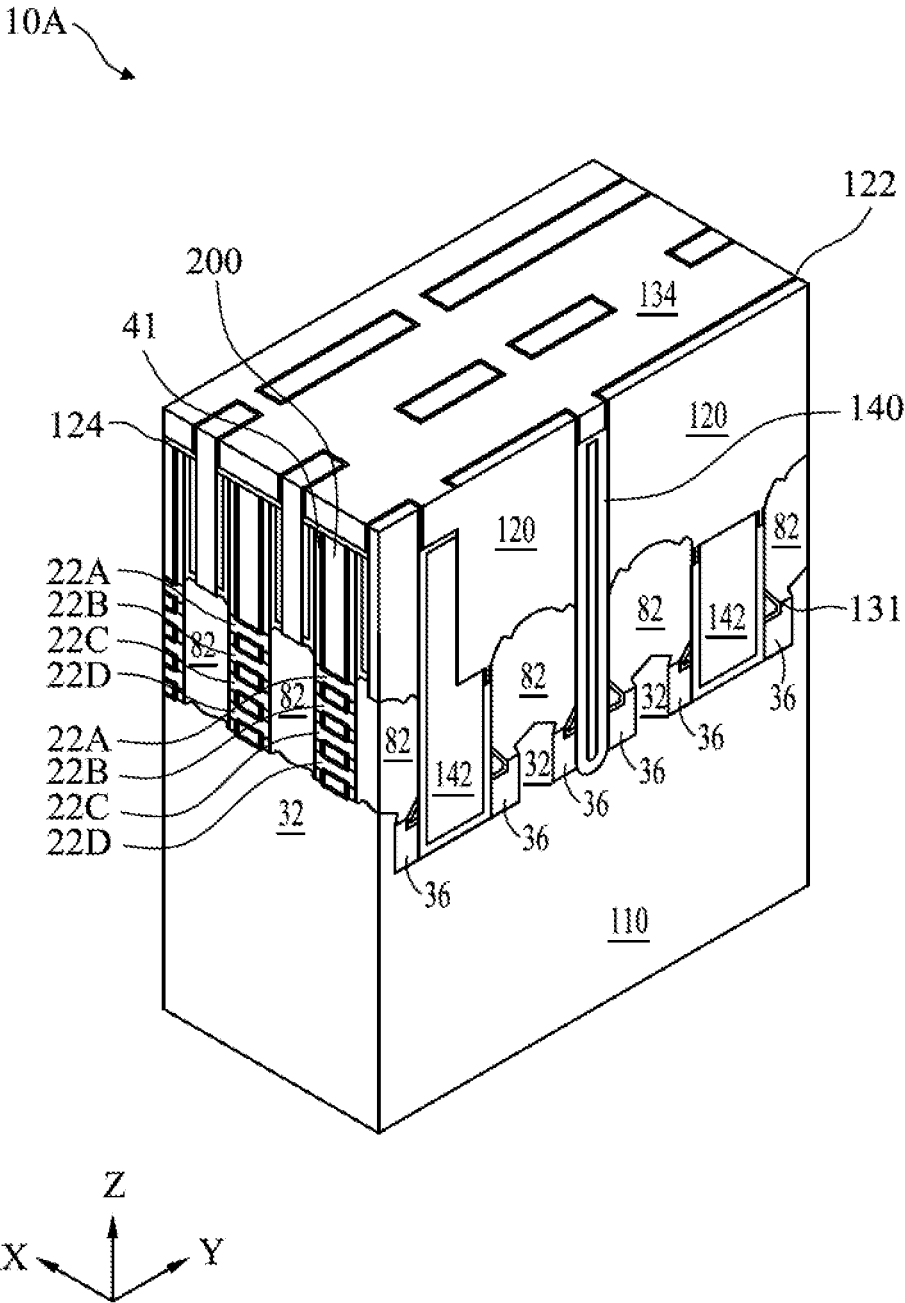

In FIG. 12C, the source/drain contacts 120 are formed in openings formed by the etching operation described with reference to FIG. 12B, corresponding to operation 2500 of FIG. 15. In some embodiments, the first isolation layer 122 is formed in the openings prior to forming the source/drain contacts 120. For example, the first isolation layer 122 may be deposited as a thin, conformal layer over sidewalls of the ILD 130, the fourth isolation layer 140, the etch stop layer 131, and the bottom hard mask layer 520A. Then, a suitable etching operation may be performed to remove portions of the first isolation layer 122 overlying the source/drain regions 82, so as to expose the source/drain regions 82. Following formation of the first isolation layer 122, material of the source/drain contacts 120 may be deposited on the source/drain regions 82 and in contact with the first isolation layer 122. The material of the source/drain contacts 120 may include a glue layer and a conductive core layer. In some embodiments, a silicide layer 118 (see FIG. 1F) is formed at an interface of the source/drain contact 120 with the source/drain region 82. A CMP operation may be performed following deposition of the source/drain contacts 120 to remove excess material of the source/drain contacts 120 from over the bottom hard mask layer 520A, and to recess the bottom hard mask layer 520A and the source/drain contacts 120. The bottom hard mask layer 520A after recessing may be the third isolation layer 134, and is labeled as such in FIG. 12C.

Figure 12D:
Figure 12D:
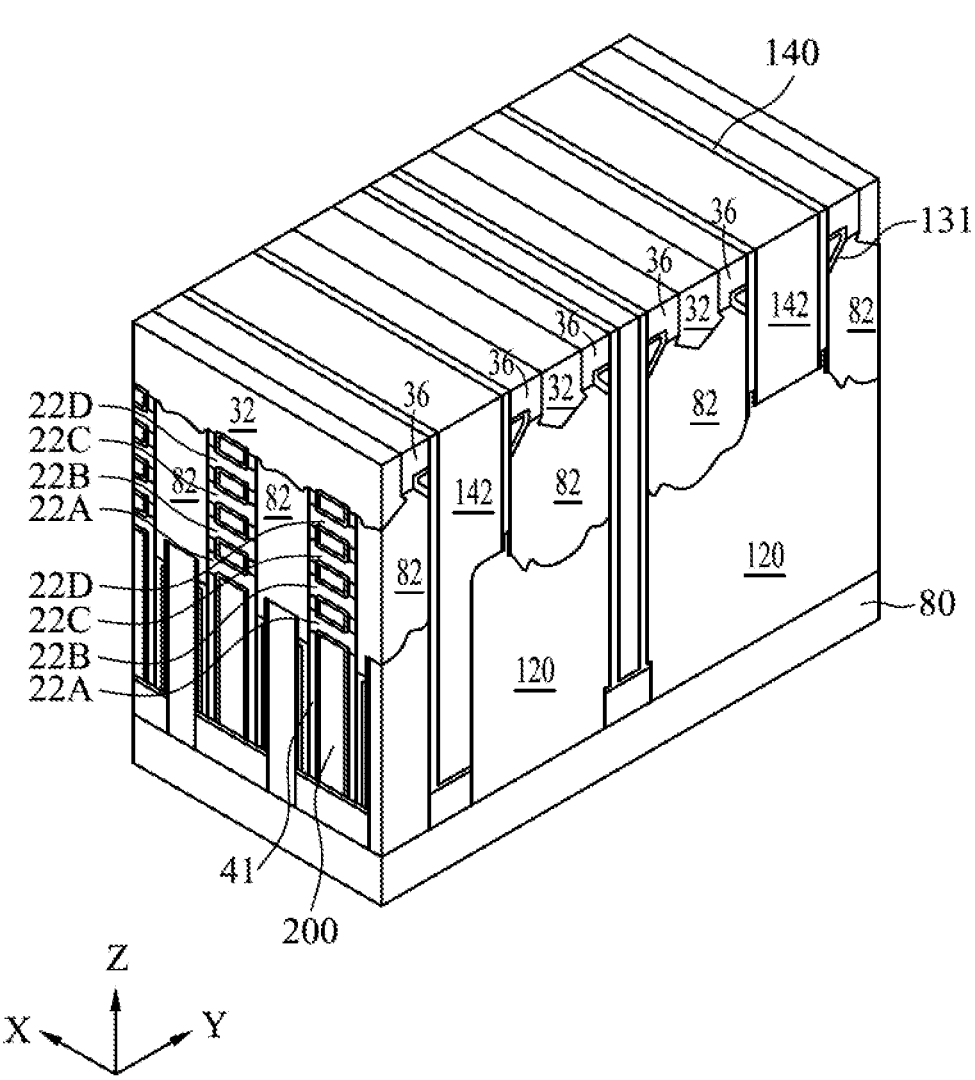

In FIG. 12D, following formation of the source/drain contacts 120, the device 10A is flipped, and the substrate 110 is removed. A carrier 80 may be attached to a top surface (or "frontside") of the device 10A by a release layer (not shown). The carrier 80 may comprise glass, ceramic, bulk silicon, or the like while the release layer may include a die attach film (DAF), a dielectric material, or the like. After the carrier 80 is attached, an orientation of the device 10A is flipped (e.g., so that the carrier 80 is disposed below the device 10A), and the substrate 110 is removed. In some embodiments, a planarization process (e.g., CMP, grinding, or the like) may be applied to remove the substrate 110 and expose the fins 32, the isolation regions 36, the fourth isolation layer 140 and the dielectric plug layer 142. In some embodiments, the fins 32 are removed in the planarization process. In some embodiments, the planarization process stops on an etch stop layer (omitted from view in the figures) that may be formed prior to the operations shown in FIGS. 2A, 2B. The etch stop layer, when present, may be in contact with bottom surfaces of the isolation regions 36, the dielectric plug layer 142 and the fourth isolation layer 140. Following removal of material underlying the etch stop layer, the etch stop layer may be removed by a suitable etching process, such as an isotropic etch that removes material of the etch stop layer without substantially attacking materials of the underlying layers mentioned.

Figure 12E:
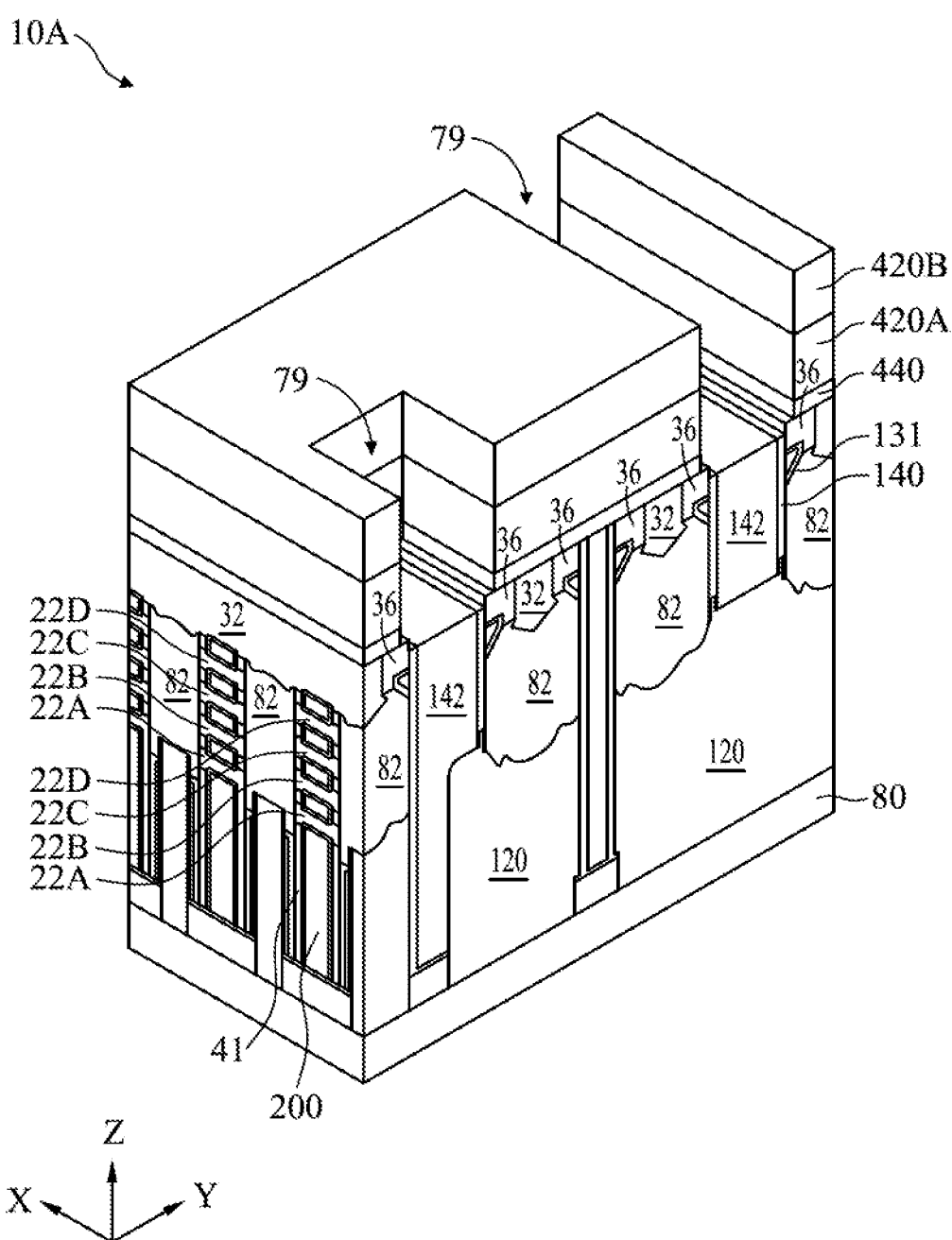

In FIG. 12E, following removal of the substrate 110 and optionally the fins 32, one or more masking layers 440, 420A, 420B are formed on the backside of the device 10A. The masking layers 440, 420A, 420B may include one or more photoresist layers, hard mask layers, anti-reflective coating layers, or the like, and may be patterned to form openings 79 exposing the dielectric plug layer 142. In some embodiments, the openings 79 expose the fourth isolation layer 140 and the isolation regions 36.

Figure 12F:
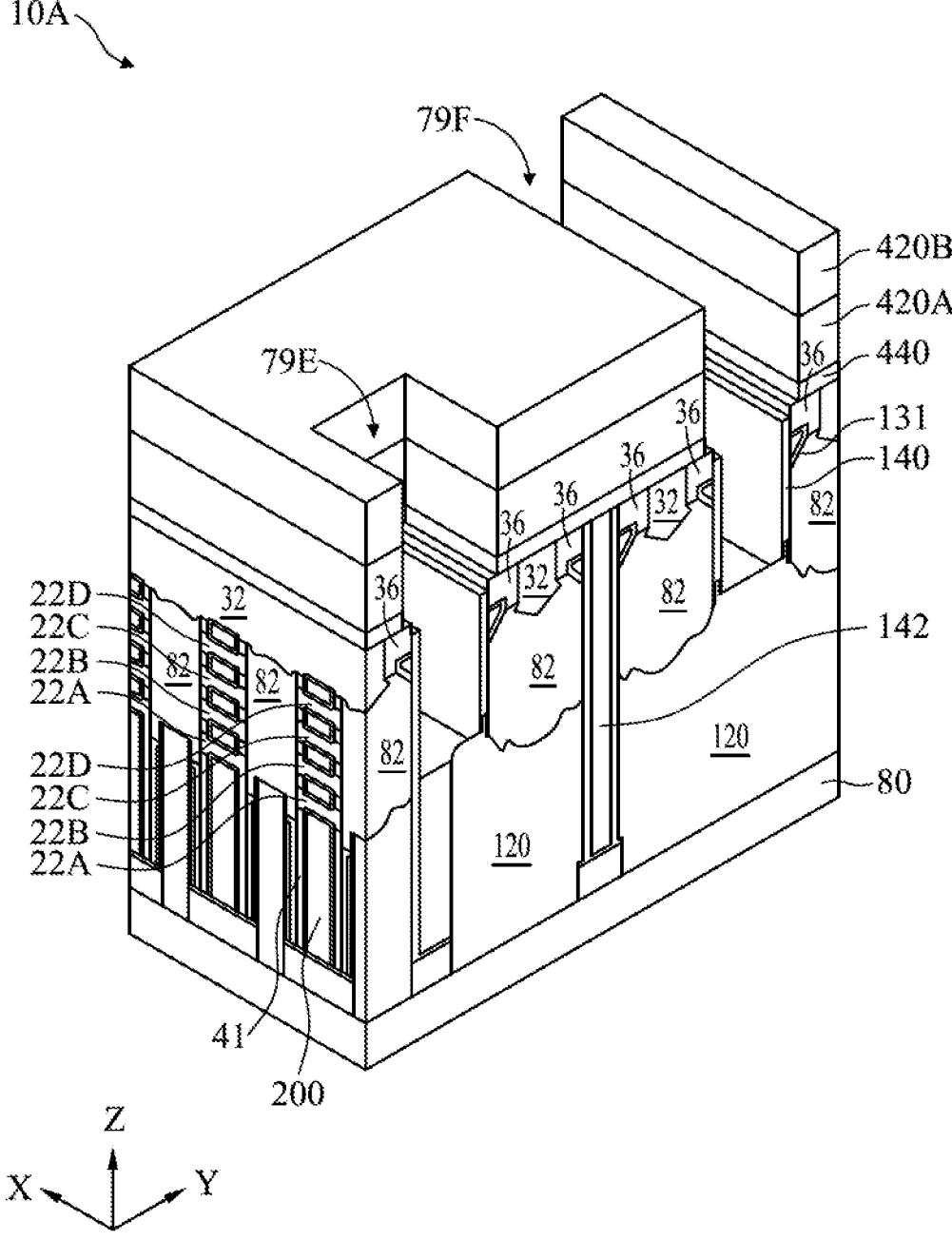

In FIG. 12F, following formation and patterning of the masking layers 440, 420A, 420B, which forms the openings 79, exposed portions of the device 10A are etched through the openings 79, forming openings 79E, corresponding to operation 2600 of FIG. 15. An etching operation removes a portion of the dielectric plug layer 142 over the source/drain contacts 120, exposing respective undersides of the source/drain contacts 120. In some embodiments, the etching operation is an anisotropic etch that uses an etchant selective to material of the dielectric plug layer 142. Because the etching operation is performed from the backside of the device 10A, the openings 79E may have a tapered profile that is narrower closer to the source/drain contacts 120. An angle of tapering of the openings 79E may be in a range of about 80 degrees to 90 degrees (e.g., vertical).

Figure 12G:
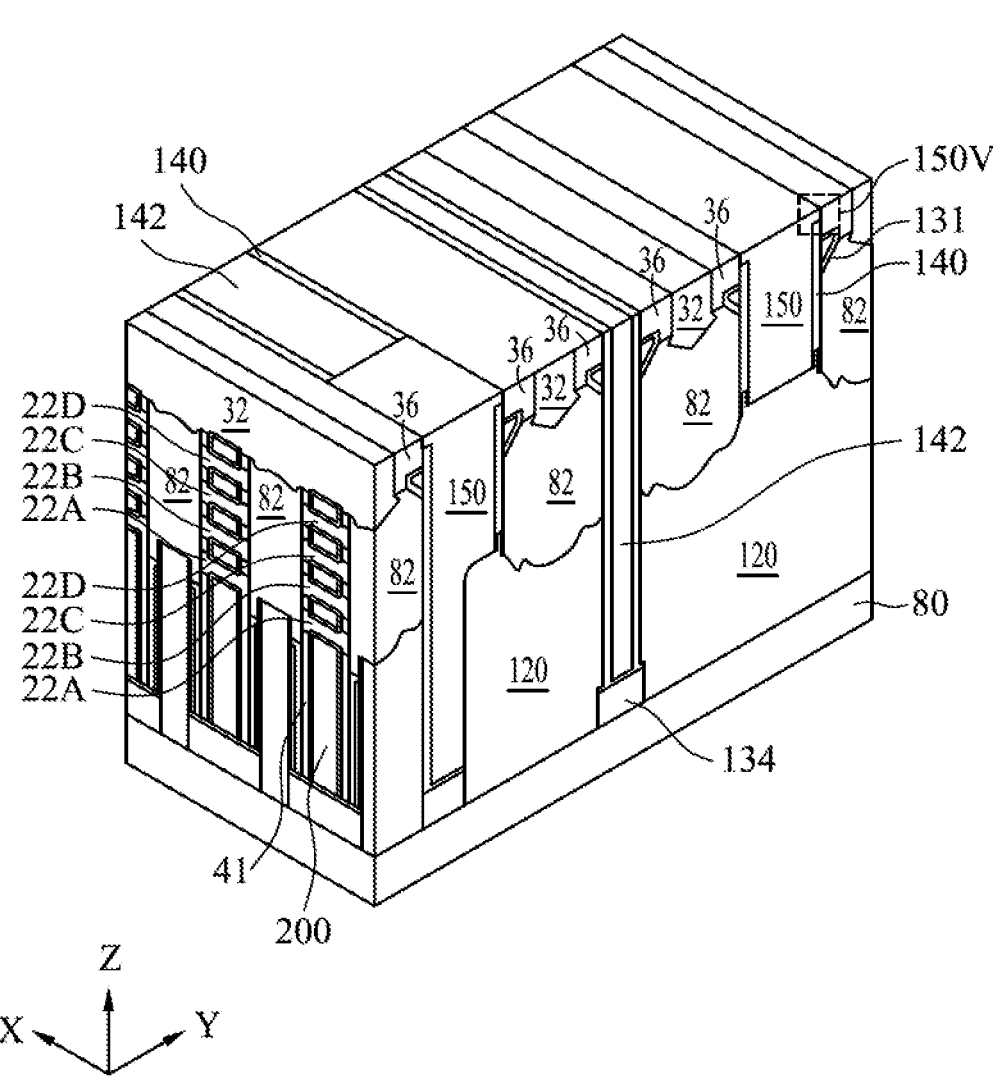

In FIG. 12G, following formation of the openings 79E, the power vias 150 are formed by depositing material of the power vias 150 in the openings 79E, corresponding to operation 2700 of FIG. 15. In some embodiments, a glue layer is deposited in the openings 79E prior to depositing the material of the power vias 150. For example, the glue layer may include TiN, TaN, or other suitable material. The power vias 150 may land fully or partially on the respective source/drain contacts 120, as shown. For example, a power via 150 may land on the source/drain contact 120 and on a remaining portion of the dielectric plug layer 142 exposed by the opening 79E. After depositing the material of the power vias 150, a planarization operation, such as a CMP, may be performed to remove excess material of the power vias 150 and optionally remove excess material of the glue layer which are on the backside of the device 10A. Following the planarization operation, the power vias 150 may include overhang portions 150V that are on the fourth isolation layer 140.

Figure 12H:
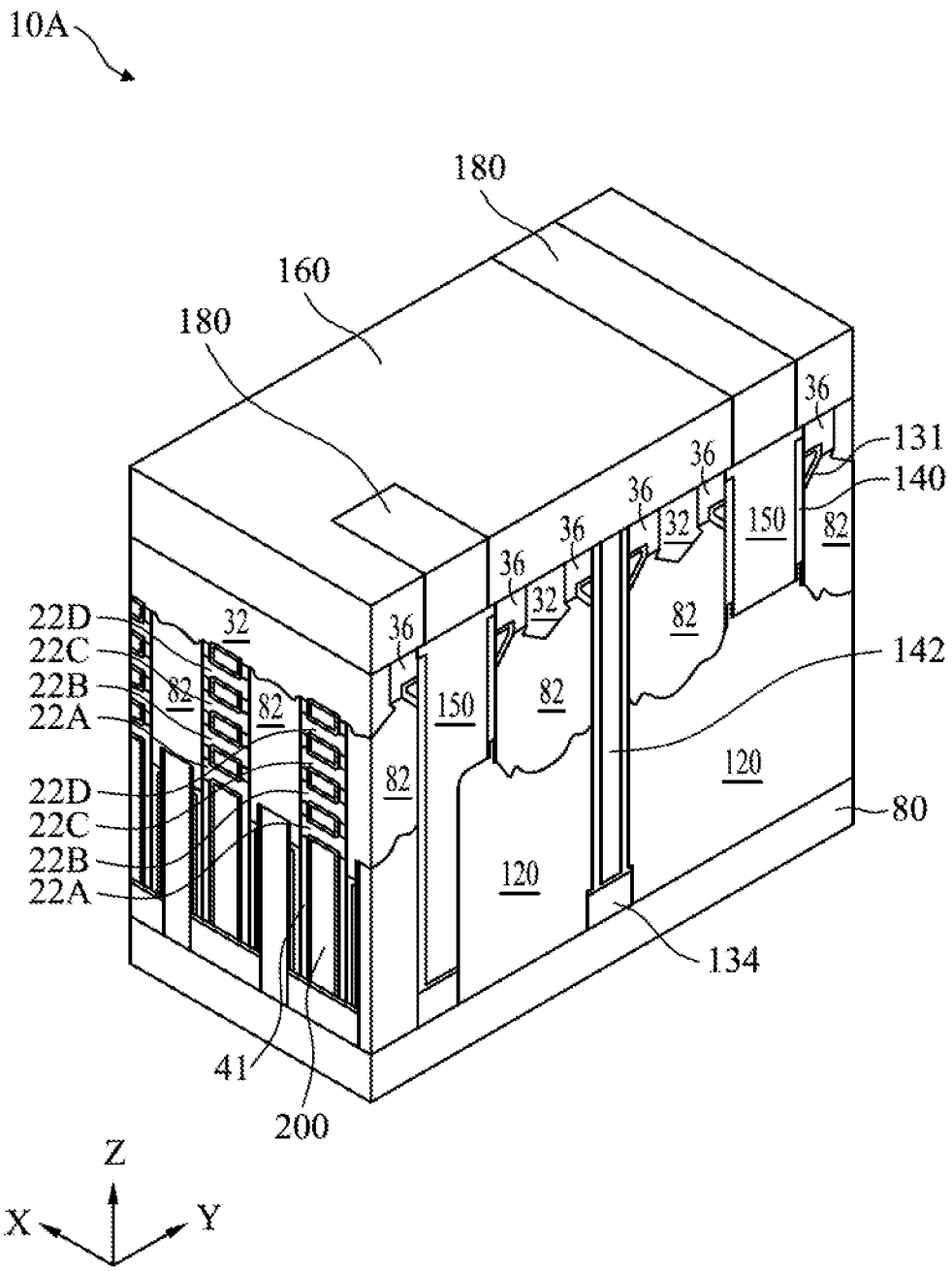

In FIG. 12H, following formation of the power vias 150, the first backside dielectric layer 160 may be formed on the backside of the device 10A, and one or more backside conductive features 180 may be formed in the first backside dielectric layer 160, corresponding to operation 2800 of FIG. 15. In some embodiments, the first backside dielectric layer 160 is formed by a suitable deposition operation, such as a PVD, CVD, ALD, or the like. Following deposition of the first backside dielectric layer 160, openings may be formed in the first backside dielectric layer 160, and material of the backside conductive features 180 may be formed in the openings in the backside dielectric layer 160. The openings expose the undersides of the power vias 150, such that the backside conductive features 180 are electrically connected to (e.g., in contact with) the power vias 150. In some embodiments, following formation of the backside conductive features 180, additional backside dielectric layers and backside conductive features (e.g., a power rail/wire 250; see FIG. 1G) may be formed on the backside dielectric layer 160 and the backside conductive features 180. The additional backside dielectric layers and backside conductive features may be referred to collectively as a backside interconnect structure.

Figure 12I:
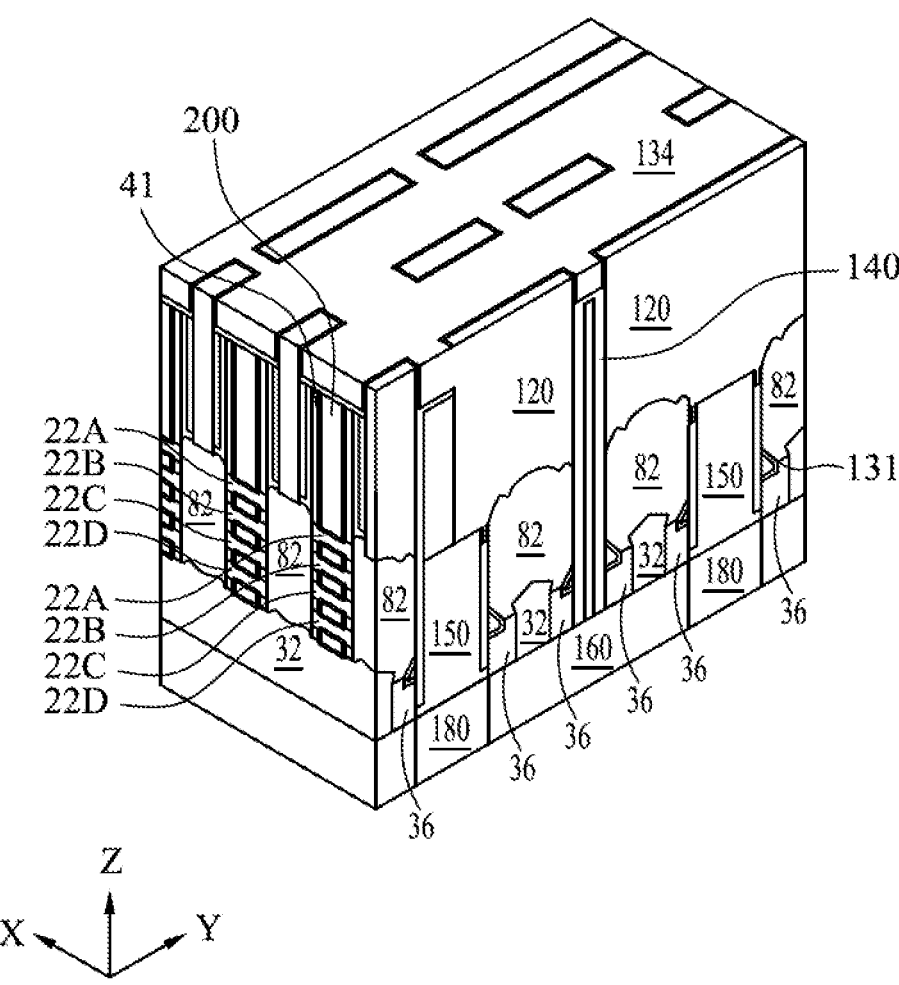

In FIG. 12I, the carrier 80 may be removed, and the device 10A may be flipped, resulting in the structure shown in FIG. 12I. In some embodiments, a frontside interconnect structure may be formed prior to removing the substrate 110. In some embodiments, the frontside interconnect structure is formed after forming the backside interconnect structure. The frontside interconnect structure may include one or more additional dielectric layers (e.g., intermetal dielectric or "IMD" layers) and one or more additional conductive features (e.g., conductive traces, conductive vias, or both) embedded therein.

FIGS. 13A, 13B, 13C, 13D, 13E, 13F, and 13G are views of various embodiments of an IC device 10B at various stages of forming a frontside via 150 for backside power delivery in accordance with various embodiments.

In FIG. 13A, a deposition operation, such as a PVD, CVD, ALD, or the like, is performed on the structure shown in FIG. 11E to form dielectric structures 190 instead of forming the power vias 150, corresponding to operation 3600 of FIG. 16. Following deposition of material of the dielectric structures 190, a suitable removal operation, such as a CMP, is performed to remove material of the fourth isolation layer 140, the dielectric plug layer 142, the dielectric structures 190, and to expose the gate structures 200 and the ILD 130. In some embodiments, the gate structures 200 are recessed by the removal operation. The material of the dielectric structures 190 is different than those of the fourth isolation layer 140 and the dielectric plug layer 142, for example, having different etch selectivity than the fourth isolation layer 140 and the dielectric plug layer 142.

In FIG. 13B, a hard mask structure 540 is formed on the gate structures 200, the ILD 130, the fourth isolation layer 140 and the dielectric plug layer 142. The hard mask structure 540 may be similar to the hard mask structure 500 described with reference to FIG. 11G, and includes the second isolation layer 124, a bottom hard mask layer 540A, and one or more additional mask layers over the bottom hard mask layer 540A. The bottom hard mask layer 540A may be similar to or the same as the bottom hard mask layer 500A.

In FIG. 13C, following formation of the hard mask structure 540, the hard mask structure 540 may be patterned, forming openings. Exposed portions of the second isolation layer 124 and the ILD 130 over the source/drain regions 82 are etched through the openings. In some embodiments, portions of the fourth isolation layer 140 are removed, such that the fourth isolation layer 140 is recessed at top portions of the dielectric structures 190, exposing a portion of one or more sidewalls of the dielectric structures 190, as shown. Recessing the fourth isolation layer 140 increases contact between the power vias 150 and the source/drain contacts 120.

Further in FIG. 13C, the source/drain contacts 120 are formed in the openings, corresponding to operation 3700 of FIG. 16. In some embodiments, the first isolation layer 122 is formed in the openings prior to forming the source/drain contacts 120. For example, the first isolation layer 122 may be deposited as a thin, conformal layer over sidewalls of the ILD 130, the fourth isolation layer 140, the etch stop layer 131, and the bottom hard mask layer 540A. Then, a suitable etching operation may be performed to remove portions of the first isolation layer 122 overlying the source/drain regions 82, so as to expose the source/drain regions 82. Following formation of the first isolation layer 122, material of the source/drain contacts 120 may be deposited on the source/drain regions 82 and in contact with the first isolation layer 122. The material of the source/drain contacts 120 may include a glue layer and a conductive core layer. In some embodiments, a silicide layer 118 (see FIG. 1F) is formed at an interface of the source/drain contact 120 with the source/drain region 82. A CMP operation may be performed following deposition of the source/drain contacts 120 to remove excess material of the source/drain contacts 120 from over the bottom hard mask layer 540A, and to recess the bottom hard mask layer 540A and the source/drain contacts 120. The bottom hard mask layer 540A after recessing may be the third isolation layer 134, and is labeled as such in FIG. 13C.

In FIG. 13D, the device 10B is flipped, the substrate 110 is removed, and a masking layer 620 is formed over the backside of the device 10B. The masking layer 620, which may be a hard mask layer, is patterned, and openings 89 are formed in regions of the device 10B exposed by the masking layer 620. The openings 89 may be formed by an etching operation that removes material of the dielectric structures 190 without substantially attacking material of the fourth isolation layer 140 and the dielectric plug layer 142. In some embodiments, the etching operation is or includes an isotropic etch or an anisotropic etch. Following the etching operation, undersides of the source/drain contacts 120 are exposed. The openings 89 may have a tapered profile, such that width of the openings 89 (e.g., in the Y-axis direction) is narrower closer to the source/drain contacts 120 and wider near the backside surface of the device 10B.

In FIG. 13E, while the device 10B is flipped, following formation of the openings 89, the power vias 150 are formed in the openings 89 by one or more deposition operations, corresponding to operation 3800 of FIG. 16. In some embodiments, the glue layer is formed in the openings 89 on sidewalls of the fourth isolation layer 140, the source/drain contacts 120, and the dielectric plug layers 142. Material of the power vias 150 is deposited in the openings 89 by a suitable deposition operation, such as a PVD, CVD, ALD, sputter, or the like. Following deposition of the material of the power vias 150, a suitable removal operation, such as a CMP, may be performed to remove excess material of the power vias 150 and optionally the glue layer from over the isolation regions 36, the fins 32, the fourth isolation layer 140 and the dielectric plug layer 142. The power vias 150 adopt the shape of the openings 89, and as such, may have the tapered profile described with reference to FIG. 13D.

In FIG. 13F, following formation of the power vias 150, the first backside dielectric layer 160 may be formed on the backside of the device 10B, and one or more backside conductive features 180 may be formed in the first backside dielectric layer 160, corresponding to operation 3900 of FIG. 16. In some embodiments, the first backside dielectric layer 160 is formed by a suitable deposition operation, such as a PVD, CVD, ALD, or the like. Following deposition of the first backside dielectric layer 160, openings may be formed in the first backside dielectric layer 160, and material of the backside conductive features 180 may be formed in the openings in the backside dielectric layer 160. The openings expose the undersides of the power vias 150, such that the backside conductive features 180 are electrically connected to (e.g., in contact with) the power vias 150. In some embodiments, following formation of the backside conductive features 180, additional backside dielectric layers and backside conductive features (e.g., a power rail/wire 250; see FIG. 1G) may be formed on the backside dielectric layer 160 and the backside conductive features 180. The additional backside dielectric layers and backside conductive features may be referred to collectively as a backside interconnect structure.

In FIG. 13G, the carrier 80 may be removed, and the device 10B may be flipped, resulting in the structure shown in FIG. 13G. In some embodiments, a frontside interconnect structure may be formed prior to removing the substrate 110. In some embodiments, the frontside interconnect structure is formed after forming the backside interconnect structure. The frontside interconnect structure may include one or more additional dielectric layers (e.g., intermetal dielectric or "IMD" layers) and one or more additional conductive features (e.g., conductive traces, conductive vias, or both) embedded therein.

Embodiments may provide advantages. The power vias 150 provide frontside signal routing flexibility by enabling power wires to be disposed on the back side of the devices 10, 10A, 10B. Forming the power wires on the back side of the devices 10, 10A, 10B allows for wider power wires, which reduces resistance and increases power efficiency. The power vias 150 may be formed by replacing a gate isolation structure, which may be performed from the front side of the device, the back side of the device, or both.

In accordance with at least one embodiment, a device includes a stack of semiconductor nanostructures, a gate structure wrapping around the semiconductor nanostructures, a source/drain region abutting the gate structure and the stack, a contact structure on the source/drain region, a backside dielectric layer under the stack, and a via structure extending from the contact structure to a top surface of the backside dielectric layer.

In accordance with at least one embodiment, a method includes: forming a vertical stack of nanostructure channels over a substrate; forming a source/drain region abutting the nanostructure channels; forming a gate structure wrapping around the nanostructure channels; forming a via structure adjacent the source/drain region and laterally isolated from the source/drain region; forming a contact structure in contact with the via structure and the source/drain region; and forming a backside interconnect structure in contact with the via structure.

In accordance with at least one embodiment, a method includes: forming a vertical stack of nanostructure channels over a substrate; forming a source/drain region abutting the nanostructure channels; forming a gate structure wrapping around the nanostructure channels; forming a gate isolation structure that isolates portions of the gate structure from each other; forming a contact structure having an underside in contact with the source/drain region and the gate isolation structure; exposing the gate isolation structure by removing the substrate; forming an opening in the gate isolation structure, the opening exposing the underside of the contact structure; and forming a via structure in the opening, the via structure being in contact with the contact structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A device, comprising:
a stack of semiconductor nanostructures;
a gate structure wrapping around the semiconductor nanostructures;
a source/drain region abutting the gate structure and the stack;
a contact structure disposed on a front side of the source/drain region over the source/drain region;
a backside dielectric layer disposed at a backside of the device under the stack, the backside being opposite the frontside at which the contact structure is disposed; and
a via structure extending from the contact structure to a top surface of the backside dielectric layer.

2. The device of claim 1, wherein a first portion of an upper surface of the via structure is in contact with the contact structure, and a second portion of the upper surface is in contact with an isolation layer.

3. The device of claim 1, wherein the entirety of an upper surface of the via structure is in contact with the contact structure.

4. The device of claim 1, wherein a portion of a sidewall of the via structure is in contact with the contact structure.

5. The device of claim 4, wherein the via structure is laterally separated from the source/drain region by an isolation layer.

6. The device of claim 1, further comprising a semiconductor fin between the stack and the backside dielectric layer.

7. The device of claim 1, wherein the via structure has width that increases with proximity to the backside dielectric layer.

8. A method, comprising:

forming a vertical stack of nanostructure channels over a substrate;

forming a source/drain region abutting the nanostructure channels;

forming a gate structure wrapping around the nanostructure channels;

forming a via structure adjacent the source/drain region and laterally isolated from the source/drain region;

forming a contact structure in contact with the via structure and the source/drain region; and forming a backside interconnect structure in contact with the via structure.

9. The method of claim 8, wherein the forming a via structure includes:

forming a first opening that removes a portion of the gate structure;

forming a dielectric plug in the first opening;

forming a second opening exposing the substrate by removing at least a portion of the dielectric plug; and forming the via structure in the second opening.

10. The method of claim 9, wherein the forming a dielectric plug includes:

forming an isolation layer in the first opening; and forming a dielectric plug layer on the isolation layer.

11. The method of claim 10, wherein a top portion of the isolation layer is recessed when forming the second opening.

12. The method of claim 9, wherein the forming a via structure includes:

forming an intermediate device structure by forming a dielectric layer in the second opening;

exposing the substrate by flipping the intermediate device structure;

exposing a bottom side of the dielectric layer by removing the substrate;

opening the second opening by removing the dielectric layer, the second opening exposing the contact structure; and forming the via structure by depositing material of the via structure in the second opening while the intermediate device structure is flipped.

13. The method of claim 8, further comprising forming a backside power line in electrical contact with the via structure.

14. A method, comprising:

forming a vertical stack of nanostructure channels over a substrate;

forming a source/drain region abutting the nanostructure channels;

forming a gate structure wrapping around the nanostructure channels;

forming a gate isolation structure that isolates portions of the gate structure from each other;

forming a contact structure having an underside in contact with the source/drain region and the gate isolation structure;

exposing the gate isolation structure by removing the substrate;

forming an opening in the gate isolation structure, the opening exposing the underside of the contact structure; and forming a via structure in the opening, the via structure being in contact with the contact structure.

15. The method of claim 14, further comprising:

forming a backside dielectric layer in contact with the via structure;

exposing the via structure by forming a second opening in the backside dielectric layer; and forming a backside conductive feature in the second opening.

16. The method of claim 15, further comprising:

forming a power line in electrical connection with the backside conductive feature.

17. The method of claim 16, further comprising:

forming a second source/drain region abutting the nanostructure channels opposite the source/drain region; and forming a signal line electrically connected to the second source/drain region, the signal line being on a front side of the second source/drain region and vertically separated from the second source/drain region by a frontside dielectric layer.

18. The method of claim 14, wherein removing the substrate removes a semiconductor fin underlying the vertical stack of nanostructure channels.

19. The method of claim 14, wherein the forming an opening in the gate isolation structure includes removing a portion of a dielectric plug layer of the gate isolation structure under the contact structure.

20. The method of claim 19, wherein the forming an opening in the gate isolation structure further includes removing a portion of an isolation layer of the gate isolation structure, the portion being in contact with the contact structure.

* * * * *